US012660232B2

(12) United States Patent
Sato et al.

(10) Patent No.: US 12,660,232 B2
(45) Date of Patent: Jun. 16, 2026

(54) SEMICONDUCTOR ELEMENT AND DEVICE

(71) Applicants: TOYODA GOSEI CO., LTD., Kiyosu (JP); SANKEN ELECTRIC CO., LTD., Niiza (JP)

(72) Inventors: Hisao Sato, Kiyosu (JP); Koji Okuno, Kiyosu (JP); Daisuke Shinoda, Kiyosu (JP); Toshiya Uemura, Kiyosu (JP); Hironobu Narui, Oyama (JP); Hiroji Kawai, Oyama (JP); Shuichi Yagi, Oyama (JP)

(73) Assignees: Toyoda Gosei Co., Ltd., Kiyosu (JP); Powdec K.K., Oyama (JP)

( * ) Notice: Subject to any disclaimer, the term of this patent is extended or adjusted under 35 U.S.C. 154(b) by 367 days.

(21) Appl. No.: 18/218,882

(22) Filed: Jul. 6, 2023

(65) Prior Publication Data

US 2023/0352573 A1     Nov. 2, 2023

Related U.S. Application Data

(63) Continuation of application No. PCT/JP2021/046478, filed on Dec. 16, 2021.

(30) Foreign Application Priority Data

Feb. 4, 2021    (JP) ................................. 2021-016382

(51) Int. Cl.
H10D 30/47         (2025.01)
H10D 8/60          (2025.01)
(Continued)

(52) U.S. Cl.
CPC ............. H10D 30/475 (2025.01); H10D 8/60 (2025.01); H10D 62/111 (2025.01); H10D 62/8503 (2025.01)

(58) Field of Classification Search
None
See application file for complete search history.

(56) References Cited

U.S. PATENT DOCUMENTS 8,785,976 B2    7/2014  Nakajima et al.
9,991,335 B2    6/2018  Echigoya et al.
(Continued)

FOREIGN PATENT DOCUMENTS

JP        2003-229439 A    8/2003
JP        2004-241471 A    8/2004
(Continued)

OTHER PUBLICATIONS

International Search Report (ISR) (PCT Form PCT/ISA/210), in PCT/JP2021/046478, dated Mar. 15, 2022 (with English translation/English version).

*Primary Examiner* — Jack S Chen
(74) *Attorney, Agent, or Firm* — McGinn IP Law Group, PLLC

(57) ABSTRACT

A semiconductor element includes a first semiconductor layer, a second semiconductor layer, a third semiconductor layer, a fourth semiconductor layer, a first intermediate layer, a second intermediate layer, a source electrode, a drain electrode, and a gate electrode. The band gap of the second semiconductor layer is larger than the band gaps of the first semiconductor layer and the third semiconductor layer. The band gaps of the first intermediate layer and the second intermediate layer that sandwich the second semiconductor layer are larger than the band gap of the second semiconductor layer.

12 Claims, 46 Drawing Sheets

(51) Int. Cl.
    *H10D 62/10*       (2025.01)
    *H10D 62/85*       (2025.01)

(56)             References Cited

U.S. PATENT DOCUMENTS

| | | | |
|---|---|---|---|
| 10,038,064 B2 | 7/2018 | Tanaka | |
| 10,388,744 B2 | 8/2019 | Tanaka | |
| 10,636,884 B2 | 4/2020 | Tanaka | |
| 2013/0126942 A1 | 5/2013 | Nakajima et al. | |
| 2016/0093691 A1 | 3/2016 | Echigoya et al. | |
| 2017/0047410 A1 | 2/2017 | Tanaka | |
| 2017/0263710 A1 | 9/2017 | Matsumoto et al. | |
| 2018/0323267 A1 | 11/2018 | Tanaka | |
| 2019/0371897 A1 | 12/2019 | Tanaka | |
| 2023/0352573 A1* | 11/2023 | Sato | H10D 62/8503 |
| 2024/0194821 A1* | 6/2024 | Okuno | H10H 29/14 |

FOREIGN PATENT DOCUMENTS

| | | | |
|---|---|---|---|
| JP | 2007-134607 A | 5/2007 | |
| JP | 4117535 B | 7/2008 | |
| JP | 5344445 B | 11/2013 | |
| JP | 2015-207610 A | 11/2015 | |
| JP | 2016-146369 A | 8/2016 | |
| JP | 2017-037966 A | 2/2017 | |
| WO | WO 2011/162243 A1 | 12/2011 | |

* cited by examiner

FIG. 34

| Second undoped GaN<br>(65nm) |
| --- |
| Second AlN |
| AlGaN (Electron supply layer)<br>(40nm)  Al=27% |
| First AlN |
| First undoped GaN (Channel layer)<br>(800nm) |

| Thickness of AlN [nm] | (A) 2DEG_ GaN [cm⁻²] | (B) 2DHG_ GaN [cm⁻²] | (C) 2DEG_ AlGaN [cm⁻²] | (D) 2DHG_ AlGaN [cm⁻²] | Ratio of 2DHG_ GaN to 2DEG_ GaN (B)/(A) | Ratio of 2DHG_ AlGaN to 2DEG_ AlGaN (D)/(C) |
|---|---|---|---|---|---|---|
| 0 | 7.27E+12 | 6.70E+12 | 1.45E+09 | 1.45E+10 | 0.92 | 9.97 |
| 1 | 9.38E+12 | 8.58E+12 | 8.12E-07 | 2.02E-06 | 0.91 | 2.48 |
| 3 | 1.13E+13 | 9.54E+12 | 8.58E-09 | 4.02E-09 | 0.85 | 0.47 |
| 5 | 1.30E+13 | 1.12E+13 | 1.16E+12 | 1.03E+12 | 0.86 | 0.89 |
| 7 | 1.68E+13 | 1.46E+13 | 8.44E+12 | 8.54E+12 | 0.87 | 1.01 |
| 10 | 2.06E+13 | 1.87E+13 | 1.58E+13 | 1.43E+13 | 0.91 | 0.91 |

FIG.59

| | Example 1 | Example 2 | Example 3 | Example 4 | Example 5 | Example 6 | Comparative Example |
|---|---|---|---|---|---|---|---|
| Chip size | 4mm×6mm | 4mm×6mm | 4mm×6mm | 4mm×6mm | 4mm×6mm | 4mm×6mm | 4mm×6mm |
| PSJ length (Lps) [μm] | 2 | 10 | 20 | 35 | 100 | 125 | 20 |
| Gate length (Lg) [μm] | 4 | 4 | 4 | 4 | 4 | 4 | 8 |
| Gate electrode width [μm] | 1.5 | 1.5 | 1.5 | 1.5 | 1.5 | 1.5 | 4 |
| Gate width (Wg) [mm] | 626 | 488 | 375 | 273 | 120 | 80 | 241 |
| Junction area, per unit gate width of 1 μm, between polarization layer and layer thereon [μm²] | 7 | 15 | 25 | 40 | 105 | 130 | 30 |
| Junction area, per unit gate width of 1 μm, between polarization layer and layer thereon, excluding polarization junction region [μm²] | 5 | 5 | 5 | 5 | 5 | 5 | 10 |
| Source-drain distance [μm] | 11 | 19 | 29 | 44 | 109 | 134 | 33 |
| Breakdown voltage | | | | | | | |
| GaN layer (dislocation density 2.3E9) | 200 | 700 | 1600 | 3000 | 10000 | 12400 | 1200 |
| GaN layer (dislocation density 5.0E8) | - | - | 2500 | 4600 | - | - | - |
| GaN layer (dislocation density 9.0E9) | - | - | 1000 | 1900 | 6300 | - | - |
| Current capacity at Vd 2V [A] | 180 | 95 | 45 | 22 | 3.8 | 1.6 | 40 |
| tr (ON rise time) [ns] | 19 | 22 | 20 | 18 | 17 | 17 | 42 |
| tf (OFF fall time) [ns] | 5 | 6 | 11 | 13 | 11 | 12 | 15 |
| Normalized ON resistance [mΩ·cm²] | 1.1 | 2.0 | 4.9 | 11.7 | 75.9 | 119.1 | - |

RELATION BETWEEN JUNCTION AREA AND
BREAKDOWN VOLTAGE (Gate length: 4 μm)

Junction area between polarization layer and layer thereon [μm²]

| Dislocation density | Junction area between polarization layer and layer thereon per unit gate width of 1 μm which is necessary to secure respective breakdown voltages [μm²] | | | |
|---|---|---|---|---|
| | Breakdown voltage 1500V | Breakdown voltage 3000V | Breakdown voltage 7000V | Breakdown voltage 10000V |
| $5.0 \times 10^8 \mathrm{cm}^{-2}$ | 17.9 | 28.6 | 57.1 | 78.6 |
| $2.3 \times 10^9 \mathrm{cm}^{-2}$ | 22.7 | 37.4 | 76.8 | 106.3 |
| $9.0 \times 10^9 \mathrm{cm}^{-2}$ | 33.2 | 55.7 | 115.7 | 160.6 |

| Dislocation density | Source-drain distance [μm] | | | |
|---|---|---|---|---|
| | Breakdown voltage 1500V | Breakdown voltage 3000V | Breakdown voltage 7000V | Breakdown voltage 10000V |
| $5.0 \times 10^6 cm^{-2}$ | 21.9 | 32.6 | 61.1 | 82.6 |
| $2.3 \times 10^9 cm^{-2}$ | 26.7 | 41.4 | 80.8 | 110.3 |
| $9.0 \times 10^9 cm^{-2}$ | 37.2 | 59.7 | 119.7 | 164.6 |

| Dislocation density | tr (ON rise time) [ns] | tf (OFF fall time) [ns] |
|---|---|---|
| $5.0 \times 10^8 cm^{-2}$ | 16 | 10 |
| $2.3 \times 10^9 cm^{-2}$ | 20 | 11 |
| $9.0 \times 10^9 cm^{-2}$ | 24 | 12 |

FIG. 71

| Dislocation density | $5.0 \times 10^{8} \text{cm}^{-2}$ | $2.3 \times 10^{9} \text{cm}^{-2}$ | $9.0 \times 10^{9} \text{cm}^{-2}$ |
|---|---|---|---|
| X-ray rocking curve half width [arcsec] GaN(004) | 84.3 | 320.8 | 728.3 |
| Sheet resistance [Ωsq] | 549.8 | 841 | 1134 |
| 2DHG concentration Ns [/cm²] | $1.31 \times 10^{13}$ | $1.29 \times 10^{13}$ | $1.35 \times 10^{13}$ |
| 2DHG mobility Ns [cm²/Vs] | 14.4 | 10.6 | 7.9 |

FIG. 72

| Chip size [mm] | 2×3 | 2.5×3.75 | 3×4.5 | 4×6 | 6×9 |
|---|---|---|---|---|---|
| Chip peripheral length [mm] | 10 | 12.5 | 15 | 20 | 30 |
| Chip area [mm²] | 6.0 | 9.4 | 13.5 | 24.0 | 54.0 |
| Active region area [mm²] | 1.26 | 2.18 | 3.42 | 7.12 | 20.66 |
| Gate width when polarization junction length was 2 μm [mm] | 162 | 252 | 363 | 646 | 1454 |
| Current when polarization junction length was 2 μm [A] | 7 | 20 | 47 | 180 | 1080 |

FIG. 73

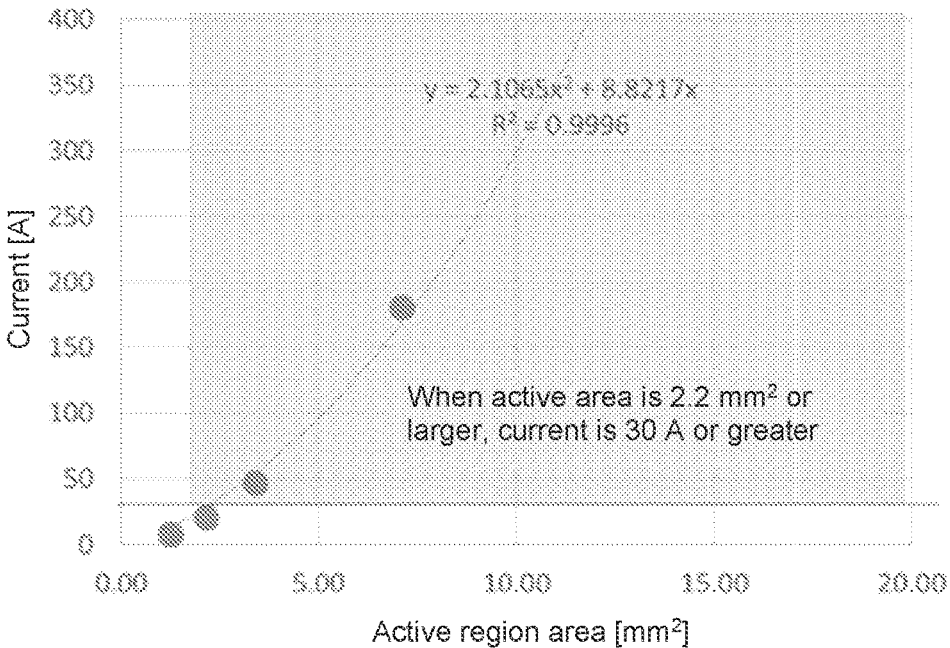

When active area is 2.2 mm² or larger, current is 30 A or greater

Active region area [mm²]

|  | Lpsj1 [μm] | Lpsj2 [μm] | Lsd1 [μm] | Lsd2 [μm] | Breakdown voltage [V] (N = 3; Average) |
|---|---|---|---|---|---|
| Sample 1 | 20 | 20 | 29 | 29 | 2001 |
| Sample 2 | 20 | 22 | 29 | 31 | 2001 |
| Sample 3 | 20 | 24 | 29 | 33 | 2003 |
| Sample 4 | 20 | 18 | 29 | 27 | 1835 |
| Sample 5 | 20 | 16 | 29 | 25 | 1668 |
| Sample 6 | 20 | 14 | 29 | 23 | 1502 |
| Sample 7 | 30 | 20 | 39 | 29 | 2002 |
| Sample 8 | 15 | 20 | 24 | 29 | 1481 |

|  | Lpsj1=Lpsj2 [μm] | Lsd1=Lsd2 [μm] | Breakdown voltage [V] (N = 3; Average) |
|---|---|---|---|
| Sample 1 | 2 | 11 | 231 |
| Sample 2 | 10 | 19 | 876 |
| Sample 3 | 20 | 29 | 2001 |
| Sample 4 | 35 | 44 | 3335 |
| Sample 5 | 100 | 109 | 9997 |

Distance between drain electrode and
polarization super junction surface [μm]

Polarization junction length [μm]

|  | Lpsj1 [μm] | Lpsj2 [μm] | Lac1 [μm] | Lac2 [μm] | Breakdown voltage [V] (N = 3; Average) |
|---|---|---|---|---|---|
| Sample 1 | 20 | 20 | 24.5 | 24.5 | 1995 |
| Sample 2 | 20 | 22 | 24.5 | 26.5 | 2000 |
| Sample 3 | 20 | 24 | 24.5 | 28.5 | 2001 |
| Sample 4 | 20 | 18 | 24.5 | 22.5 | 1827 |
| Sample 5 | 20 | 16 | 24.5 | 20.5 | 1666 |
| Sample 6 | 20 | 14 | 24.5 | 18.5 | 1477 |
| Sample 7 | 30 | 20 | 34.5 | 24.5 | 2001 |
| Sample 8 | 15 | 20 | 19.5 | 24.5 | 1465 |

SEMICONDUCTOR ELEMENT AND DEVICE

TECHNICAL FIELD

The technical field of the present specification relates to a semiconductor element and a device.

BACKGROUND ART

Group-III nitride semiconductors typified by GaN have high dielectric breakdown fields and high melting points. Therefore, group-III nitride semiconductors are expected to be used as a material of semiconductor devices for high output, high frequency, and high temperature, in place of GaAs-based semiconductors. Therefore, HEMT elements, etc. using group-III nitride semiconductors have been researched and developed.

For example, Patent Document 1 discloses a technique for simultaneously generating electrons and holes by polarization junction (see FIG. 4, etc. of Patent Document 1). Also, Patent Document 2 discloses a technique for forming a GaN layer, an AlGaN layer, a GaN layer, and a p-type GaN layer in this order (paragraph [0034] of Patent Document 2). By the disclosed technique, the energy Ev at the upper end of the valence band of the p-type GaN layer is raised to the Fermi level Ef, and a two-dimensional hole gas is generated.

PRIOR ART DOCUMENTS

Patent Documents

Patent Document 1: JP2007-134607A
Patent Document 2: WO2011/162243

SUMMARY OF THE INVENTION

Problem to be Solved by the Invention

In general, semiconductor elements are demanded to have excellent electrical characteristics. Examples of such electrical characteristics include high breakdown voltage, low ON resistance, short response time, capability of coping with large current, suppression of leakage current, and suppression of current collapse.

An object of the technique of the present specification is to provide a semiconductor element and a device which suppress current collapse and increase sheet carrier concentration.

Means for Solving the Problems

A semiconductor element (device) in a first mode comprises: a first semiconductor layer, a second semiconductor layer located above the first semiconductor layer, a third semiconductor layer located above the second semiconductor layer, a fourth semiconductor layer located above the third semiconductor layer, a first intermediate layer located between the first semiconductor layer and the second semiconductor layer, a second intermediate layer located between the second semiconductor layer and the third semiconductor layer, a source electrode and a drain electrode located on the second semiconductor layer or the third semiconductor layer, a gate electrode located on the fourth semiconductor layer, a gate electrode contact region where the gate electrode is in contact with the fourth semiconductor layer, a source electrode contact region where the source electrode is in contact with the second semiconductor layer or the third semiconductor layer, and a drain electrode contact region where the drain electrode is in contact with the second semiconductor layer or the third semiconductor layer. The first semiconductor layer, the second semiconductor layer, the third semiconductor layer, and the fourth semiconductor layer are group-III nitride semiconductor layers. The first intermediate layer and the second intermediate layer are group-III nitride layers. The second semiconductor layer has a band gap larger than those of the first semiconductor layer and the third semiconductor layer. The first intermediate layer and the second intermediate layer have respective band gaps larger than that of the second semiconductor layer. The first semiconductor layer, the second semiconductor layer, and the third semiconductor layer are undoped semiconductor layers. The fourth semiconductor layer is a p-type semiconductor layer. A region obtained by projecting the gate electrode contact region on the second semiconductor layer surrounds a circumference of a region obtained by projecting the source electrode contact region or the drain electrode contact region on the second semiconductor layer.

In this semiconductor element, the region obtained by projecting the gate electrode contact region on the second semiconductor layer surrounds the circumference of the region obtained by projecting the source electrode contact region or the drain electrode contact region on the second semiconductor layer. Therefore, the gate electrode contact region is present between the drain electrode contact region and the source electrode contact region. Accordingly, this semiconductor element can suppress OFF-time leakage current. Also, this semiconductor element can suppress current collapse. Furthermore, since the first intermediate layer and the second intermediate layer sandwich the second semiconductor layer from opposite sides, sheet carrier concentration can be increased.

Effect of the Invention

In the present specification, a semiconductor element and a device which suppress current collapse and increase sheet carrier concentration are provided.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 34 is an illustration showing the layered structure of semiconductors used in simulation.

FIG. 59 is a table showing characteristics of FETs.

FIG. 71 is a table showing the relation in FETs between dislocation density and the characteristics of the semiconductor element.

FIG. 72 is a table showing the relation in FETs between chip size and current value when the drain voltage Vd is 2 V.

FIG. 73 is a table showing the relation in FETs between active region area and current value when the drain voltage Vd is 2 V.

MODES FOR CARRYING OUT THE INVENTION

Figure 1:
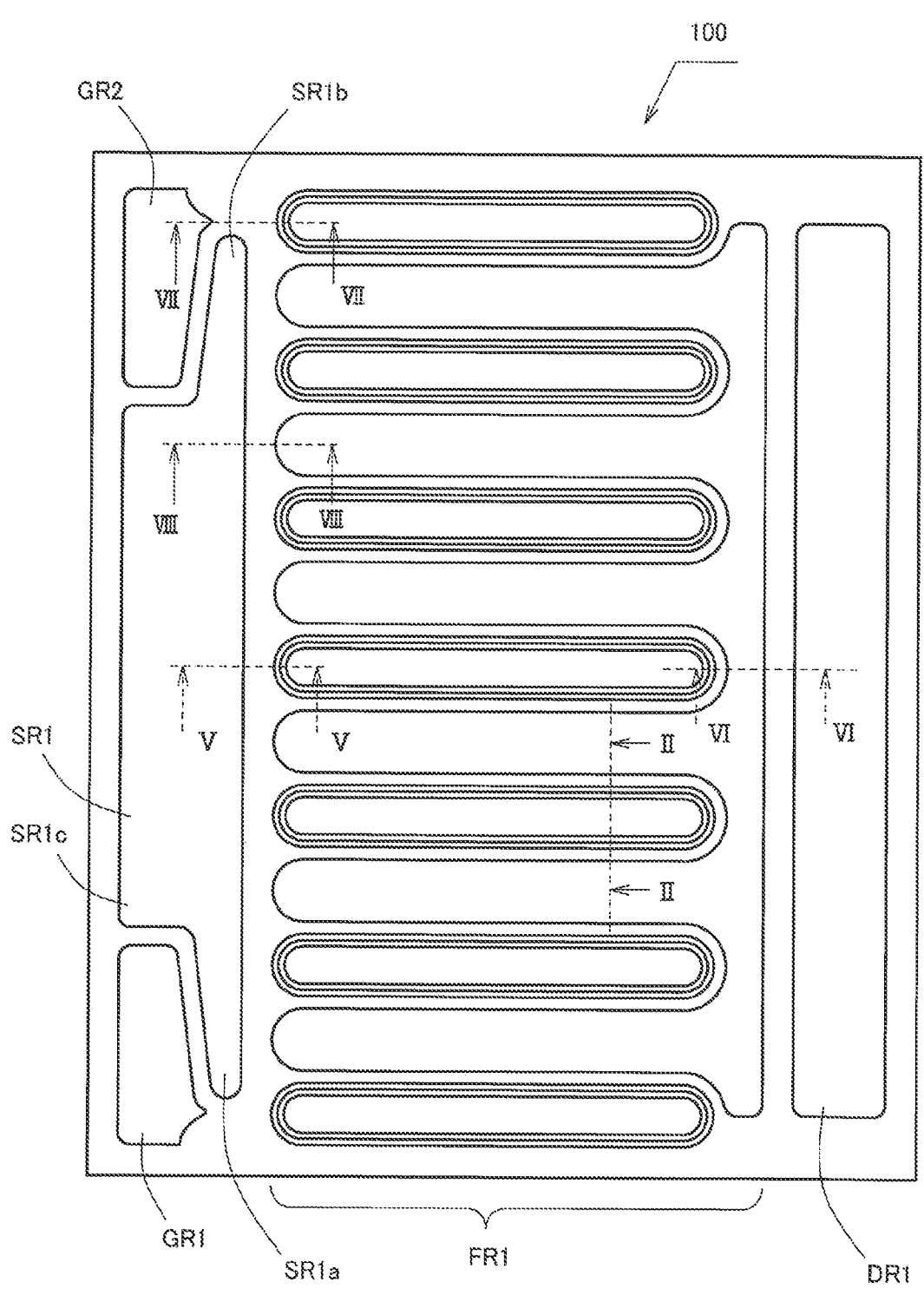
FIG. 1 is a top view of a semiconductor element of a first embodiment.

Specific embodiments will now be described by referring, as examples, semiconductor elements, a method of manufacturing the same, and devices. However, the technique of the present specification is not limited to these embodiments. In the present specification, the term "undoped semiconductor layer" means a semiconductor layer into which no impurity is intentionally doped. The ratios of the thicknesses of respective layers in the drawings do not necessarily reflect the actual thickness ratios.

First Embodiment

1. Structure of Semiconductor Element 1-1. Regions of Semiconductor Element

FIG. 1 is a top view of a semiconductor element 100 of a first embodiment. The semiconductor element 100 is a field effect transistor (FET). As shown in FIG. 1, the semiconductor element 100 has an element functional region FR1, a source electrode exposed region SR1, a drain electrode exposed region DR1, and gate electrode exposed regions GR1 and GR2.

The element functional region FR1 is a region where the element exerts its function. As will be described later, the element functional region FR1 is a region where current actually flows through the semiconductor. The element functional region FR1 is covered with an insulating material such as polyimide. Therefore, in the element functional region FR1, the semiconductor or metal is not exposed.

The source electrode exposed region SR1 is a region where a source electrode is exposed. The source electrode exposed region SR1 is a region where a pad electrode for electrical connection with an external electrode is exposed. The source electrode exposed region SR1 has end portions SR1*a* and SR1*b* and a central portion SR1*c*. The end portions SR1a and SR1b extend away from the central portion SR1c on the side toward the element functional region FR1. The source electrode exposed region SR1 expands as approaching the element functional region FR1 and the drain electrode exposed region DR1.

The drain electrode exposed region DR1 is a region where a drain electrode is exposed. The drain electrode exposed region DR1 is a region where a pad electrode for electrical connection with an external electrode is exposed.

The gate electrode exposed regions GR1 and GR2 are regions where a gate electrode is exposed. The gate electrode exposed regions GR1 and GR2 are regions where pad electrodes for electrical connection with external electrodes are exposed.

The source electrode exposed region SR1, the drain electrode exposed region DR1, and the gate electrode exposed regions GR1 and GR2 are formed on a semiconductor with an insulating layer intervening therebetween. Therefore, in the source electrode exposed region SR1, the drain electrode exposed region DR1, and the gate electrode exposed regions GR1 and GR2, the source electrode, the drain electrode, and the gate electrode are not in contact with the semiconductor.

The source electrode exposed region SR1 is disposed in opposition to the drain electrode exposed region DR1 with the element functional region FR1 intervening therebetween. An overall region including the source electrode exposed region SR1 and the gate electrode exposed regions GR1 and GR2 has a strip-like shape. The drain electrode exposed region DR1 has a strip-like shape.

The gate electrode exposed regions GR1 and GR2 are formed on the side where the source electrode exposed region SR1 is present. The gate electrode exposed regions GR1 and GR2 are disposed in opposite to the drain electrode exposed region DR1 with the element functional region FR1 intervening therebetween. The source electrode exposed region SR1 is located between the gate electrode exposed region GR1 and the gate electrode exposed region GR2. The gate electrode exposed region GR1 faces the end portion SR1a and the central portion SR1c of the source electrode exposed region SR1. The gate electrode exposed region GR2 faces the end portion SR1b and the central portion SR1c of the source electrode exposed region SR1.

The end portion SR1a of the source electrode exposed region SR1 is located between the gate electrode exposed region GR1 and the element functional region FR1. The end portion SR1b of the source electrode exposed region SR1 is located between the gate electrode exposed region GR2 and the element functional region FR1. The width of the source electrode exposed region SR1 and the width of the drain electrode exposed region DR1 are approximately equal to each other at the position where the source electrode exposed region SR1 and the drain electrode exposed region DR1 face the element functional region FR1.

1-2. Element Functional Region 1-2-1. Sectional Structure

Figure 2:
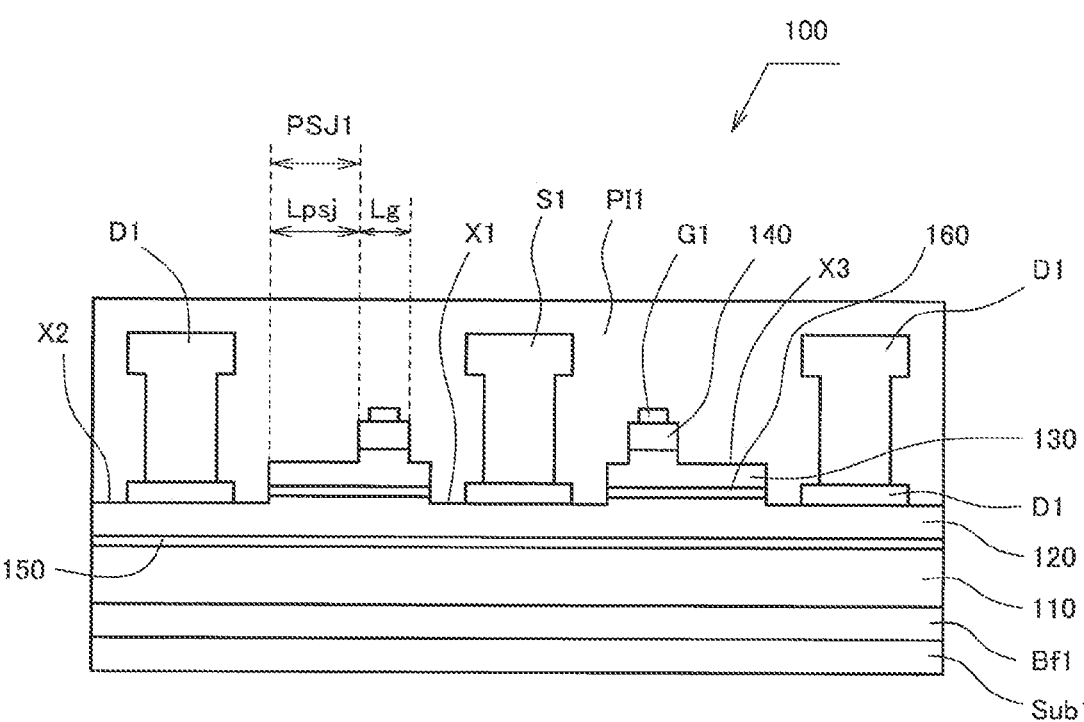
FIG. 2 is a view showing the layered structure of the semiconductor element of the first embodiment.

FIG. 2 is a view showing the layered structure of the semiconductor element (device) 100 of the first embodiment. FIG. 2 is a view showing a section taken along a line II-II of FIG. 1. As shown in FIG. 2, the semiconductor element 100 includes a sapphire substrate Sub1, a buffer layer Bf1, a first semiconductor layer 110, a second semiconductor layer 120, a third semiconductor layer 130, a fourth semiconductor layer 140, a first intermediate layer 150, a second intermediate layer 160, a source electrode S1, a drain electrode D1, a gate electrode G1, and a polyimide layer PI1.

The sapphire substrate Sub1 is a support substrate for supporting the semiconductor layers. The sapphire substrate Sub1 may be, for example, a growth substrate for growth of the semiconductor layers from its +c face. The thickness of the sapphire substrate Sub1 is, for example, 50 μm to 500 μm.

The buffer layer Bf1 is formed on the sapphire substrate Sub1. The buffer layer Bf1 is, for example, a low-temperature GaN buffer layer. The buffer layer Bf1 may be, for example, a low-temperature AlN buffer layer. The thickness of the buffer layer Bf1 is, for example, 20 nm to 50 nm.

The first semiconductor layer 110 is formed above the buffer layer Bf1. The first semiconductor layer 110 is, for example, a GaN layer. The first semiconductor layer 110 is not intentionally doped with impurities. The thickness of the first semiconductor layer 110 is, for example, 300 nm to 5000 nm.

The second semiconductor layer 120 is formed above the first semiconductor layer 110. The second semiconductor layer 120 is located between the first intermediate layer 150 and the second intermediate layer 160 and is sandwiched between the first intermediate layer 150 and the second intermediate layer 160. The second semiconductor layer 120 is in direct contact with the first intermediate layer 150 and the second intermediate layer 160. The second semiconductor layer 120 is, for example, an AlGaN layer. The Al composition ratio of the second semiconductor layer 120 is, for example, 0.1 to 0.5. The band gap of the second semiconductor layer 120 is larger than the band gaps of the first semiconductor layer 110 and the third semiconductor layer 130. The second semiconductor layer 120 is not intentionally doped with impurities. The thickness of the second semiconductor layer 120 is, for example, 20 nm to 150 nm.

The third semiconductor layer 130 is formed above the second semiconductor layer 120. The third semiconductor layer 130 is in direct contact with the second intermediate layer 160. The third semiconductor layer 130 is, for example, a GaN layer. The third semiconductor layer 130 is not intentionally doped with impurities. The third semiconductor layer 130 is sandwiched between recesses X1 and X2 and is separated thereby. Also, the third semiconductor layer 130 surrounds the recess X1, which is a region where the source electrode S1 is formed. The thickness of the third semiconductor layer 130 is, for example, 20 nm to 150 nm.

The fourth semiconductor layer 140 is formed above the third semiconductor layer 130. The fourth semiconductor layer 140 is in direct contact with the third semiconductor layer 130. The fourth semiconductor layer 140 is, for example, a p-type GaN layer. The fourth semiconductor layer 140 is doped with a p-type impurity. The p-type impurity is, for example, Mg. The impurity concentration of the fourth semiconductor layer 140 is, for example, $1 \times 10^{17}$ cm$^{-3}$ to $3 \times 10^{20}$ cm$^{-3}$. The greater the closeness to the gate electrode G1, the higher the impurity concentration of the fourth semiconductor layer 140. The thickness of the fourth semiconductor layer 140 is, for example, 20 nm to 150 nm.

The first intermediate layer 150 is formed above the first semiconductor layer 120. The first intermediate layer 150 is disposed between the first semiconductor layer 110 and the second semiconductor layer 120. The first intermediate layer 150 is in direct contact with the first semiconductor layer 110 and the second semiconductor layer 120. The first intermediate layer 150 contains Al. The first intermediate layer 150 is an AlN layer. The band gap of the first intermediate layer 150 is larger than the band gap of the second semiconductor layer 120. For example, the Al composition ratio of the first intermediate layer 150 is greater than the Al composition ratio of the second semiconductor layer 120. The thickness of the first intermediate layer 150 is, for example, 0.2 nm to 10 nm.

The second intermediate layer 160 is formed above the second semiconductor layer 120. The second intermediate layer 160 is disposed between the second semiconductor layer 120 and the third semiconductor layer 130. The second intermediate layer 160 is in direct contact with the second semiconductor layer 120 and the third semiconductor layer 130. The second intermediate layer 160 contains Al. The second intermediate layer 160 is an AlN layer. The band gap of the second intermediate layer 160 is larger than the band gap of the second semiconductor layer 120. For example, the Al composition ratio of the second intermediate layer 160 is greater than the Al composition ratio of the second semiconductor layer 120. The thickness of the second intermediate layer 160 is, for example, 0.2 nm to 10 nm.

The source electrode S1 is formed on the second semiconductor layer 120. The source electrode S1 is in direct contact with the second semiconductor layer 120. The recess X1 is formed at a location where the source electrode S1 is formed. The recess X1 extends from the fourth semiconductor layer 140 and reaches a midway point of the second semiconductor layer 120. The second semiconductor layer 120 is exposed at the bottom of the recess X1. The source electrode S1 is formed in the recess X1.

The drain electrode D1 is formed on the second semiconductor layer 120. The drain electrode D1 is in direct contact with the second semiconductor layer 120. The recess X2 is formed at a location where the drain electrode D1 is formed. The recess X2 extends from the fourth semiconductor layer 140 and reaches a midway point of the second semiconductor layer 120. The second semiconductor layer 120 is exposed at the bottom of the recess X2. The drain electrode D1 is formed in the recess X2.

The gate electrode G1 is formed on the fourth semiconductor layer 140. The gate electrode G1 is in direct contact with the fourth semiconductor layer 140.

The polyimide layer PI1 covers the surfaces of the semiconductor layers. Also, the polyimide layer PI1 covers electrodes in the element functional region FR1.

As described above, the first semiconductor layer 110, the second semiconductor layer 120, the third semiconductor layer 130, and the fourth semiconductor layer 140 are group-III nitride semiconductor layers. As will be described later, the first intermediate layer 150 and the second intermediate layer 160 are group-III nitride layers. The first semiconductor layer 110, the second semiconductor layer 120, and the third semiconductor layer 130 are undoped semiconductor layers. The fourth semiconductor layer 140 is a p-type semiconductor layer.

The third semiconductor layer 130 has a recess X3 and a region for contact with the fourth semiconductor layer 140. The recess X3 extends from the fourth semiconductor layer 140 and reaches a midway point of the third semiconductor layer 130. The thickness of a portion of the third semiconductor layer 130 in the recess X3 is smaller than the thickness of a portion of the third semiconductor layer 130 in contact with the fourth semiconductor layer 140.

The recess X1 and the recess X2 do not communicate with each other. As will be described later, the recess X1 has a rod-like shape, and the recess X2 has a comb-like shape. The third semiconductor layer 130 is disposed between the recess X1 and the recess X2.

The first intermediate layer 150 and the second intermediate layer 160 sandwiches the second semiconductor layer

120 from opposite sides in a state in which they are in contact with the second semiconductor layer 120.

1-2-2. Planar Structure

Figure 3:
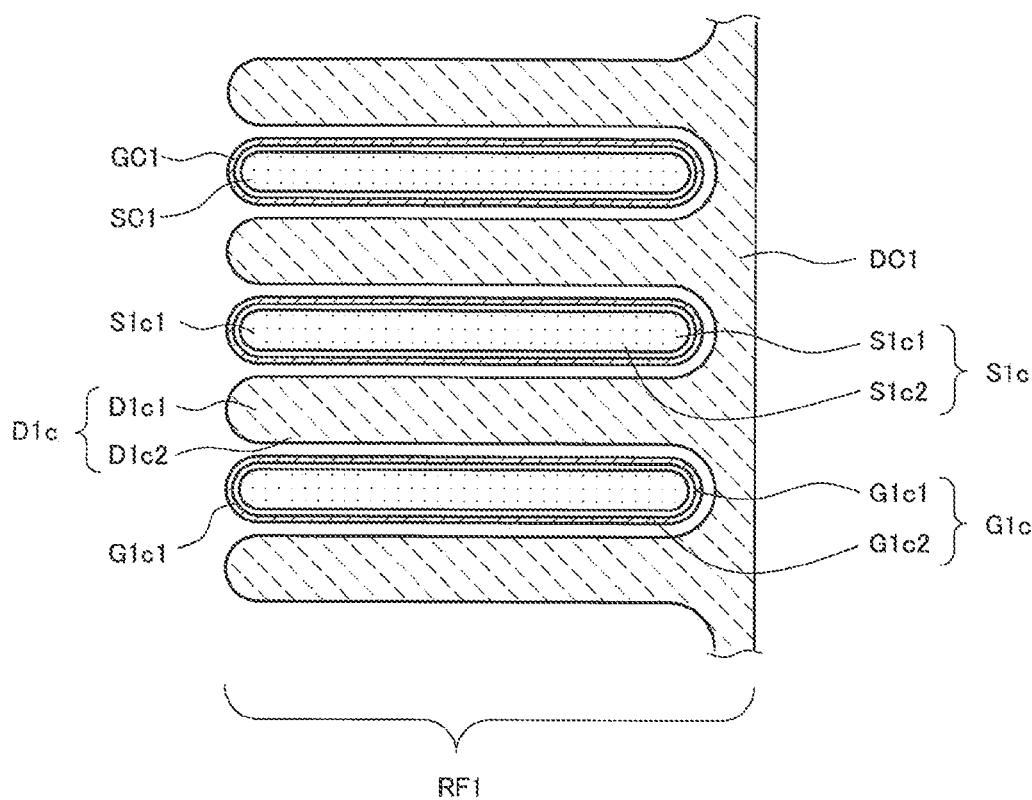
FIG. 3 is a view showing electrode contract regions of an element functional region of the semiconductor element of the first embodiment.

FIG. 3 is a view showing electrode contact regions in the element functional region FR1 of the semiconductor element 100 of the first embodiment. In FIG. 3, the electrode contact regions in the element functional region FR1 are shown as those projected on the second semiconductor layer 120. The semiconductor element 100 has a source electrode contact region SC1, a drain electrode contact region DC1, and a gate electrode contact region GC1.

The source electrode contact region SC1 is a region where the source electrode S1 is in contact with the second semiconductor layer 120. The drain electrode contact region DC1 is a region where the drain electrode D1 is in contact with the second semiconductor layer 120. The gate electrode contact region GC1 is a region where the gate electrode G1 is in contact with the fourth semiconductor layer 140.

The source electrode contact region SC1 is, for example, a first electrode contact region. The drain electrode contact region DC1 is, for example, a second electrode contact region. The gate electrode contact region GC1 is, for example, a third electrode contact region.

The source electrode contact region SC1, the drain electrode contact region DC1, and the gate electrode contact region GC1 do not overlap one another when they are projected on any of the sapphire substrate Sub1, the first semiconductor layer 110, and the second semiconductor layer 120.

The source electrode contact region SC1 has a rod-like shape. The gate electrode contact region GC1 surrounds the circumference of the source electrode contact region SC1 in a non-contact manner. Strictly speaking, the gate electrode contact region GC1 is located on the fourth semiconductor layer 140, and the source electrode contact region SC1 is located on the second semiconductor layer 120.

When projected on the second semiconductor layer 120, the gate electrode contact region GC1 where the gate electrode G1 is in contact with the fourth semiconductor layer 140 surrounds, in a non-contact manner, the circumference of the source electrode contact region SC1 where the source electrode S1 is in contact with the second semiconductor layer 120. When the gate electrode contact region GC1 and the source electrode contact region SC1 are projected on the sapphire substrate Sub1 or the first semiconductor layer 110, the gate electrode contact region GC1 surrounds the circumference of the source electrode contact region SC1 in a non-contact manner.

The drain electrode contact region DC1 has a comb-like shape. The source electrode contact region SC1 and the gate electrode contact region GC1 are disposed to be located at a position between tooth-shaped portions of the drain electrode contact region DC1 such that the source electrode contact region SC1 and the gate electrode contact region GC1 are sandwiched between the tooth-shaped portions. Namely, the rod-like shape of the source electrode contact region SC1 is disposed between tooth like portions of the comb-like shape of the drain electrode contact region DC1.

The shape of a contact surface where the first semiconductor layer 110 and the second semiconductor layer 120 are in contact with each other is rectangular. The longitudinal direction of a region formed by projecting the rod-like shape of the source electrode contact region SC1 on the contact surface is parallel to the short sides of the rectangle. As shown in FIGS. 2 and 3, in a cross section perpendicular to the longitudinal direction of the rod-like shape of the source electrode contact region SC1, the source electrode contact region SC1 and the drain electrode contact region DC1 are alternatingly disposed.

As shown in FIG. 3, the source contact electrode S1$c$ has arc portions (end portions) S1$c$1 and a rod-shaped portion (a portion other than the end portions) S1$c$2. The rod-shaped portion S1$c$2 of the source contact electrode S1$c$ is sandwiched between the arc portions S1$c$1.

The drain contract electrode D1$c$ has arc portions (end portions) D1$c$1 and a rod-shaped portion (a portion other than the end portions) D1$c$2. The rod-shaped portion D1$c$2 of the drain contact electrode D1$c$ is not sandwiched between the arc portions D1$c$1.

The gate contact electrode G1$c$ has arc portions (end portions) G1$c$1 and strip-shaped portions (portions other than the end portions) G1$c$2. The arc portions G1$c$1 of the gate contact electrode G1$c$ are located between the strip-like portions G1$c$2. The arc portions G1$c$1 and the strip-like portions G1$c$2 of the gate contact electrode G1$c$ form an annular shape.

As shown in FIG. 1, the number of the rod-shaped portions of the source electrode contact region SC1 is one greater than the number of the rod-shaped portions of the comb-like shape of the drain electrode contact region DC1. Therefore, each of the electrode contract regions located at the outermost positions of the semiconductor element 100 is not the drain electrode contact region DC1 but is the source electrode contact region SC1.

Figure 4:
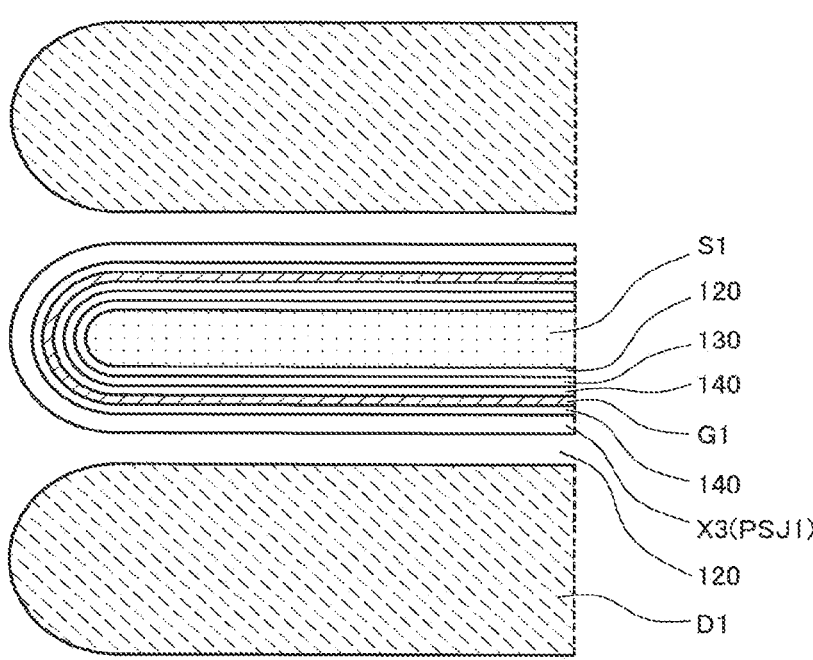
FIG. 4 is an enlarged view of source and drain contact electrodes of the semiconductor element and their vicinities of the first embodiment.

FIG. 4 is an enlarged view of the source contact electrode S1$c$ and the drain contract electrode D1$c$ and their vicinities of the semiconductor element 100 of the first embodiment.

1-2-3. Polarization Super Junction Region

As shown in FIG. 2, the semiconductor element 100 has a polarization super junction region PSJ1. The polarization super junction region PSJ1 is a region which has the first semiconductor layer 110, the second semiconductor layer 120, and the third semiconductor layer 130 and does not have the fourth semiconductor layer 140. Namely, the polarization super junction region PSJ1 is a region in which the third semiconductor layer 130 is formed and the fourth semiconductor layer 140 is not formed and which is located between the gate electrode contact region GC1 and the drain electrode contact region DC1.

As described above, the polarization super junction region PSJ1 does not have any p-type semiconductor layer. The polarization super junction region PSJ1 is located in a region sandwiched between the gate electrode contact region GC1 and the drain electrode contact region DC1. A polarization super junction length Lpsj is the length of the polarization super junction region PSJ1 in the direction of shortest distance from the source electrode contact region SC1 to the drain electrode contact region DC1.

1-3. Source Electrode Exposed Region

Figure 5:
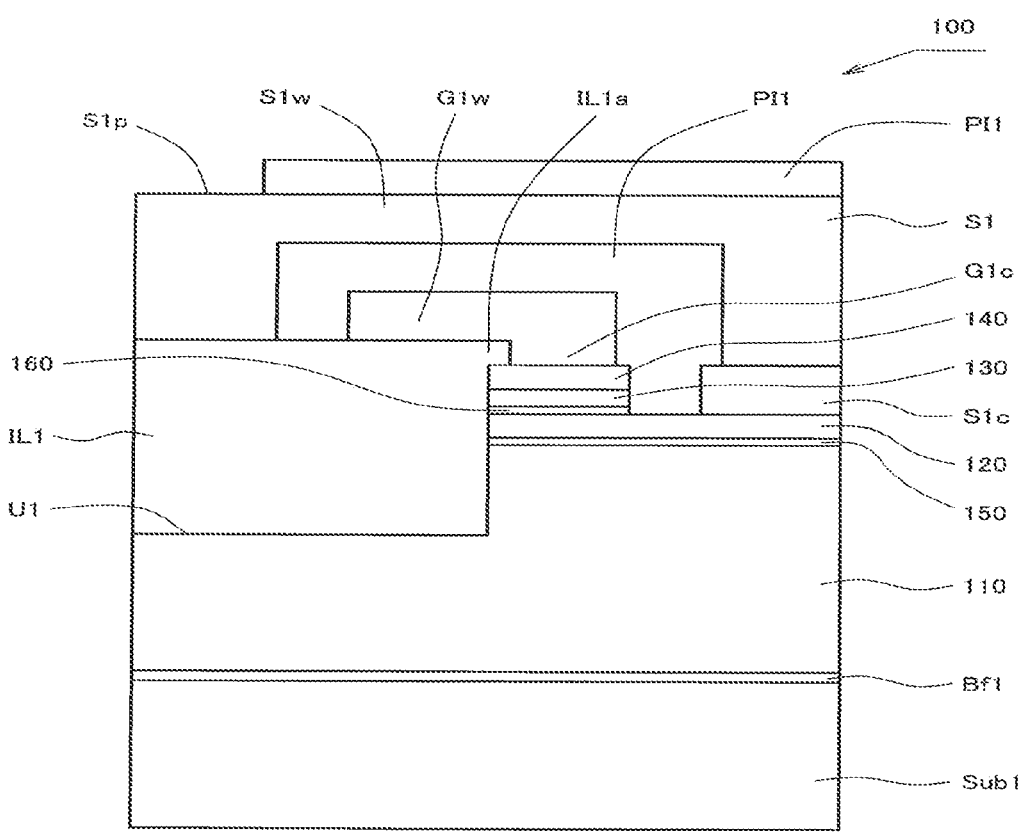
FIG. 5 is a view (first view) showing the sectional structure of a source electrode exposed region and its vicinity of the semiconductor element of the first embodiment.

FIG. 5 is a view (first view) showing the sectional structure of the source electrode exposed region SR1 and its vicinity of the semiconductor element 100 of the first embodiment. FIG. 5 is a view showing a cross section taken along a line V-V of FIG. 1. As shown in FIG. 5, an insulating layer IL1 is formed on the first semiconductor layer 110. The source electrode S1 is formed on the insulating layer IL1. The polyimide layer PI1 is formed between a gate wiring electrode G1$w$ of the gate electrode G1 and a source wiring electrode S1$w$ of the source electrode S1. The polyimide layer PI1 insulates the gate electrode G1 and the source electrode S1 from each other. In the source electrode exposed region SR1, the source electrode S1 and the semiconductor are not electrically connected.

In the first semiconductor layer 110, a groove U1 is formed along at least a portion of the source electrode exposed region SR1. Because of presence of the groove U1, the distance between the first semiconductor layer 110 and the source electrode S1 can be increased. Namely, the insulation between the first semiconductor layer 110 and the source electrode S1 is enhanced.

The source electrode S1 has the source contact electrode S1$c$, the source wiring electrode S1$w$, and a source pad electrode S1$p$. The source contact electrode S1$c$ is in direct contact with the second semiconductor layer 120. The source wiring electrode S1$w$ connects the source contact electrode S1$c$ and the source pad electrode S1$p$. The source pad electrode S1$p$ is an electrode for electrical connection to an external power source.

1-4. Drain Electrode Exposed Region

Figure 6:
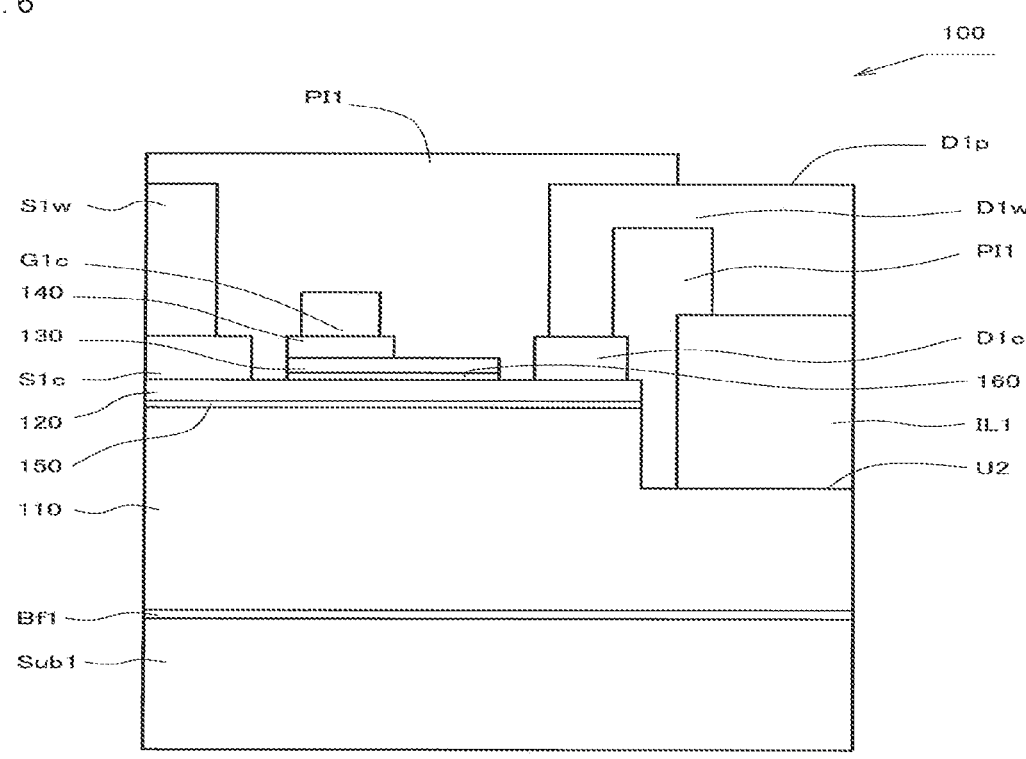
FIG. 6 is a view showing the sectional structure of a drain electrode exposed region and its vicinity of the semiconductor element of the first embodiment.

FIG. 6 is a view showing the sectional structure of the drain electrode exposed region DR1 and its vicinity of the semiconductor element 100 of the first embodiment. FIG. 6 is a view showing a cross section taken along a line VI-VI of FIG. 1. As shown in FIG. 6, the insulating layer IL1 is formed on the first semiconductor layer 110. The drain electrode D1 is formed on the insulating layer IL1. The polyimide layer PI1 fills the gap between the drain electrode D1 and the insulating layer IL1. In the drain electrode exposed region DR1, the drain electrode D1 and the semiconductor are not electrically connected.

In the first semiconductor layer 110, a groove U2 is formed along at least a portion of the drain electrode exposed region DR1. Because of presence of the groove U2, the distance between the first semiconductor layer 110 and the drain electrode D1 can be increased. Namely, the insulation between the first semiconductor layer 110 and the drain electrode D1 is enhanced.

The drain electrode D1 has the drain contract electrode D1$c$, a drain wiring electrode D1$w$, and a drain pad electrode D1$p$. The drain contract electrode D1$c$ is in direct contact with the second semiconductor layer 120. The drain wiring electrode D1$w$ connects the drain contact electrode D1$c$ and the drain pad electrode D1$p$. The drain pad electrode D1$p$ is an electrode for electrical connection to the external power source.

1-5. Gate Electrode Exposed Region

Figure 7:
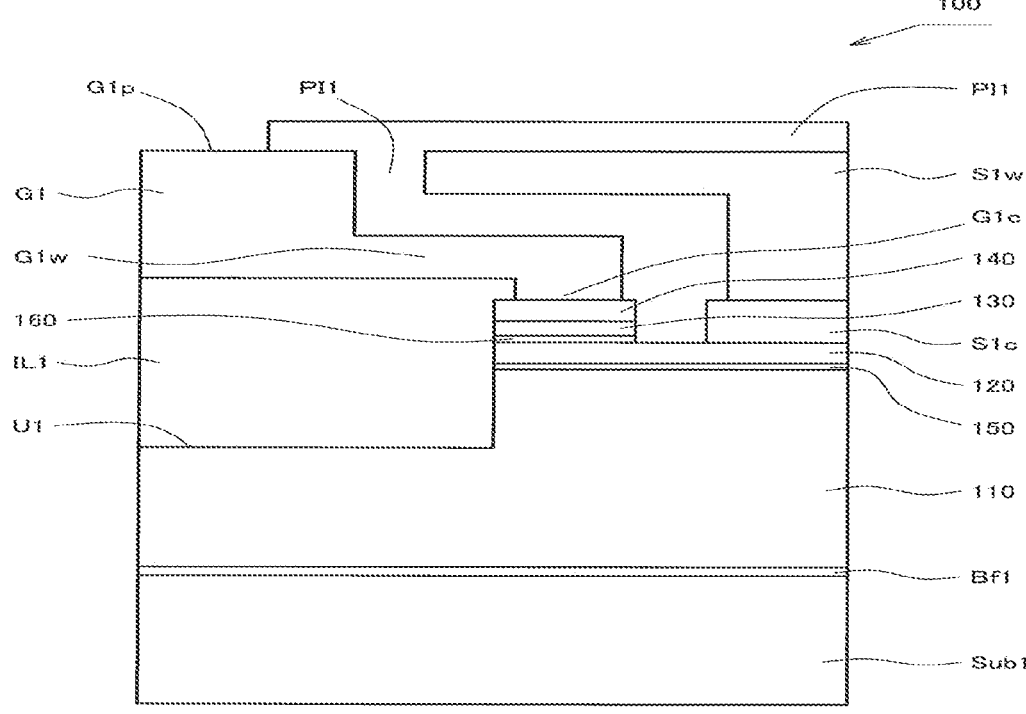
FIG. 7 is a view showing the sectional structure of a gate electrode exposed region and its vicinity of the semiconductor element of the first embodiment.

FIG. 7 is a view showing the sectional structure of the gate electrode exposed region GR1 and its vicinity of the semiconductor element 100 of the first embodiment. FIG. 7 is a view showing a cross section taken along a line VII-VII of FIG. 1. As shown in FIG. 7, the insulating layer IL1 is formed on the first semiconductor layer 110. The gate electrode G1 is formed on the insulating layer IL1. In the gate electrode exposed region GR1, the gate electrode G1 and the semiconductor are not electrically connected.

The gate electrode G1 has the gate contract electrode G1$c$, a gate wiring electrode G1$w$, and a gate pad electrode G1$p$. The gate contract electrode G1$c$ is in direct contact with the fourth semiconductor layer 140. The gate wiring electrode G1$w$ connects the gate contact electrode G1$c$ and the gate pad electrode G1$p$. The gate pad electrode G1$p$ is an electrode for electrical connection to the external power source.

1-6. Insulating Film Formation Region

Figure 8:
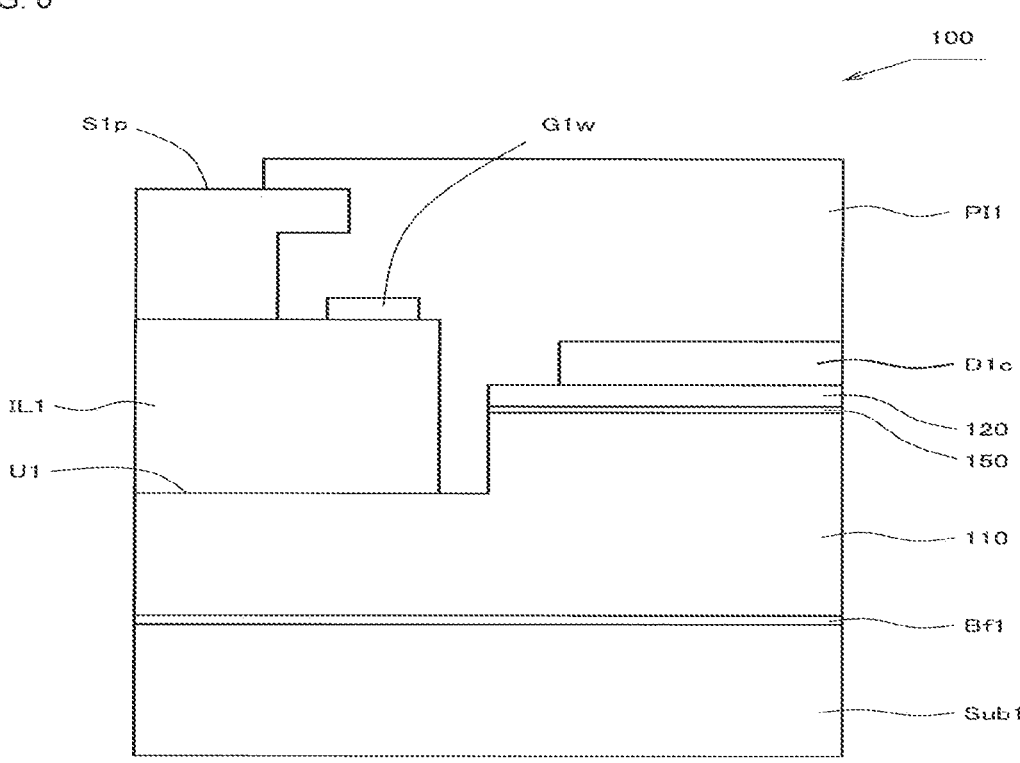
FIG. 8 is a view (second view) showing the sectional structure of the source electrode exposed region and its vicinity of the semiconductor element of the first embodiment.

FIG. 8 is a view (second view) showing the sectional structure of the source electrode exposed region SR1 and its vicinity of the semiconductor element 100 of the first embodiment. FIG. 8 is a view showing a cross section taken along a line VIII-VIII of FIG. 1. As shown in FIG. 8, the drain contract electrode D1$c$ of the drain electrode D1 extends toward the source pad electrode S1$p$ side. In an extension region where the drain contract electrode D1$c$ of the drain electrode D1 extends toward the source pad electrode S1$p$ side, the insulating layer IL1 is not in contact with the first semiconductor layer 110 and the second semiconductor layer 120. However, the insulating layer IL1 is formed on the first semiconductor layer 110 and is in contact with the first semiconductor layer 110 at the bottom of the groove U1.

Figure 9:
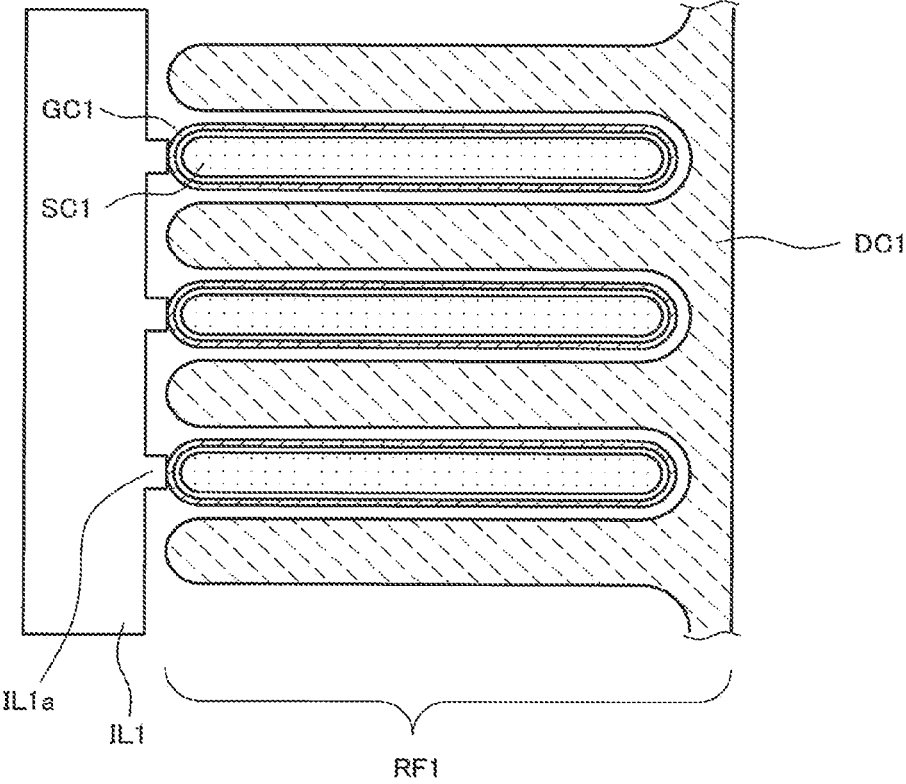
FIG. 9 is a view showing the positional relation between an insulating layer and a source electrode contact region and a drain electrode contact region of the semiconductor element of the first embodiment.

FIG. 9 is a view showing the positional relation between the source electrode contact region SC1 and the insulating layer IL1 and the positional relation between the drain electrode contact region DC1 and the insulating layer IL1 in the semiconductor element 100 of the first embodiment. FIG. 9 is a plan view drawn by extracting the insulating layer IL1, the source electrode contact region SC1, and the drain electrode contact region DC1.

As shown in FIG. 9, the insulating layer IL1 has protruding portions IL1$a$ which protrude toward the source electrode contact region SC1 and the gate electrode contact region GC1. As shown in FIG. 5, the protruding portions IL1$a$ are disposed at a position between the gate wiring electrode G1$w$ and the first semiconductor layer 110, the position being located on an extension of the source electrode contact region SC1 in the longitudinal direction.

As shown in FIGS. 5 and 9, the insulating layer IL1 is in contact with the second semiconductor layer 120 at the positions of the protruding portions IL1$a$. As shown in FIGS. 8 and 9, the insulating layer IL1 is not in contact with the second semiconductor layer 120 at positions other than the positions of the protruding portions IL1$a$. As shown in FIG. 5, the protruding portions IL1$a$ of the insulating layer IL1 are in contact with the second semiconductor layer 120, the third semiconductor layer 130, the fourth semiconductor layer 140, the gate contact electrode G1$c$, and the gate wiring electrode G1$w$.

1-7. Electrode Wiring Structure

Figure 10:
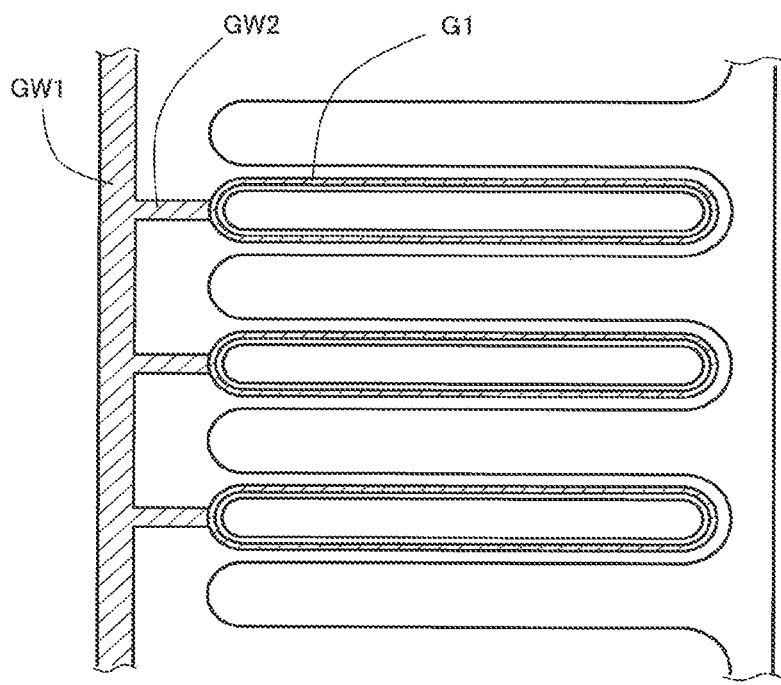
FIG. 10 is a view showing wiring of a gate electrode of the semiconductor element of the first embodiment.

FIG. 10 is a view showing wiring of the gate electrode G1 of the semiconductor element 100 of the first embodiment. The gate electrode G1 of the gate electrode contact region GC1 is connected to gate wiring electrodes GW2. The gate wiring electrodes GW2 are formed to extend in a direction parallel to the longitudinal direction of the source electrode contact region SC1. The gate wiring electrode GW1 is electrically connected to the plurality of gate contact electrodes G1$c$ through the gate wiring electrodes GW2. The gate wiring electrode GW1 and the gate wiring electrodes GW2 are parts of the gate wiring electrode G1$w$.

Figure 11:
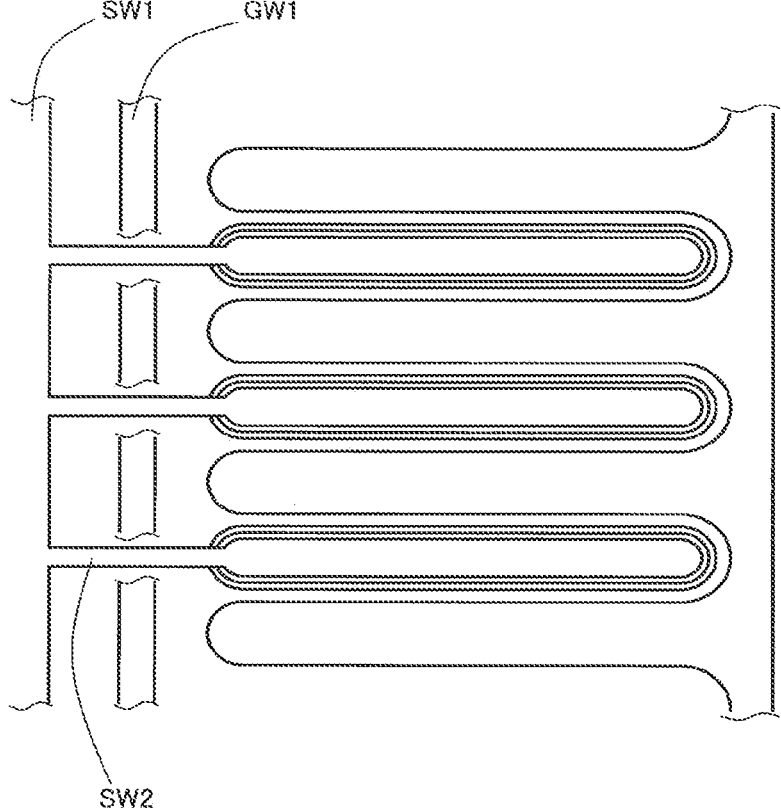
FIG. 11 is a view showing wiring of a source electrode of the semiconductor element of the first embodiment.

FIG. 11 is a view showing wiring of the source electrode S1 of the semiconductor element 100 of the first embodiment. The source contact electrode S1$c$ is connected to source wiring electrodes SW2. The source wiring electrodes SW2 are formed to extend in a direction parallel to the longitudinal direction of the source electrode contact region SC1. The source wiring electrode SW1 is electrically connected to the plurality of source contact electrodes S1$c$ through the source wiring electrodes SW2. The source wiring electrode SW1 and the source wiring electrodes SW2 are parts of the source wiring electrode S1$w$.

As shown in FIG. 11, a region obtained by projecting the source wiring electrode S1$w$ of the source electrode S1 on the second semiconductor layer 120 does not overlap with a region obtained by projecting the drain wiring electrode D1$w$ of the drain electrode D1 on the second semiconductor layer 120.

As shown in FIGS. 10 and 11, regions obtained by projecting the source wiring electrodes SW2 on the second semiconductor layer 120 overlap with regions obtained by projecting the gate wiring electrodes GW2 on the second semiconductor layer 120.

A region obtained by projecting the source wiring electrode S1$w$ of the source electrode S1 on the second semiconductor layer 120 partially overlaps with a region obtained by projecting the gate wiring electrode G1$w$ of the gate electrode G1 on the second semiconductor layer 120. A region obtained by projecting the drain wiring electrode D1$w$ of the drain electrode D1 on the second semiconductor layer 120 does not overlap with the region obtained by projecting the gate wiring electrode G1$w$ of the gate electrode G1 on the second semiconductor layer 120.

1-8. Layered Structures of Electrodes

1-8-1. Source Electrode and Drain Electrode

As described above, the source electrode S1 and the drain electrode D1 are formed on the second semiconductor layer 120. In the case where the second semiconductor layer 120 is an AlGaN layer, the source electrode S1 and the drain electrode D1 are in contact with the AlGaN layer.

Figure 12:
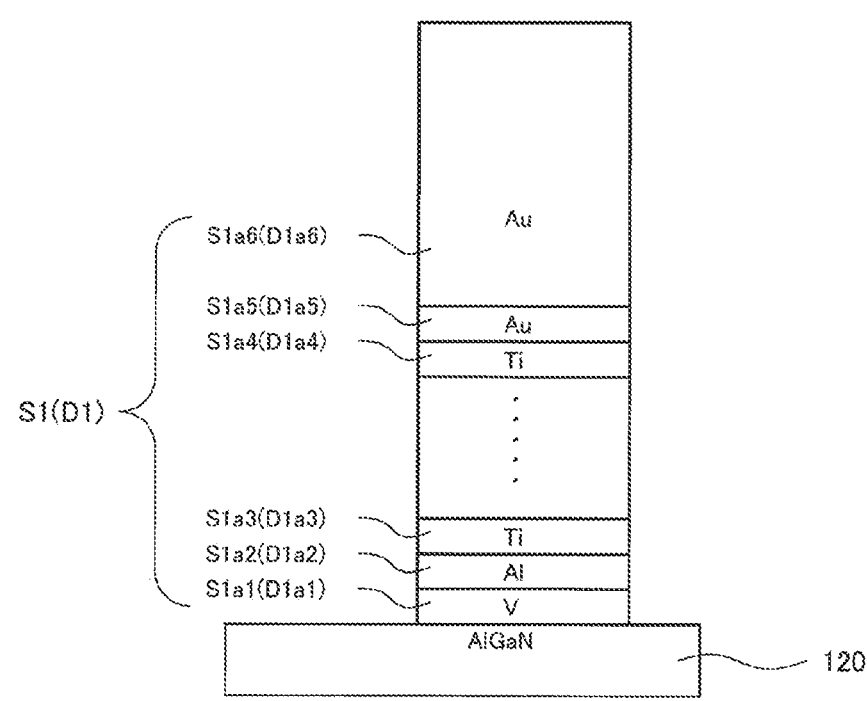
FIG. 12 is a view showing the layered structure of the source and drain electrodes of the semiconductor element of the first embodiment.

FIG. 12 is a view showing the layered structures of the source electrode S1 and the drain electrode D1 of the semiconductor element 100 of the first embodiment. The source electrode S1 has a first metal layer S1$a$1, a second metal layer S1$a$2, a third metal layer S1$a$3, a fourth metal layer S1$a$4, a fifth metal layer S1$a$5, and a sixth metal layer S1$a$6, which are formed in this order from the side where the second semiconductor layer 120 is present. Another metal layer may be present between the third metal layer S1$a$3 and the fourth metal layer S1$a$4.

The first metal layer S1$a$1 is formed of, for example, V. The second metal layer S1$a$2 is formed of, for example, Al. The third metal layer S1$a$3 is formed of, for example, Ti. The fourth metal layer S1$a$4 is formed of, for example, Ti. The fifth metal layer S1$a$5 is formed of, for example, Au. The sixth metal layer S1$a$6 is formed of, for example, Au. The above-described metals are examples, and metals or alloys other than the above-described metals may be used.

The thickness of the first metal layer S1$a$1 is, for example, 5 nm to 60 nm. The thickness of the second metal layer S1$a$2 is, for example, 20 nm to 400 nm. The thickness of the third metal layer S1$a$3 is, for example, 5 nm to 60 nm. The thickness of the fourth metal layer S1$a$4 is, for example, 5 nm to 60 nm. The thickness of the fifth metal layer S1$a$5 is, for example, 50 nm to 400 nm. The thickness of the sixth metal layer S1$a$6 is, for example, 1000 nm to 15000 nm. The above-described thicknesses are examples, and thicknesses other than the above-described thicknesses may be used.

The metal layers from the first metal layer S1$a$1 to the fifth metal layer S1$a$5 correspond to, for example, the source contact electrode S1$c$. The sixth metal layer S1$a$6 corresponds to, for example, the source wiring electrode S1$w$.

The drain electrode D1 has a first metal layer D1$a$1, a second metal layer D1$a$2, a third metal layer D1$a$3, a fourth metal layer D1$a$4, a fifth metal layer D1$a$5, and a sixth metal layer D1$a$6, which are formed in this order from the side where the second semiconductor layer 120 is present. The metal types and thicknesses of these metal layers are the same as those of the source electrode S1. Needless to say, the metal types and thicknesses of these metal layers may differ from those of the source electrode S1.

1-8-2. Gate Electrode

Figure 13:
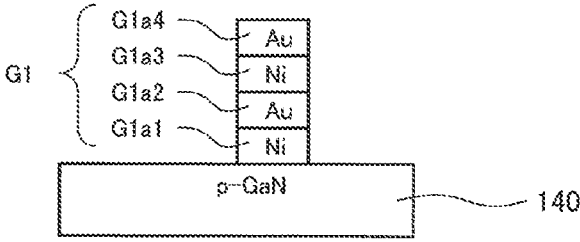
FIG. 13 is a view showing the layered structure of the gate electrode of the semiconductor element of the first embodiment.

FIG. 13 is a view showing the layered structure of the gate electrode G1 of the semiconductor element 100 of the first embodiment. The gate electrode G1 has a first metal layer G1$a$1, a second metal layer G1$a$2, a third metal layer G1$a$3, and a fourth metal layer G1a4, which are formed in this order from the side where the fourth semiconductor layer 140 is present.

The first metal layer G1a1 is formed of, for example, Ni. The second metal layer G1a2 is formed of, for example, Au. The third metal layer G1a3 is formed of, for example, Ni. The fourth metal layer G1a4 is formed of, for example, Au. The above-described metals are examples, and metals or alloys other than the above-described metals may be used.

The thickness of the first metal layer G1a1 is, for example, 5 nm to 100 nm. The thickness of the second metal layer G1a2 is, for example, 5 nm to 300 nm. The thickness of the third metal layer G1a3 is, for example, 5 nm to 100 nm. The thickness of the fourth metal layer G1a4 is, for example, 50 nm to 400 nm. The above-described thicknesses are examples, and thicknesses other than the above-described thicknesses may be used.

The metal layers from the first metal layer G1a1 to the third metal layer G1a3 correspond to, for example, the gate contact electrode G1c. The fourth metal layer G1a4 corresponds to, for example, the gate wiring electrode G1w. Alternatively, the metal layers from the first metal layer G1a1 to the fourth metal layer G1a4 may correspond to the gate contact electrode G1c, and the gate wiring electrode G1w may be present thereon.

Figure 14:
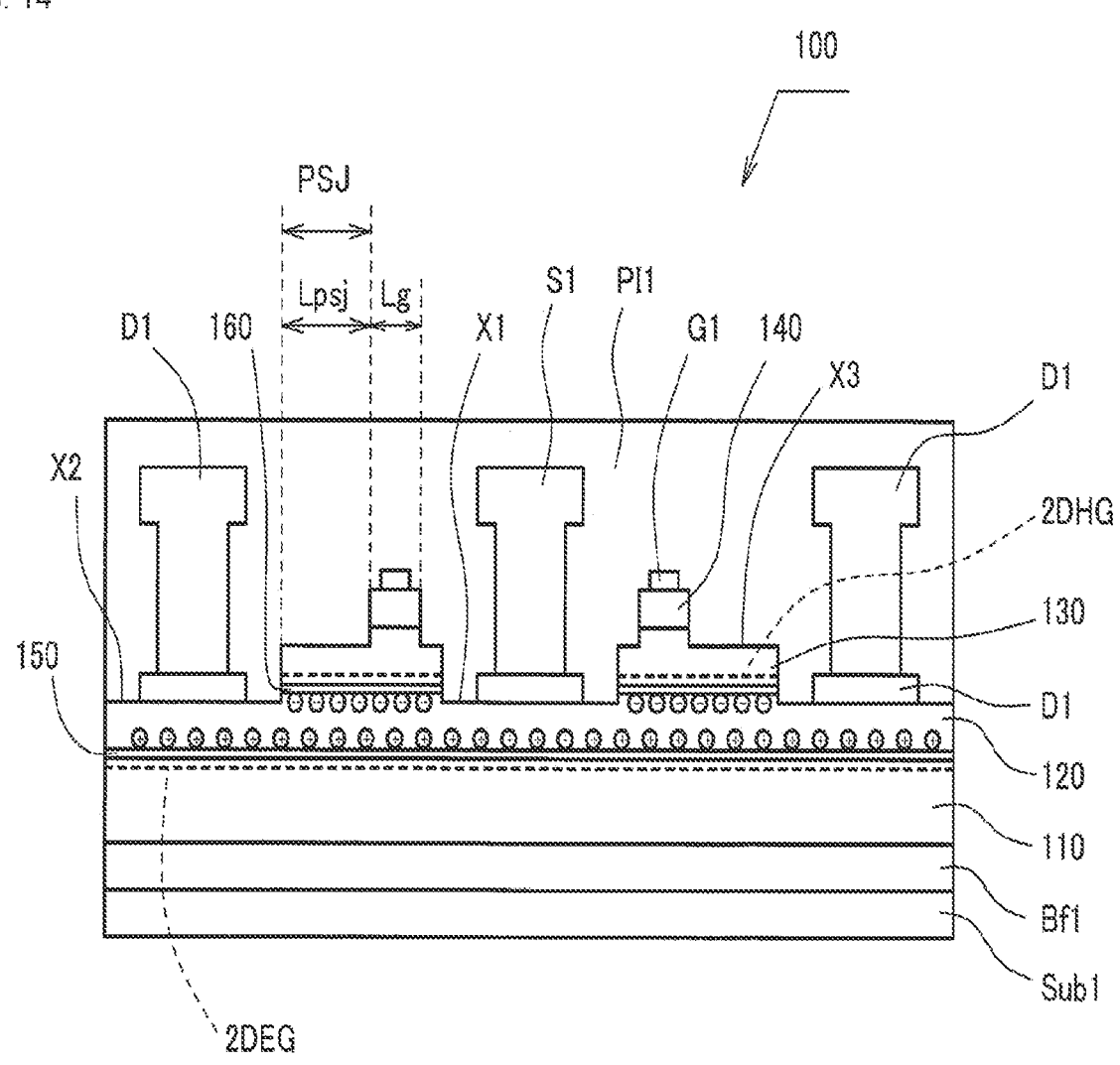
FIG. 14 is a view showing a two-dimensional electron gas and a two-dimensional hole gas in the semiconductor element of the first embodiment.
Figure 15A:
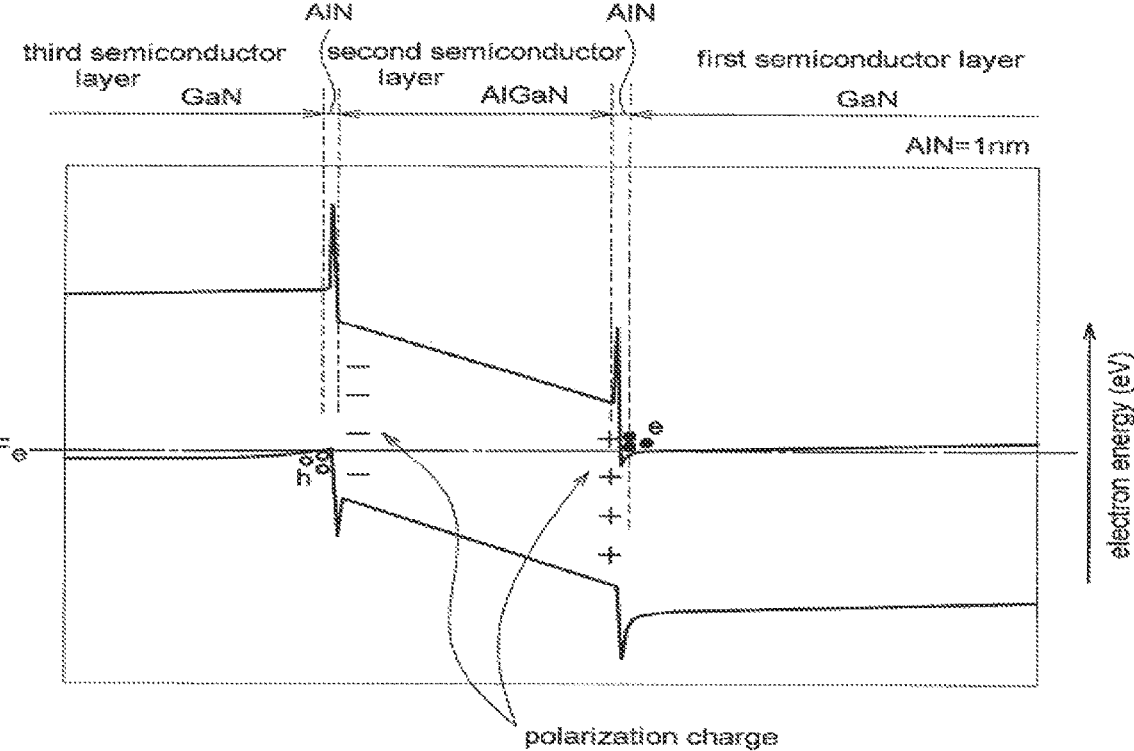
FIG. 15A is a view showing the band diagram indicating electrons and holes existing levels in which the AlN thicknesses of a first and second intermediate layers are 1 nm.
Figure 15B:
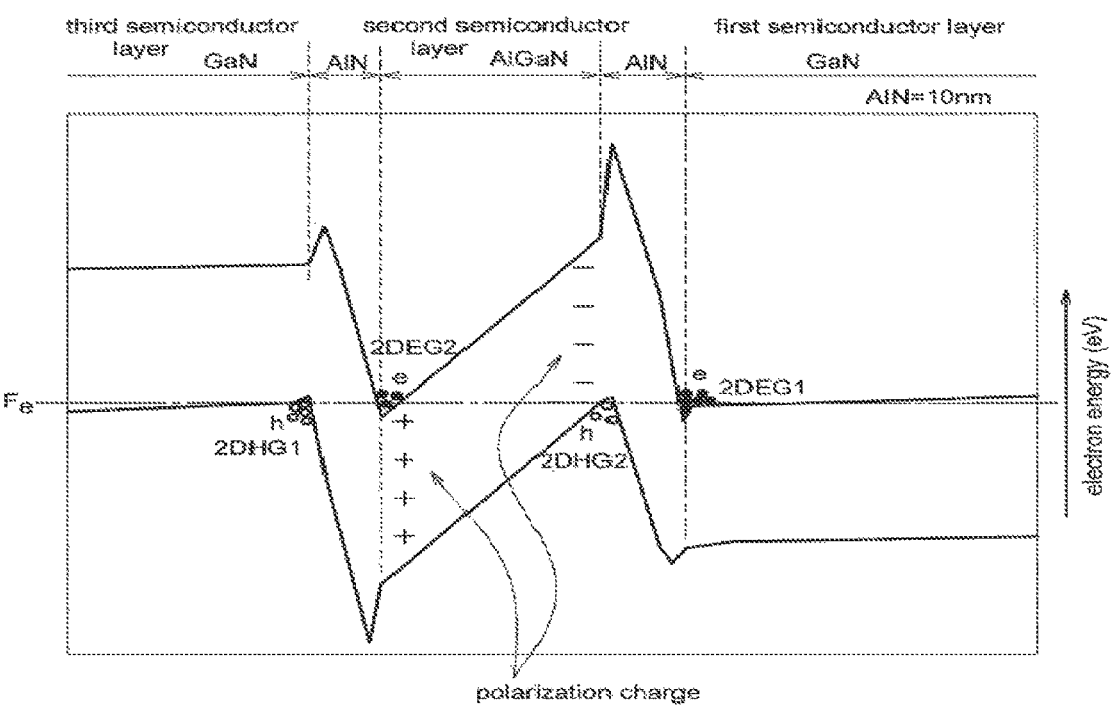
FIG. 15B is a view showing the band diagram indicating electrons and holes existing levels in which the AlN thicknesses of a first and second intermediate layers are 10 nm.

2. Operation Principle of Semiconductor Element 2-1. Two-Dimensional Electron Gas and Two-Dimensional Hole Gas FIG. 14 is a view showing a two-dimensional electron gas and a two-dimensional hole gas in the semiconductor element 100 of the first embodiment. FIGS. 15A and 15B are views showing the band diagrams of the semiconductor element 100 of the first embodiment. FIGS. 14 and 15A show the view and the band diagram when the first intermediate layer 150, i.e., AlN layer, and the second intermediate layer 160, i.e., AlN layer, are relatively thin, about 1 nm. FIG. 15B shows the band diagram when the first intermediate layer 150, i.e., AlN layer, and the second intermediate layer 160, i.e., AlN layer, are relatively thick, about 10 nm.

As shown in FIG. 14, the first semiconductor layer 110 and the second semiconductor layer 120 are in heterojunction with the first intermediate layer 150. As a result, piezo polarization and spontaneous polarization occur, and positive fixed charges are induced in the second semiconductor layer 120 on the side toward the first semiconductor layer 110. Also, the second semiconductor layer 120 and the third semiconductor layer 130 are in heterojunction with the second intermediate layer 160. As a result, piezo polarization and spontaneous polarization occur, and negative fixed charges are induced in the second semiconductor layer 120 on the side toward the third semiconductor layer 130.

As a result, as shown in FIGS. 14 and 15A, a two-dimensional electron gas (2DEG) is generated in the first semiconductor layer 110 on the side toward the second semiconductor layer 120, and a two-dimensional hole gas (2DHG) is generated in the third semiconductor layer 130 on the side toward the second semiconductor layer 120.

Also, the p-type fourth semiconductor layer 140 is in contact with the third semiconductor layer 130. Therefore, the energy of the upper end of the valence band in the third semiconductor layer 130 on the side toward the second semiconductor layer 120 is raised. Therefore, generation of the two-dimensional hole gas (2DHG) is promoted.

In this manner, the two-dimensional electron gas (2DEG) and the two-dimensional hole gas (2DHG) are generated at the hetero interface as shown in FIGS. 14 and 15A.

As shown in FIG. 15A, since the thin AlN layer is present between the GaN layer and the AlGaN layer, the barrier between the GaN layer and the AlGaN layer tends to become high. Therefore, the sheet carrier concentration at the interface between the first semiconductor layer 110 and the first intermediate layer 150 is sufficiently high, and the sheet carrier concentration at the interface between the first intermediate layer 150 and the second semiconductor layer 120 is low. Similarly, the sheet carrier concentration at the interface between the third semiconductor layer 130 and the second intermediate layer 160 is sufficiently high, and the sheet carrier concentration at the interface between the second intermediate layer 160 and the second semiconductor layer 120 is low.

2-2. Threshold Voltage

In the case where a gate voltage applied to the gate electrode G1 is equal to or higher than a threshold voltage Vth, the two-dimensional electron gas (2DEG) and the two-dimensional hole gas (2DHG) are generated. In this state, current flows between the source electrode S1 and the drain electrode D1. The threshold voltage Vth is, for example, about −5 V.

In the case where the gate voltage applied to the gate electrode G1 is lower than the threshold voltage Vth, the band diagram is varied by the gate bias. The edge (bottom level) of the conduction and the valence are inclined upward toward the gate electrode G1. As a result, the two-dimensional electron gas (2DEG) and the two-dimensional hole gas (2DHG) are depleted. Current hardly flows between the source electrode S1 and the drain electrode D1. In actuality, a small leakage current flows between the source electrode S1 and the drain electrode D1.

When the gate voltage is rendered lower than the threshold voltage Vth, holes are drawn from the fourth semiconductor layer 140. Therefore, positive charges are not supplied from the gate electrode G1 to the third semiconductor layer 130, whereby the two-dimensional electron gas (2DEG) and the two-dimensional hole gas (2DHG) disappear almost at the same time.

Drain current flows through a path formed by the drain electrode D1, the second semiconductor layer 120, the two-dimensional electron gas (2DEG) of the first semiconductor layer 110, the second semiconductor layer 120, and the source electrode S1. The two-dimensional hole gas (2DHG) is only generated together with the two-dimensional electron gas (2DEG) when the semiconductor element 100 is turned on and off, and is not directly used to cause current to flow through the semiconductor element 100.

3. Electrical Characteristics of Semiconductor Element

Here, the relation between the structure of the semiconductor element 100 and the electrical characteristics of the semiconductor element 100 will be described.

Figure 16:
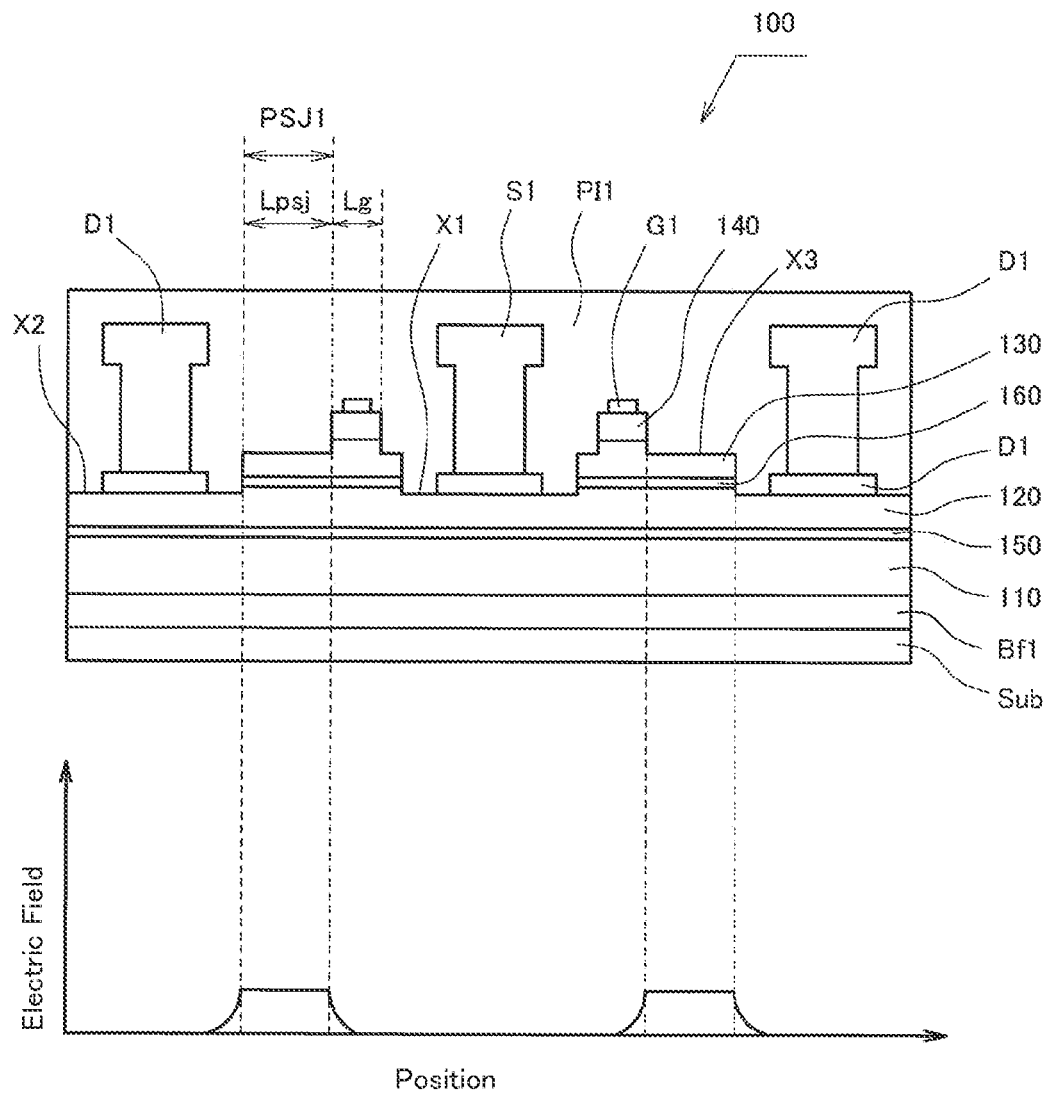
FIG. 16 is a schematic view conceptually showing an electric field in the case where a reverse bias is applied to the gate electrode of the semiconductor element of the first embodiment.

FIG. 16 is a schematic view conceptually showing an electric field in the case where a reverse bias is applied to the gate electrode G1 of the semiconductor element 100 of the first embodiment. The horizontal axis of FIG. 16 shows the position in the semiconductor element 100. The vertical axis of FIG. 16 shows the electric field. When a reverse bias is applied, holes in the semiconductor element 100 are drawn. Therefore, the two-dimensional electron gas (2DEG) and the two-dimensional hole gas (2DHG) disappear. Thus, the first semiconductor layer 110, the second semiconductor layer 120, and the third semiconductor layer 130 are depleted. As a result, the strength of the electric field becomes uniform over the polarization super junction region PSJ1 in a channel length direction, i.e., a current flow direction, in FIG. 16. The area of the electric field shown in FIG. 16 corresponds to voltage.

Even when a high voltage is applied between the source electrode S1 and the drain electrode D1 of the semiconductor element 100, through application of a reverse bias to the gate electrode, a spatially widely spread electric field can be formed as shown in FIG. 16. Namely, this semiconductor element 100 can prevent formation of an electric field which is strong locally. Therefore, the breakdown voltage of the semiconductor element 100 is high.

In the present specification, the breakdown voltage of the FET is the value of the drain voltage Vd at the time when the drain current Id reaches $1 \times 10^{-4}$ A as a result application of the drain voltage Vd in an OFF state (a state in which the gate voltage Vg is set to −10 V). In the present embodiment, the rated current of the semiconductor element 100 at ordinary temperature is about several amperes to several tens of amperes. The above-described drain current Id is approximately five orders of magnitude smaller than this rated current.

3-1. Polarization Super Junction Region

If the polarization super junction region PSJ1 is present, the polarization super junction region PSJ1 can be depleted. Even when a large reverse bias is applied to the gate electrode G1, a uniformly spread electric field is formed over the polarization super junction region PSJ1. Meanwhile, in a conventional FET, a strong electric field is formed in the vicinity of its gate in many cases. Therefore, the strength of the electric field formed in the vicinity of the gate electrode G1 is sufficiently small, as compared with a conventional FET under the same conditions. In the above-described manner, in the semiconductor element 100, concentration of electric field to the vicinity of the gate is mitigated. Therefore, there is a tendency that the longer the polarization super junction length Lpsj, which is the length of the polarization super junction region PSJ1, the higher the breakdown voltage of the semiconductor element 100.

Meanwhile, when the polarization super junction length Lpsj is short, the distance between the source electrode S1 and the drain electrode D1 is short. Therefore, there is a tendency that the shorter the polarization super junction length Lpsj, the lower the ON resistance of the semiconductor element 100.

Also, since the polarization super junction region PSJ1 is present, current collapse is suppressed.

3-2. Gate Length

The gate length Lg is the length of the fourth semiconductor layer 140 in the direction of shortest distance from the source electrode contact region SC1 to the drain electrode contact region DC1. There is a tendency that the shorter the gate length Lg, the shorter the response time. In the case where the gate length Lg is short, the depletion layer region in the direction of the gate length Lg is short. Since the depletion layer region becomes narrow, the gate charge capacity can be small. Namely, it is possible to reduce the amount of electric charge which the gate electrode G1 supplies or discharges to the depletion layer region during switching operation of the semiconductor element 100. Therefore, the semiconductor element 100 has an increased switching speed.

3-3. Gate Width

The gate width is the length of the fourth semiconductor layer 140 in a direction orthogonal to the direction of shortest distance from the source electrode contact region SC1 to the drain electrode contact region DC1. Namely, the gate width is the length over which the gate electrode contact region GC1 surrounds the circumference of the source electrode contact region SC1. Since a plurality of source electrode contact regions SC1 are disposed separately, in actuality, the gate width is the sum of lengths over which a plurality of gate electrode contact regions GC1 surround the circumferences of the plurality of source electrode contact regions SC1.

The longer the gate width, the greater the degree to which the region through which current flows to the semiconductor element 100 can be increased. Therefore, there is a tendency that the longer the gate width, the larger the current value at the time when the drain voltage Vd is 2 V. In the first embodiment, in order to increase the gate width, the source electrode contact region SC1 is formed to have a rod-like shape, and the drain electrode contact region DC1 is formed to have a comb-like shape.

Notably, there can be employed an idea of increasing the source width or the drain width because drain current flows between the source electrode S1 and the drain electrode D1. It is considered that the drain current is limited by shorter one of the source width or the drain width. The source width is the peripheral length of the source electrode contact region SC1. The drain width is the peripheral length of the drain electrode contact region DC1. However, the source width may be calculated by subtracting, from the peripheral length of the source electrode contact region SC1, the length of its region which does not face the drain electrode contact region DC1. Similarly, the drain width may be calculated by subtracting, from the peripheral length of the drain electrode contact region DC1, the length of its region which does not face the source electrode contact region SC1.

3-4. Protruding Portions of Insulating Layer

As shown in FIG. 5, the second semiconductor layer 120 is in contact with the insulating layer IL1 around the protruding portions IL1a of the insulating layer IL1. As shown in FIG. 8, the second semiconductor layer 120 is in contact with the polyimide layer PI1 at locations other than those around the protruding portions IL1a of the insulating layer IL1. The polyimide layer PI1 is suitable for formation of a film thicker than the insulating layer IL1. Therefore, the polyimide layer PI1 insulates a larger number of regions around the semiconductor layers.

As shown in FIG. 5, in a region directly underneath the gate wiring electrode G1w, the insulating layer IL1 insulates the semiconductor layers and the materials therearound. As shown in FIG. 8, in a region other than the region directly underneath the gate wiring electrode G1w, the polyimide layer PI1 insulates the semiconductor layers and the materials therearound.

Here, it is assumed that the insulating layer IL1 insulates the semiconductor layers and the materials therearound in the region other than the region directly underneath the gate wiring electrode G1w. A high potential is applied to the drain electrode contact region DC1. Therefore, there is a possibility that leakage current flows from the drain electrode contact region DC1 to the source electrode contact region SC1 or the gate electrode contact region GC1 through the surface of the insulating layer IL1. In the present embodiment, since the polyimide layer PI1 insulates the semiconductor layers and the materials therearound in the region other than the region directly underneath the gate wiring electrode G1w, leakage current through the surface of the insulating layer IL1 is suppressed.

As shown in FIG. 5, at the positions of the protruding portions IL1a, the first semiconductor layer 110, the second semiconductor layer 120, the third semiconductor layer 130, the fourth semiconductor layer 140, the insulating layer IL1, and the gate wiring electrode G1$w$ are stacked in this order from the side where the sapphire substrate Sub is present. If the insulating layer IL1 is formed of an oxide, this layered structure forms a MOS structure. The gate voltage necessary for depleting the polarization super junction region PSJ1 differs between the locations of the protruding portions IL1$a$ and the location where the gate contact electrode G1$c$ is in direct contact with the fourth semiconductor layer 140.

In the semiconductor element 100 of the first embodiment, the locations where the second semiconductor layer 120 is in contact with the insulating layer IL1 are limited to locations around the protruding portions IL1$a$. Furthermore, a region formed by projecting the gate electrode contact region GC1 on the second semiconductor layer 120 surrounds the circumference of the source electrode contact region SC1. Therefore, leakage current is suppressed.

3-5. First Intermediate Layer and Second Intermediate Layer

The material of the first intermediate layer 150 and the second intermediate layer 160 is AlN. AlN is an insulating material. However, since the first intermediate layer 150 and the second intermediate layer 160 are sufficiently thin, because of the tunnel effect, carriers can move through the first intermediate layer 150 and the second intermediate layer 160 in the thickness direction.

3-6. Thin First Intermediate Layer and Second Intermediate Layer (Sheet Carrier Concentration)

The first intermediate layer 150 and the second intermediate layer 160 sandwich the second semiconductor layer 120 from opposite sides in a state in which they are in contact with the second semiconductor layer 120. In this manner, thin layers having large band gaps are disposed on the opposite sides of the second semiconductor layer 120. Therefore, as shown in FIG. 15A, the sheet carrier concentration at the interface between the first semiconductor layer 110 and the first intermediate layer 150 is sufficiently high, and the sheet carrier concentration at the interface between the first intermediate layer 150 and the second semiconductor layer 120 is low. Similarly, the sheet carrier concentration at the interface between the third semiconductor layer 130 and the second intermediate layer 160 is sufficiently high, and the sheet carrier concentration at the interface between the second intermediate layer 160 and the second semiconductor layer 120 is low.

The sheet carrier concentration at the interface between the first intermediate layer 150 and the second semiconductor layer 120 is $2\times10^{13}$ cm$^{-2}$ or lower. The sheet carrier concentration at the interface between the second intermediate layer 160 and the second semiconductor layer 120 is $2\times10^{13}$ cm$^{-2}$ or lower.

Figure 17:
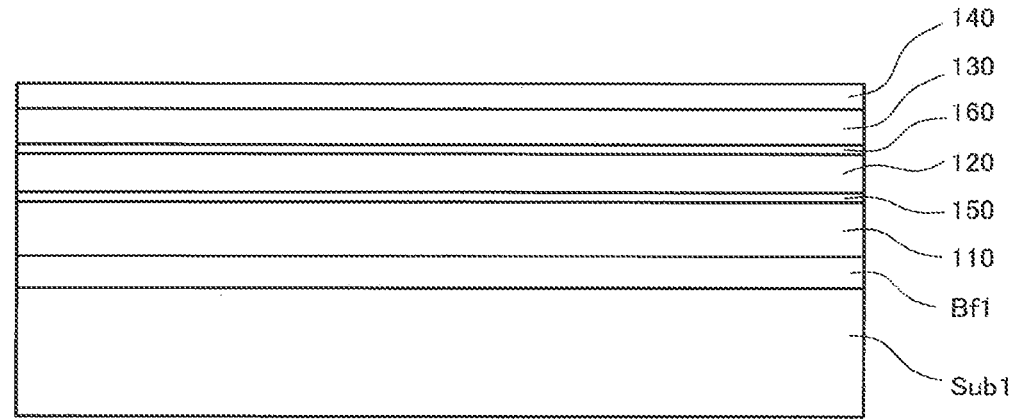
FIG. 17 is a view (first view) for describing a method for manufacturing the semiconductor element of the first embodiment.

4. Method of Manufacturing Semiconductor Element 4-1. Semiconductor Layer Forming Step As shown in FIG. 17, the buffer layer Bf1, the first semiconductor layer 110, the first intermediate layer 150, the second semiconductor layer 120, the second intermediate layer 160, the third semiconductor layer 130, and the fourth semiconductor layer 140 are grown in this order on the sapphire substrate Sub1. For such a process, for example, an MOCVD method may be used. Alternatively, any of other vapor growth methods, liquid phase growth methods, etc. may be used.

4-2. Recess Forming Step

Figure 18:
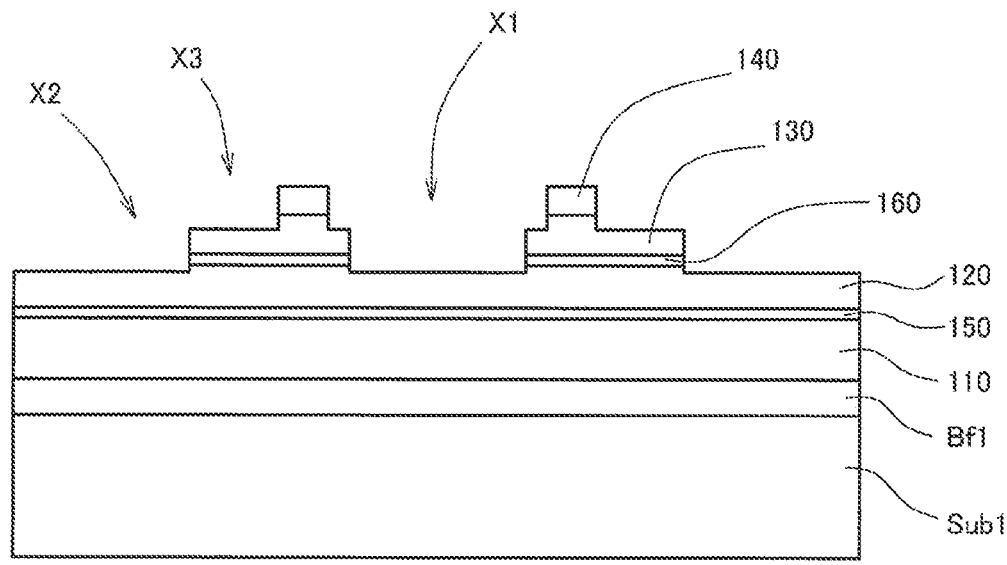
FIG. 18 is a view (second view) for describing the method for manufacturing the semiconductor element of the first embodiment.

As shown in FIG. 18, the recesses X1, X2, and X3 are formed. For such a process, dry etching such as ICP may be used. Etching gas is, for example, chlorine-based gas such as Cl$_2$, BCl$_3$, SiCF$_4$, or the like. At the time of dry etching, photoresist or the like may be used. The recess X1 is a region where the source electrode S1 is formed. The recess X2 is a region where the drain electrode D1 is formed. The recess X3 is a region which becomes the polarization super junction region PSJ1.

The second semiconductor layer 120 is exposed at the bottoms of the recess X1 and the recess X2. The third semiconductor layer 130 is exposed at the bottom of the recess X3. Therefore, after etching is first performed until the third semiconductor layer 130 is exposed, only the regions where the recesses X1 and X2 are formed may be etched again, whereby the second semiconductor layer 120 is exposed. Alternatively, separate two steps may be performed. Although the depths of the recesses X1 and X2 are similar to each other, the recesses X1 and X2 are not connected to each other. The recess X1 has a rod-like shape, and the recess X2 has a comb-like shape.

Also, in a region outside the element functional region FR1, the grooves U1 and U2 are formed to expose the first semiconductor layer 110. As a result, no current path is formed in regions other than the regions where the source electrode contact region SC1, the drain electrode contact region DC1, the gate electrode contact region GC1, and the polarization super junction region PSJ1 are present. Namely, the active region of the semiconductor element 100 is limited.

4-3. Insulating Layer Forming Step

The insulating layer IL1 is formed on the grooves U1 and U2 of the first semiconductor layer 110. For such a process, for example, a CVD method may be used.

4-4. Electrode Forming Step

Figure 19:
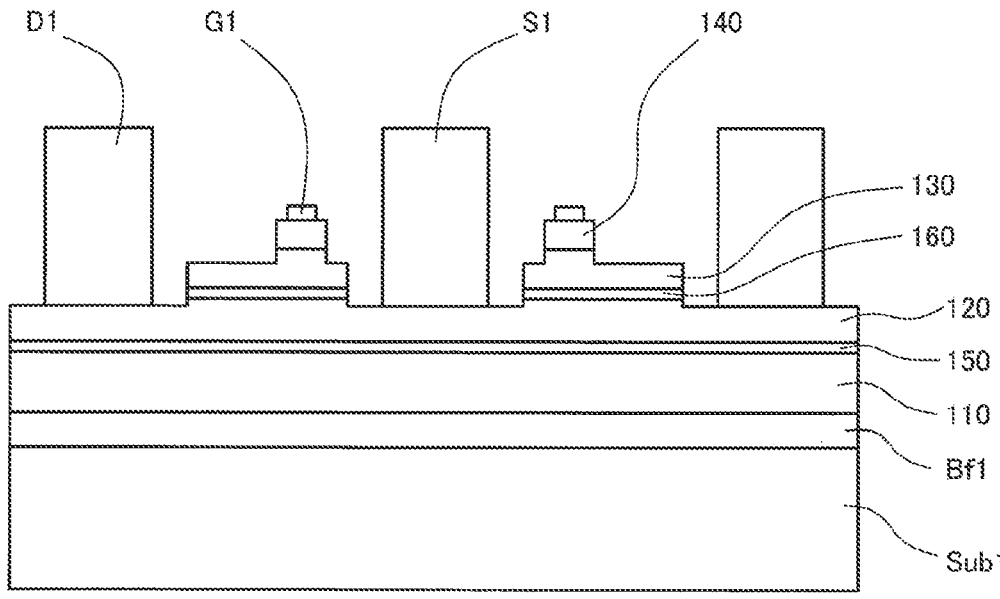
FIG. 19 is a view (third view) for describing the method for manufacturing the semiconductor element of the first embodiment.

As shown in FIG. 19, the source electrode S1, the drain electrode D1, and the gate electrode G1 are formed. Since the source electrode S1 and the drain electrode D1 have the same layered structure, the source electrode S1 and the drain electrode D1 may be formed in the same step. Since the layered structure of the gate electrode G1 differs from those of the source electrode S1 and the drain electrode D1, the gate electrode G1 is formed in a different step. For formation of these electrodes, any of film forming techniques such as sputtering, an ALD method, and an EB deposition method may be used. As a result of this step, the insulating layer IL1 is disposed between the first semiconductor layer 110 and the source electrode S1, the drain electrode D1, and the gate electrode G1.

4-5. Protecting Layer Forming Step

Next, the exposed surfaces of the semiconductor layers are covered with polyimide. Polyamic acid, which is the precursor of polyimide, is applied to the exposed portions of the semiconductors. After that, the wafer is heated at a temperature of 250° C. to 500° C., thereby forming the polyimide layer PI1.

4-6. Element Separation Step

Subsequently, the semiconductor elements 100 are cut from the wafer, whereby the semiconductor elements 100, which are independent of one another, are manufactured.

4-7. Other Steps

Other steps such as a step of forming wiring electrodes or pad electrodes and a heat treatment step may be performed appropriately. Through the above-described steps, the semiconductor elements 100 are obtained.

5. Effects of First Embodiment 5-1. Source Electrode Contact Region and Drain Electrode Contact Region The source electrode contact region SC1 has a rod-like shape. The drain electrode contact region DC1 has a comb-like shape. The rod-like shape of the source electrode contact region SC1 is disposed between the tooth-shaped portions of the drain electrode contact region DC1. The paths formed by the outer circumferential portion of the source electrode contact region SC1 and the outer circumferential portion of the drain electrode contact region DC1 are long. Current flows through the semiconductor layer in the region sandwiched between the source electrode contact region SC1 and the drain electrode contact region DC1. Therefore, the semiconductor element 100 allows flow of large current therethrough.

5-2. Gate Electrode Contact Region

In the semiconductor element 100, the region obtained by projecting the gate electrode contact region GC1, where the gate electrode G1 is in contact with the fourth semiconductor layer 140, on the second semiconductor layer 120 surrounds, in a non-contact manner, the region obtained by projecting the source electrode contact region SC1, where the source electrode S1 is in contact with the second semiconductor layer 120, on the second semiconductor layer 120. Therefore, the gate electrode contact region GC1 is certainly present between the source electrode contact region SC1 and the drain electrode contact region DC1 where the drain electrode D1 is in contact with the second semiconductor layer 120. Accordingly, the semiconductor element 100 can suppress leakage current at the time when the semiconductor element 100 is off.

5-3. Polarization Super Junction Region

The semiconductor element 100 has the polarization super junction region PSJ1. Since the polarization super junction region PSJ1 is present, the depleted region can be made large. Therefore, the semiconductor element 100 has high breakdown voltage.

5-4. Gate Length

The semiconductor element 100 has a relatively large gate length Lg. Since the gate length Lg is relatively large, the depleted region can be made large.

6. Modifications 6-1. Devices

The technique of the first embodiment can be applied to devices each including the semiconductor element 100. Examples of such devices include packages, modules, transmitters, communication devices, and power transmission devices.

6-2. Material of First Intermediate Layer and Second Intermediate Layer

In the first embodiment, the material of the first intermediate layer 150 and the second intermediate layer 160 is AlN. The material of the first intermediate layer 150 and the second intermediate layer 160 may be another group-III nitride layer. The group-III nitride layer contains AlN (insulating material) and a group-III nitride semiconductor (BAlInGaN). However, the band gaps of the first intermediate layer 150 and the second intermediate layer 160 are larger than the band gap of the second semiconductor layer 120. Therefore, it is preferred that the first intermediate layer 150 and the second intermediate layer 160 contain Al. The Al composition ratios of the first intermediate layer 150 and the second intermediate layer 160 in this case are greater than the Al composition ratio of the second semiconductor layer 120. For example, the Al composition ratios of the first intermediate layer 150 and the second intermediate layer 160 are 0.5 or greater, preferably 0.7 or greater, more preferably 0.8 or greater, further preferably 0.9 or greater. Notably, the first intermediate layer 150 and the second intermediate layer 160 are undoped layers.

Figure 20:
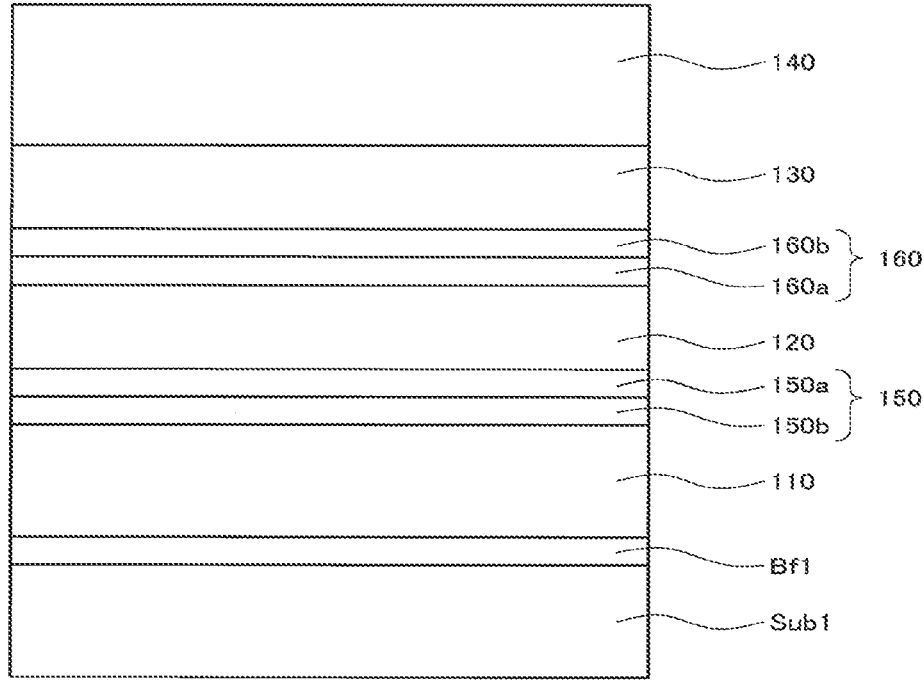
FIG. 20 is a schematic configurational diagram showing the layered structure of the semiconductor element 100 in a modification of the first embodiment.

6-3. Layered Structures of First Intermediate Layer and Second Intermediate Layer FIG. 20 is a schematic configurational diagram showing the layered structure of the semiconductor element 100 in a modification of the first embodiment. The first intermediate layer 150 has a first layer 150a and a second layer 150b. The second intermediate layer 160 has a first layer 160a and a second layer 160b. As shown in FIG. 20, the first semiconductor layer 110, the second layer 150b, the first layer 150a, the second semiconductor layer 120, the first layer 160a, the second layer 160b, the third semiconductor layer 130, and the fourth semiconductor layer 140 are stacked in this order from the side where the substrate Sub1 is present.

The first layer 150a of the first intermediate layer 150 and the first layer 160a of the second intermediate layer 160 are in contact with the second semiconductor layer 120. The second layer 150b of the first intermediate layer 150 is in contact with the first semiconductor layer 110. The second layer 160b of the second intermediate layer 160 is in contact with the third semiconductor layer 130.

The Al composition ratio of the first layer 150a of the first intermediate layer 150 is smaller than the Al composition ratio of the second layer 150b of the first intermediate layer 150. Namely, the band gap of the first layer 150a of the first intermediate layer is smaller than the band gap of the second layer 150b of the first intermediate layer 150.

The Al composition ratio of the first layer 160a of the second intermediate layer 160 is smaller than the Al composition ratio of the second layer 160b of the second intermediate layer 160. Namely, the band gap of the first layer 160a of the second intermediate layer is smaller than the band gap of the second layer 160b of the second intermediate layer 160.

In this case as well, the sheet carrier concentration can be increased.

6-4. Compositional Modulation of First Intermediate Layer and Second Intermediate Layer The Al composition ratio of the first intermediate layer 150 may be increased from the side where the second semiconductor layer 120 is present toward the side where the first semiconductor layer 110 is present. In such a case, the Al composition ratio of the second intermediate layer 160 is increased from the side where the second semiconductor layer 120 is present toward the side where the third semiconductor layer 130 is present.

The Al composition ratio may be changed reversely to the above-described change. Namely, The Al composition ratio of the first intermediate layer 150 is decreased from the side where the second semiconductor layer 120 is present toward the side where the first semiconductor layer 110 is present. In such a case, the Al composition ratio of the second intermediate layer 160 is decreased from the side where the second semiconductor layer 120 is present toward the side where the third semiconductor layer 130 is present.

In this case as well, the sheet carrier concentration can be increased.

6-5. Second Two-Dimensional Electron Gas and Second Two-Dimensional Hole Gas

Figure 21:
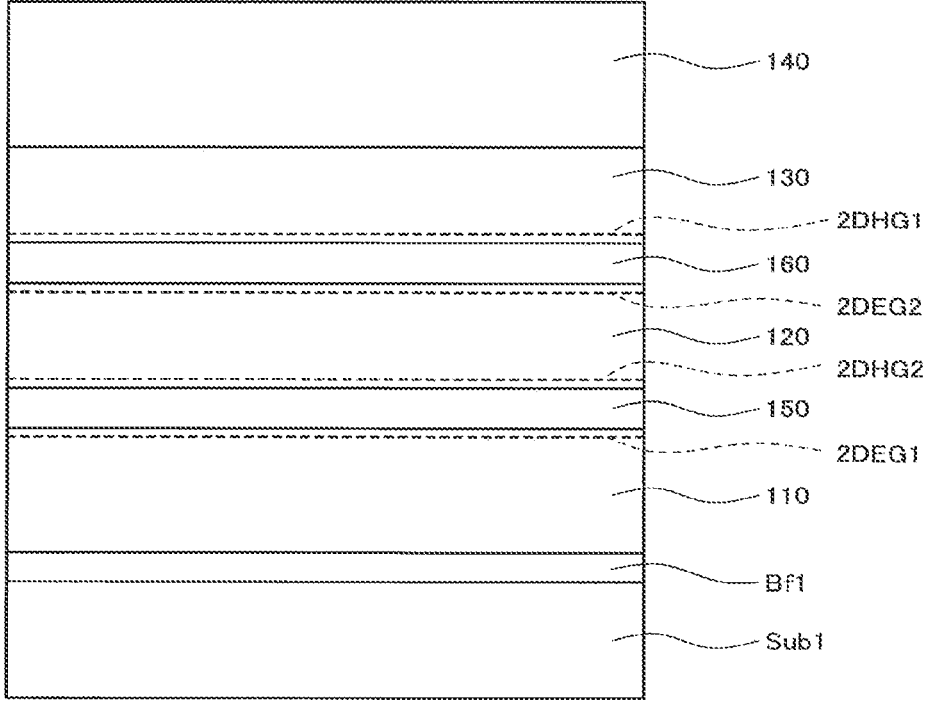
FIG. 21 is a schematic configurational diagram showing a two-dimensional electron gas and a two-dimensional hole gas in the semiconductor element 100 in a modification of the first embodiment.

FIG. 21 is a schematic configurational diagram showing a two-dimensional electron gas and a two-dimensional hole gas in the semiconductor element 100 in a modification of the first embodiment. FIG. 15B shows the band diagram indicating electrons and holes existing levels in the structure of FIG. 21.

As shown in FIGS. 21 and 15B, two two-dimensional electron gases and two two-dimensional hole gases are generated. This phenomenon occurs in the case where the first intermediate layer 150 and the second intermediate layer 160 are formed of AlN and the thicknesses of the first intermediate layer 150 and the second intermediate layer 160 are set to 5 nm or greater. Notably, the first semiconductor layer 110 and the third semiconductor layer 130 are GaN layers.

The first semiconductor layer 110 has a first two-dimensional electron gas 2DEG1 on the side toward the first intermediate layer 150. The third semiconductor layer 130 has a first two-dimensional hole gas 2DHG1 on the side toward the second intermediate layer 160. The second semiconductor layer 120 has a second two-dimensional hole gas 2DHG2 on the side toward the first intermediate layer 150 and a second two-dimensional electron gas 2DEG2 on the side toward the second intermediate layer 160.

Notably, the carrier concentration of the second two-dimensional hole gas 2DHG2 is smaller than the carrier concentration of the first two-dimensional hole gas 2DHG1. The carrier concentration of the second two-dimensional electron gas 2DEG2 is smaller than the carrier concentration of the first two-dimensional electron gas 2DEG1.

6-6. Semiconductor Layers

In the first embodiment, the second semiconductor layer 120 is formed of AlGaN. The second semiconductor layer 120 may be formed of $Al_X In_Y Ga_{(1-X-Y)} N(X>0)$. The first semiconductor layer 110 and the third semiconductor layer 130 may be formed of $Al_X In_Y Ga_{(1-X-Y)} N(X \geq 0)$. However, the band gaps of the first semiconductor layer 110 and the third semiconductor layer 130 are smaller than the band gap of the second semiconductor layer 120. Also, the compositions of the first semiconductor layer 110 and the third semiconductor layer 130 may differ from each other.

6-7. Source Electrode Contact Region and Drain Electrode Contact Region

In the first embodiment, the source electrode contact region SC1 has a rod-like shape, and the drain electrode contact region DC1 has a comb-like shape. Alternatively, the source electrode contact region SC1 may have a comb-like shape, and the drain electrode contact region DC1 may have a rod-like shape.

Accordingly, one of the source electrode contact region SC1 and the drain electrode contact region DC1 has a rod-like shape. The other of the source electrode contact region SC1 and the drain electrode contact region DC1 has a comb-like shape. The rod-like shape of one of the source electrode contact region SC1 and the drain electrode contact region DC1 is disposed between tooth-like portions of the comb-like shape of the other of the source electrode contact region SC1 and the drain electrode contact region DC1.

6-8. Shapes of Electrode Contact Regions

The end portions of the rod-like shape of the source electrode contact region SC1 have a circular arc shape. However, the shape of the end portions is not limited to the circular arc. The end portions of the rod-like shape are arcuate portions having an arc shape. A portion of the rod-like shape other than the end portions is a straight rod-shaped portion.

6-9. Source Contact Electrode and Drain Contract Electrode

The source contact electrode S1c and the drain contract electrode D1c are in direct contact with the second semiconductor layer 120. This is because the recesses X1 and X2 reach a midway point of the second semiconductor layer 120. However, the source contact electrode S1c and the drain contract electrode D1c are not required to be in direct contact with the second semiconductor layer 120 so long as the bottoms of the recesses X1 and X2 are sufficiently close to the second semiconductor layer 120. In this case, the recesses X1 and X2 reach a midway point of the third semiconductor layer 130. Furthermore, the source contact electrode S1c and the drain contract electrode D1c are in contact with very thin portions of the third semiconductor layer 130. The very thin portions of the third semiconductor layer 130 have a thickness of, for example, 10 nm or less. In this case, the third semiconductor layer 130 is thin at the locations of the recesses X1 and X2 and is thicker at locations other than the locations of the recesses X1 and X2. In this case as well, the semiconductor element enables a sufficiently large current to flow between the source and the drain.

Accordingly, the source electrode S1 and the drain electrode D1 are formed on the second semiconductor layer 120 or the third semiconductor layer 130. The source electrode contact region SC1 is a region where the source electrode S1 is in contact with the second semiconductor layer 120 or the third semiconductor layer 130. The drain electrode contact region DC1 is a region where the drain electrode D1 is in contact with the second semiconductor layer 120 or the third semiconductor layer 130.

6-10. Gate Electrode Contact Region

The gate electrode contact region GC1 may surround the drain electrode contact region DC1. In this case as well, the off-time leakage current is suppressed. In this case, a region obtained by projecting the gate electrode contact region GC1 on the second semiconductor layer 120 surrounds the circumference of a region obtained by projecting the source electrode contact region SC1 or the drain electrode contact region DC1 on the second semiconductor layer 120.

6-11. Wiring Electrodes

The positional relation between the source electrode S1 and the drain electrode D1 may be reversed. In this case, one of a region obtained by projecting the source wiring electrode S1w on the second semiconductor layer 120 and a region obtained by projecting the drain wiring electrode D1w on the second semiconductor layer 120 partially overlaps with a region obtained by projecting the gate wiring electrode G1w on the second semiconductor layer 120, and the other of the region obtained by projecting the source wiring electrode S1w on the second semiconductor layer 120 and the region obtained by projecting the drain wiring electrode D1w on the second semiconductor layer 120 does not overlap with the region obtained by projecting the gate wiring electrode G1w on the second semiconductor layer 120

Also, at a location where the one of the region obtained by projecting the source wiring electrode S1w on the second semiconductor layer 120 and the region obtained by projecting the drain wiring electrode D1w on the second semiconductor layer 120 partially overlaps with the region obtained by projecting the gate wiring electrode G1w on the second semiconductor layer 120, the distance between the source wiring electrode S1w or the drain wiring electrode D1w and the first semiconductor layer 110 is greater than the distance between the gate wiring electrode G1w and the first semiconductor layer 110.

6-12. Protecting Film

The protecting film for protecting the semiconductor layers may be an insulating layer other than the insulating layer formed of polyimide. The insulating layer preferably includes at least one of inorganic dielectric film and organic dielectric film. For example, the insulating layer includes one or more selected from $SiO_2$, $Si_X N_Y$, SiON, $Al_2 O_3$, AlN, AlON, $ZrO_2$, ZrN, ZrON, $Ta_2 O_3$, TaN, TaON, $HfO_2$, $HfN_2$, HfON, $TiO_2$, TiN, TiON, and polyimide.

6-13. Combinations

The above-described modifications may be combined freely.

Second Embodiment

A second embodiment will be described.

1. Semiconductor Element

Figure 22:
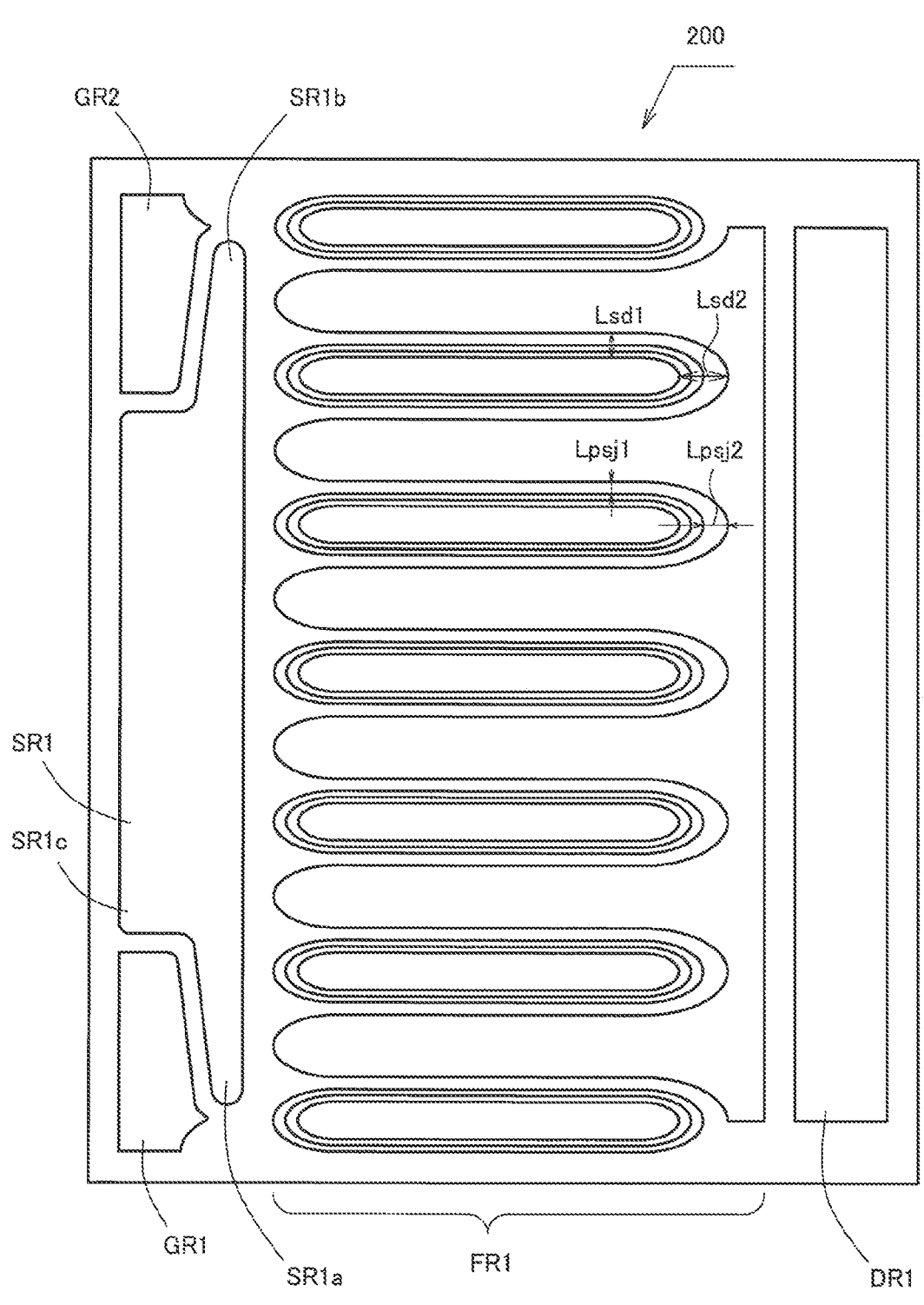
FIG. 22 is a top view of a semiconductor element of a second embodiment.

FIG. 22 is a top view of a semiconductor element 200 of the second embodiment. The source electrode contact region SC1 where the source electrode S1 is in contact with the second semiconductor layer 120 has a rod-like shape. The drain electrode contact region DC1 where the drain electrode D1 is in contact with the second semiconductor layer 120 has a comb-like shape. The rod-like shape of the source electrode contact region SC1 is disposed between tooth-like portions of the comb-shaped drain electrode contact region DC1.

In the semiconductor element 200, the distance Lpsj2 is equal to or greater than the distance Lpsj1. The distance Lpsj1 is the polarization super junction length at the rod-shaped portion (portion other than the end portions) of the source electrode contact region SC1. The distance Lpsj2 is the polarization super junction length at the end portion of the source electrode contact region SC1.

As described above, the length of the polarization super junction region PSJ2 at the end portion of the rod-like shape, the length being measured in the direction of shortest distance from the source electrode contact region SC1 to the drain electrode contact region DC1, is equal to or greater than the length of the polarization super junction region PSJ1 at a portion of the rod-like shape other than the end portions, the length being measured in the direction of shortest distance from the source electrode contact region SC1 to the drain electrode contact region DC1.

The ratio of the length of the polarization super junction region PSJ2 (at the end portion of the rod-like shape, the length being measured in the direction of shortest distance from the source electrode contact region SC1 to the drain electrode contact region DC1) to the length of the polarization super junction region PSJ1 (at a portion of the rod-like shape other than the end portions, the length being measured in the direction of shortest distance from the source electrode contact region SC1 to the drain electrode contact region DC1) is preferably 1.05 to 3.

In the semiconductor element 200, the distance Lsd2 is equal to or greater than the distance Lsd1. The distance Lsd1 is the distance between the source electrode contact region SC1 and the drain electrode contact region DC1 at the rod-shaped portion (portion other than the end portions) of the source electrode contact region SC1. The distance Lsd2 is the distance between the source electrode contact region SC1 and the drain electrode contact region DC1 at the end portion of the source electrode contact region SC1.

Namely, the distance between the source electrode contact region SC1 and the drain electrode contact region DC1 at the end portion of the rod-like shape is equal to or greater than the distance between the source electrode contact region SC1 and the drain electrode contact region DC1 at a portion of the rod-like shape other than the end portions.

The end portions of the rod-like shape are arcuate portions having an arc shape. The portion of the rod-like shape other than the end portions is a straight rod-shaped portion.

2. Effect of Second Embodiment

The electric field is likely to become strong at the end portions of the source electrode contact region SC1 of the source electrode S1 as compared with the rod-shaped portion, which is a portion other than the end portions. In the semiconductor element 200 of the second embodiment, the polarization super junction length Lpsj2 (the length of the polarization super junction region PSJ) is increased at the end portion. Also, for the same reason, the distance Lsd2 is increased. Therefore, the semiconductor element 200 has a higher breakdown voltage.

3. Modifications 3-1. Source Electrode Contact Region and Drain Electrode Contact Region The source electrode contact region SC1 may have a comb-like shape, and the drain electrode contact region DC1 may have a rod-like shape. The comb-like shape of the source electrode contact region SC1 has rod-shaped portions. In this case as well, the distance between the source electrode contact region SC1 and the drain electrode contact region DC1 at the end portion of each rod-like shape is equal to or greater than the distance between the source electrode contact region SC1 and the drain electrode contact region DC1 at a portion of the rod-like shape other than the end portions.

3-2. Arcuate Portions

The arcuate portions have, for example, a circular arc shape. However, the arcuate portions may have the shape of an arc other than circular arc.

3-3. Combinations

The above-described modifications may be combined freely.

Second Embodiment

A third embodiment will be described.

1. Semiconductor Element

Figure 23:
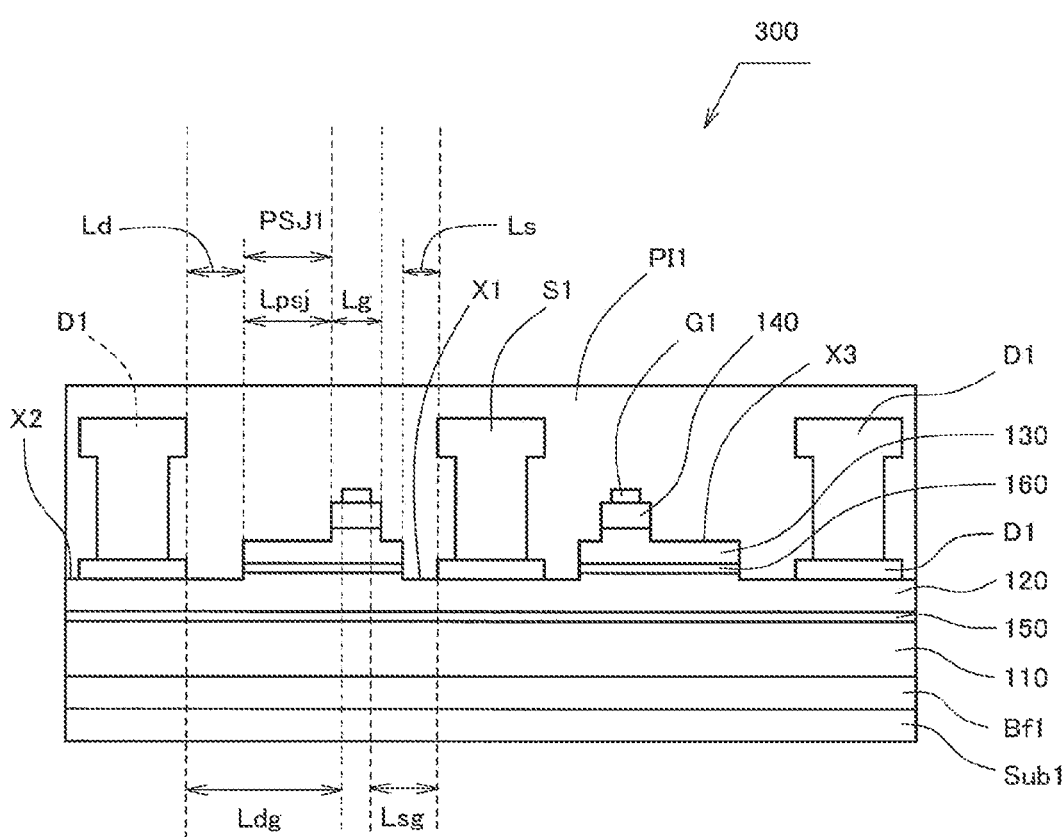
FIG. 23 is a view showing the layered structure of a semiconductor element of a third embodiment.

FIG. 23 is a view showing the layered structure of a semiconductor element 300 of the third embodiment. The source electrode S1 is formed in the recess X1. The drain electrode D1 is formed in the recess X2.

The distance Ld between the drain electrode contact region DC1 and the third semiconductor layer 130 is greater than the distance Ls between the source electrode contact region SC1 and the third semiconductor layer 130. The distance Ld between the drain electrode contact region DC1 and the third semiconductor layer 130 is, for example, 1 μm to 10 μm.

Also, in the case where the source electrode contact region SC1, the drain electrode contact region DC1, and the gate electrode contact region GC1 are projected on the second semiconductor layer 120, the distance Ldg between a region obtained by projecting the drain electrode contact region DC1 and a region obtained by projecting the gate electrode contact region GC1 is greater than the distance Lsg between a region obtained by projecting the source electrode contact region SC1 and a region obtained by projecting the gate electrode contact region GC1.

2. Effect of Third Embodiment

During operation of the semiconductor element 300, the potential difference (voltage) between the drain electrode D1 and the gate electrode G1 can become sufficiently larger than the potential difference (voltage) between the source electrode S1 and the gate electrode G1. Therefore, in the third embodiment, the distance Ldg between the drain electrode contact region DC1 and the gate electrode contact region GC1 is made sufficiently larger than the distance Lsg between the source electrode contact region SC1 and the gate electrode contact region GC1. Since a potential whose absolute value is high is applied to the drain electrode D1, the strength of electric field between the drain and the gate is greater than the strength of electric field between the source and the gate. Therefore, the distance Ldg is made sufficiently larger than the distance Lsg.

Fourth Embodiment

A fourth embodiment will be described.

Figure 24:
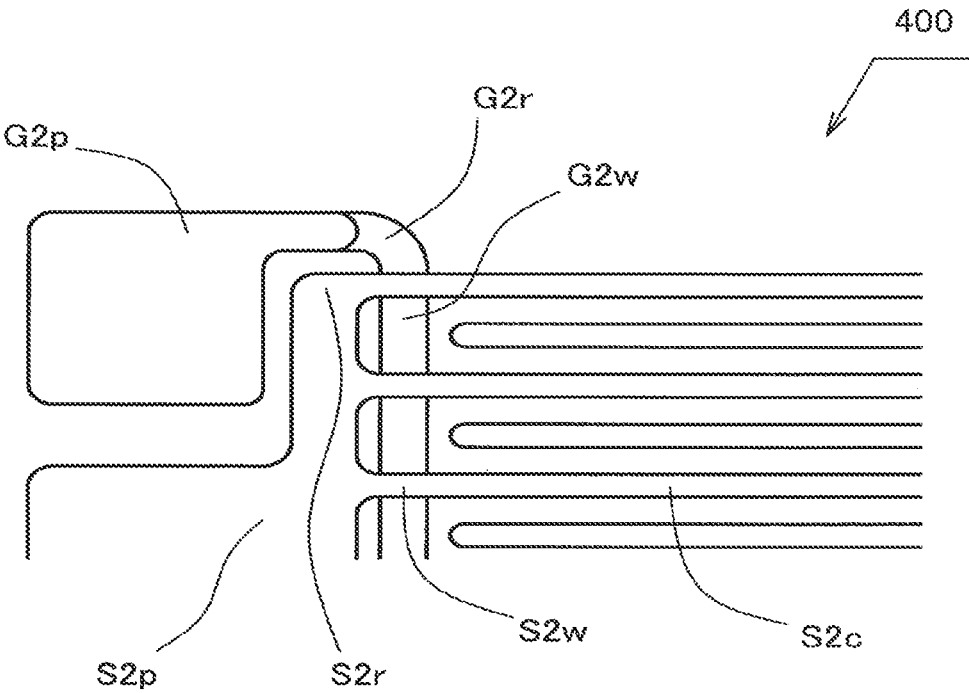
FIG. 24 is a view showing a gate pad electrode and its vicinity of a semiconductor element of a fourth embodiment.

FIG. 24 is a view showing a gate pad electrode and its vicinity of a semiconductor element 400 of the fourth embodiment.

A source electrode S2 has a source contact electrode S2$c$, a source wiring electrode S2$w$, and a source pad electrode S2$p$. The source contact electrode S2$c$ is in direct contact with the second semiconductor layer 120. The source wiring electrode S2$w$ connects the source contact electrode S2$c$ and the source pad electrode S2$p$. The source pad electrode S2$p$ is an electrode for electrical connection to an external power source.

A gate electrode G2 has a gate contact electrode G2$c$, a gate wiring electrode G2$w$, and a gate pad electrode G2$p$. The gate contact electrode G2$c$ is in direction contact with the fourth semiconductor layer 140. The gate wiring electrode G2$w$ connects the gate contact electrode G2$c$ and the gate pad electrode G2$p$. The gate pad electrode G2$p$ is an electrode for electrical connection to an external power source.

The source wiring electrode S2$w$ has a curved portion S2$r$ which is curved in an arc shape and which is provided at a location for connection with the source pad electrode S2$p$. The gate wiring electrode G2$w$ has a curved portion G2$r$ which is curved in an arc shape and which is provided at a location for connection with the gate pad electrode G2$p$.

2. Insulating Layer

Figure 25:
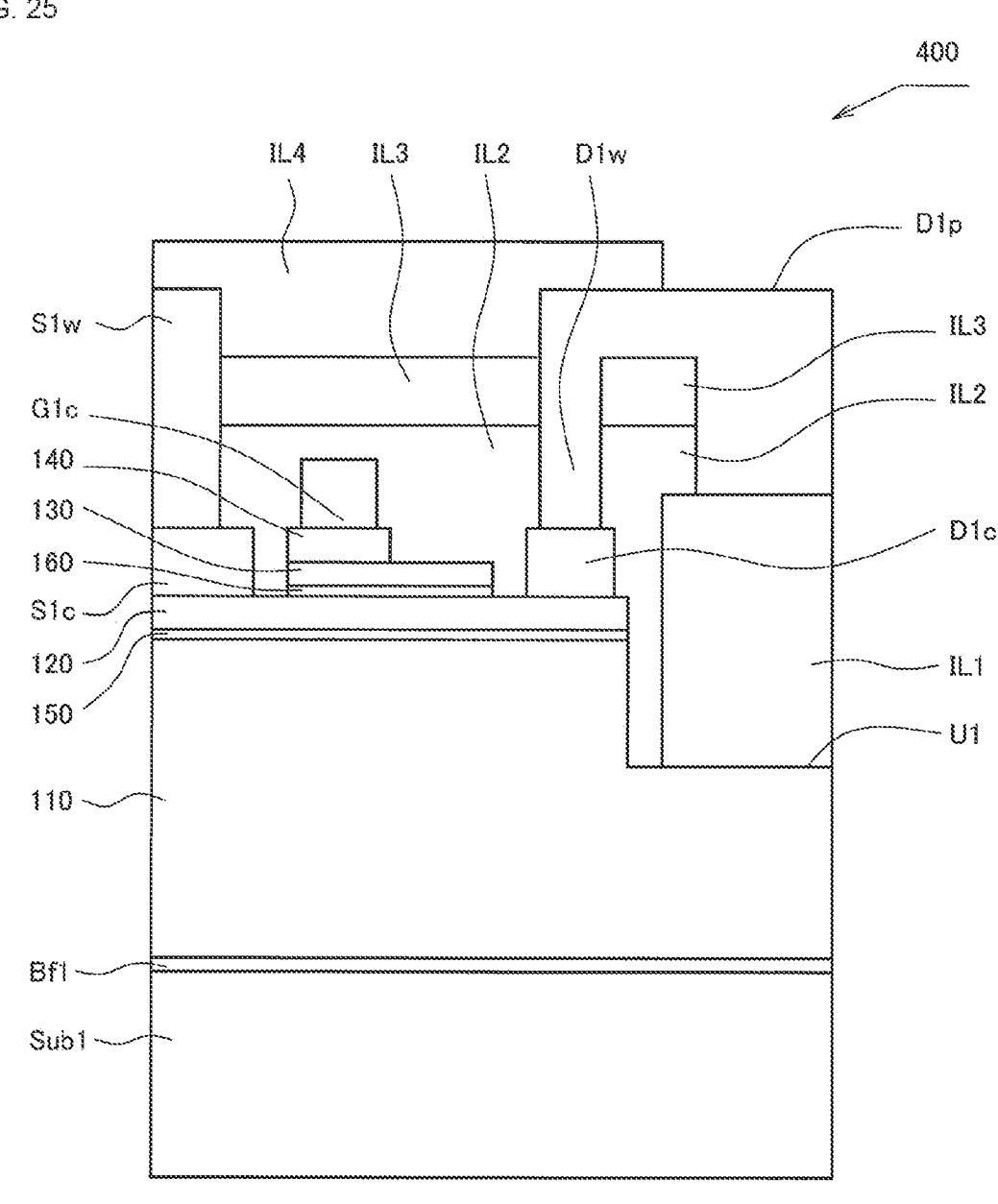
FIG. 25 is a view showing the sectional structure of a drain electrode exposed region and its vicinity of the semiconductor element of the fourth embodiment.

FIG. 25 is a view showing the sectional structure of the drain electrode exposed region and its vicinity of the semiconductor element 400 of the fourth embodiment. As shown in FIG. 25, the semiconductor element 400 has an insulating layer IL2, an insulating layer IL3, and an insulating layer IL4 in addition to the insulating layer IL1. The insulating layer IL2 is located on the insulating layer IL1. The insulating layer IL3 is located on the insulating layer IL2. The insulating layer IL4 is located on the insulating layer IL3.

The material of the insulating layer IL1 and the insulating layer IL2 is inorganic dielectric film. The inorganic dielectric film is formed of, for example, SiO2. The material of the insulating layer IL3 and the insulating layer IL4 is organic dielectric film. The organic dielectric film is formed of, for example, polyimide. It is preferred to form the organic dielectric film on a hard film formed of SiO2 or the like.

The insulating layer IL2 and the insulating layer IL3 fill the gap between the insulating layer IL1 and the second semiconductor layer 120. The insulating layer IL2 covers the side and top surfaces of the semiconductor layers. The insulating layer IL2 also covers the contact electrodes of the source electrode S1, the drain electrode D1, and the gate electrode G1. The insulating layer IL4 is the uppermost layer.

2. Effect of Fourth Embodiment

The semiconductor element 400 has a high breakdown voltage. Therefore, in use, a high voltage may be applied to the semiconductor element 400. Even in the case where a high voltage is applied, formation of strong electric fields around the curved portions S2$r$ and G2$r$ is prevented. Also, conceivably, internal stresses within the insulating layers are relaxed.

3. Modifications 3-1. Drain Electrode

It is preferred that the drain wiring electrode of the drain electrode has a curved portion which is curved in an arc shape and which is provided at a location for connection with the drain pad electrode.

3-2. Number of Pad Electrodes

Figure 26:
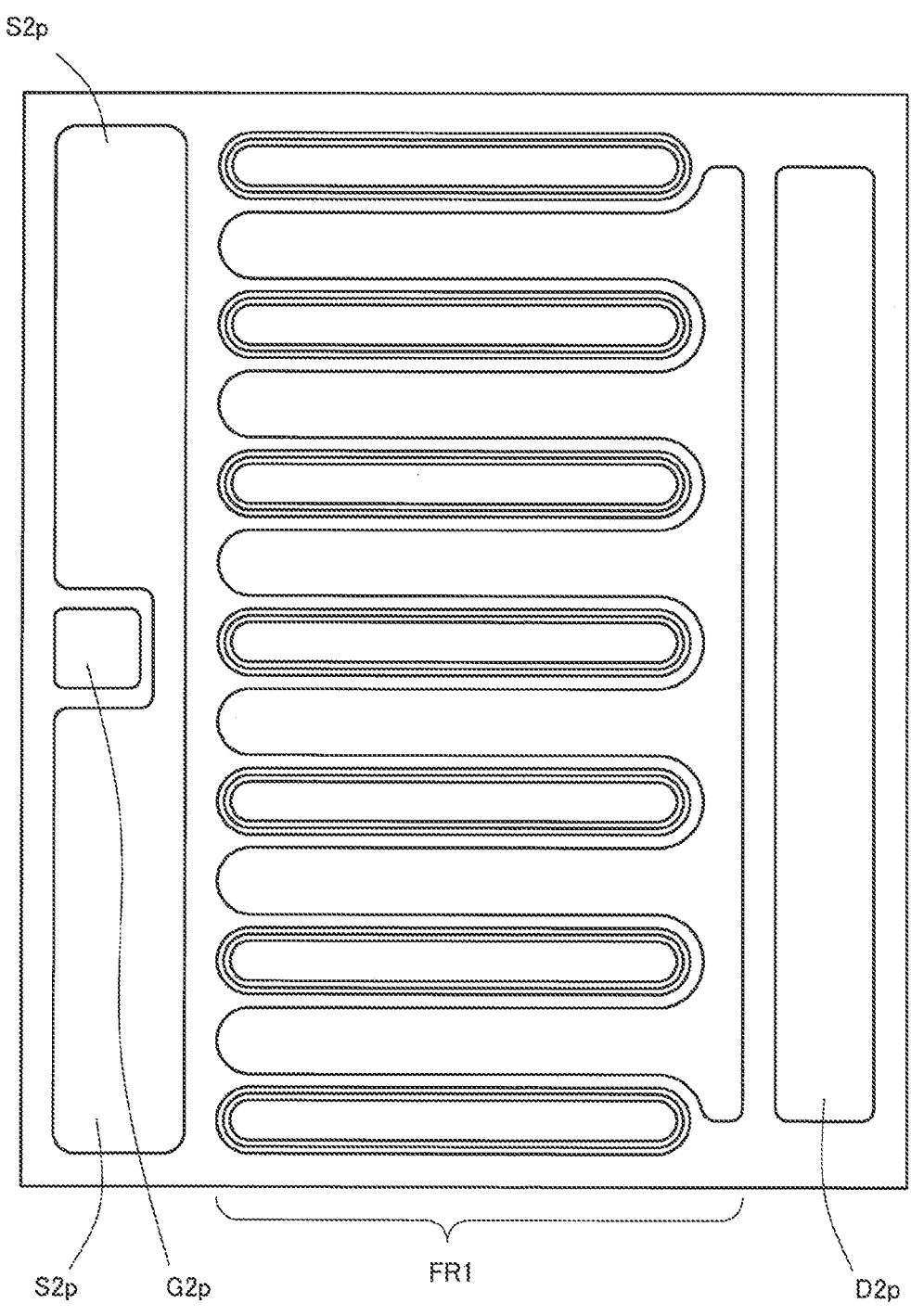
FIG. 26 is a top view of a semiconductor element in a modification of the fourth embodiment.

FIG. 26 is a top view of a semiconductor element in a modification of the fourth embodiment. As shown in FIG. 26, a gate pad electrode G2$p$ is disposed to be sandwiched between a source pad electrode S2$p$ and another source pad electrode S2$p$. Also, the semiconductor element may have a plurality of source pad electrodes S2$p$. Namely, at least one of the gate electrode G2, the source electrode S2, and the drain electrode D2 may have a plurality of pad electrodes.

Figure 27:
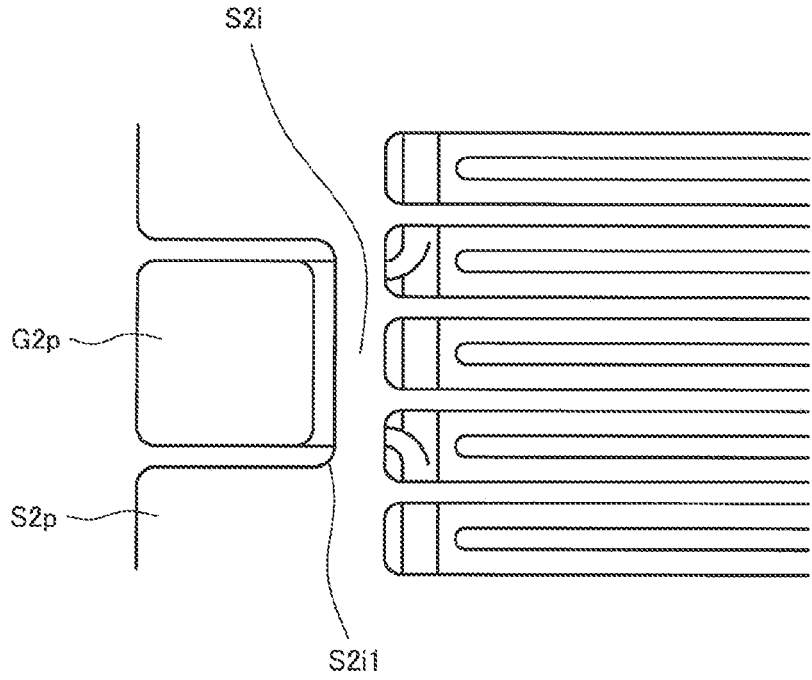
FIG. 27 is an enlarged view of a gate pad electrode and its vicinity in a semiconductor element in a modification of the fourth embodiment.

FIG. 27 is an enlarged view of a gate pad electrode and its vicinity in a semiconductor element in a modification of the fourth embodiment. As shown in FIG. 27, a connecting portion S2$i$ for connecting a source pad electrode S2$p$ and another source pad electrode S2$p$ has a curved shape S2$i$1.

3-3. Shapes of Pad Electrodes

A corner(s) of at least one of the source pad electrode S2$p$, the gate pad electrode G2$p$, and the drain pad electrode may have a curved shape.

3-4. Insulating Layers

Each insulating layer preferably includes at least one of inorganic dielectric film and organic dielectric film. For example, each insulating layer includes one or more selected from SiO2, Si$_x$N$_y$, SiON, Al2O3, AlN, AlON, ZrO2, ZrN, ZrON, Ta2O3, TaN, TaON, HfO2, HfN2, HfON, TiO2, TiN, TiON, and polyimide.

3-5. Combinations

The above-described modifications may be combined freely.

Fifth Embodiment

A fifth embodiment will be described.

1. Semiconductor Element

The basic structure of the semiconductor element is the same as the first embodiment.

The dislocation density in the second semiconductor layer 120 is, for example, $1 \times 10^6$ cm$^{-2}$ to $1 \times 10^{10}$ cm$^{-2}$. The dislocation density is preferably $5 \times 10^9$ cm$^{-2}$ or less. The dislocation density in the first semiconductor layer 110 is, for example, $1 \times 10^6$ cm$^{-2}$ to $1 \times 10^{10}$ cm$^{-2}$. The dislocation density is preferably $5 \times 10^9$ cm$^{-2}$ or less.

The contact area between the second semiconductor layer 120 and the third semiconductor layer 130 per 1 μm in the gate width direction is 10 μm$^2$ to 200 μm$^2$.

The gate length Lg is 0.1 μm to 6 μm. Also, the gate length Lg may be 0.3 μm to 5 μm. Furthermore, the gate length Lg may be 1 μm to 4 μm.

Breakdown voltage and the contact area between the second semiconductor layer 120 and the third semiconductor layer 130 satisfy the following inequality:

$$101x-810 \leq y \leq 235x+585 \tag{1}$$

where x is the contact area between the second semiconductor layer 120 and the third semiconductor layer 130 per 1 μm in the gate width direction, and y is the breakdown voltage.

2. Electrical Characteristics of Semiconductor Element

Each of rise time (tr) and fall time (tf) in 300 V switching operation of the semiconductor element of the fifth embodiment is 3 ns to 30 ns.

The breakdown voltage of the semiconductor element of the fifth embodiment is 1500 V to 20000 V. Also, the breakdown voltage of the semiconductor element may be 3000 V to 10000 V.

3. Dislocation Density

In order to reduce the dislocation density of the semiconductor layer, it is preferred to use a method for forming an AlN buffer layer by sputtering, a method for forming an uneven shape on the substrate, a method for forming a thick film having a thickness of several tens of microns or greater by VPE, or a like method.

Sixth Embodiment

A sixth embodiment will be described.

1. Semiconductor Element

The basic structure of the semiconductor element is the same as the first embodiment.

The polarization super junction length Lpsj is 1 μm to 50 μm. The polarization super junction length Lpsj may be 2 μm to 40 μm. The polarization super junction length Lpsj may be 3 μm to 30 μm.

The gate length Lg is 0.1 μm to 6 μm. Also, the gate length Lg may be 0.3 μm to 5 μm. Furthermore, the gate length Lg may be 1 μm to 4 μm.

2. Electrical Characteristics of Semiconductor Element

Each of rise time (tr) and fall time (tf) in 300 V switching operation of the semiconductor element of the sixth embodiment is 3 ns to 30 ns. The rise time (tr) and the fall time (tf) may be 4 ns to 20 ns. The rise time (tr) and the fall time (tf) may be 5 ns to 10 ns.

The normalized ON resistance of the semiconductor element of the sixth embodiment is 1 mΩ·cm² to 20 mΩ·cm². The normalized ON resistance may be 2 mΩ·cm² to 17 mΩ·cm². The normalized ON resistance may be 3 mΩ·cm² to 15 mΩ·cm².

Seventh Embodiment

A seventh embodiment will be described.

1. Semiconductor Element

The basic structure of the semiconductor element is the same as the first embodiment.

The active region area is 2.2 mm² to 100 mm². The active region area may be 2.5 mm² to 90 mm². The active region area may be 3 mm² to 80 mm².

The active region area is the area through which current flows to the first semiconductor layer 110 substantially. The active region area is obtained by subtracting, from the area of the second semiconductor layer 120 on the side toward the third semiconductor layer 130, the areas of the source electrode contact region SC1 and the drain electrode contact region DC1 and the area of a region sandwiched between the outermost source electrode contact region SC1 and an outer circumferential portion of the second semiconductor layer 120.

The gate length Lg is 0.1 μm to 6 μm. Also, the gate length Lg may be 0.3 μm to 5 μm. Furthermore, the gate length Lg may be 1 μm to 4 μm.

The gate width is 300 mm to 12000 mm. The gate width may be 350 mm to 11000 mm. The gate width may be 400 mm to 10000 mm.

The peripheral length of the semiconductor element is 13 mm to 520 mm. The peripheral length of the semiconductor element may be 15 mm to 500 mm. The peripheral length of the semiconductor element may be 20 mm to 480 mm. The peripheral length is the sum of the lengths of the four sides of the sapphire substrate Sub1 of the semiconductor element.

2. Electrical Characteristics of Semiconductor Element

Each of rise time (tr) and fall time (tf) in 300 V switching operation of the semiconductor element of the seventh embodiment is 3 ns to 30 ns.

The current value of the semiconductor element of the seventh embodiment at the time when the drain voltage Vd is 2 V is 30 A to 1200 A. The current value at the time when the drain voltage Vd is 2 V is a current value in an ON state; specifically, in a region other than a current saturated region.

Eighth Embodiment

1. Schottky Barrier Diode

Figure 28:
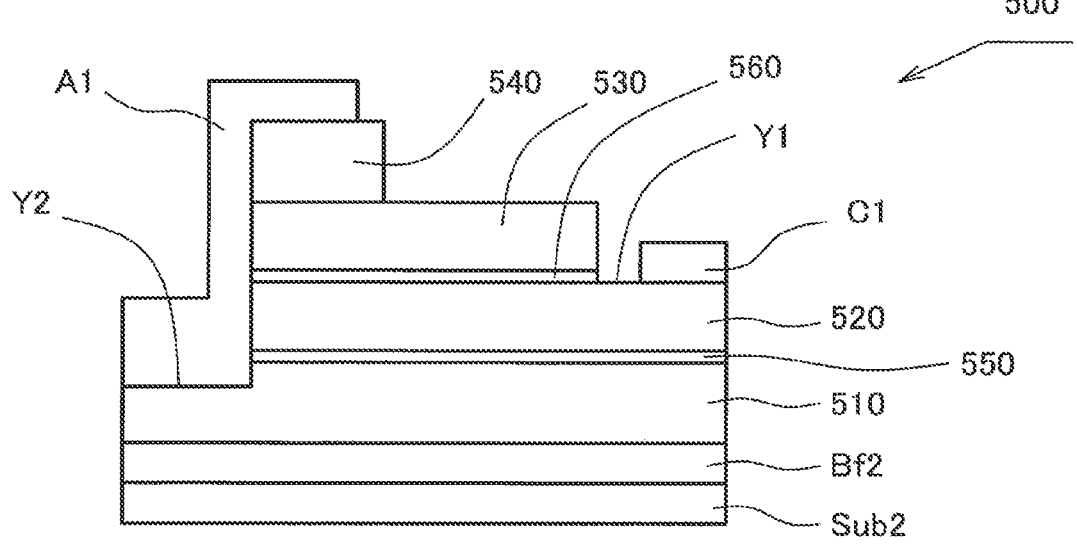
FIG. 28 is a view showing the layered structure of a semiconductor element of an eighth embodiment.

FIG. 28 is a view showing the layered structure of a semiconductor element 500 of an eighth embodiment. The semiconductor element 500 is a Schottky barrier diode. The semiconductor element 500 has a sapphire substrate Sub2, a buffer layer Bf2, a first semiconductor layer 510, a second semiconductor layer 520, a third semiconductor layer 530, a fourth semiconductor layer 540, a first intermediate layer 550, a second intermediate layer 560, a cathode electrode C1, and an anode electrode A1.

The buffer layer Bf2 is formed on the sapphire substrate Sub2. The first semiconductor layer 510 is formed on the buffer layer Bf2. The second semiconductor layer 520 is formed on the first semiconductor layer 510. The third semiconductor layer 530 is formed on the second semiconductor layer 520. The fourth semiconductor layer 540 is formed on the third semiconductor layer 530.

The first semiconductor layer 510, the second semiconductor layer 520, the third semiconductor layer 530, the fourth semiconductor layer 540, the first intermediate layer 550, and the second intermediate layer 560 are group-III nitride semiconductor layers. The band gap of the second semiconductor layer 520 is larger than the band gaps of the first semiconductor layer 510 and the third semiconductor layer 530. The band gaps of the first intermediate layer 550 and the second intermediate layer 560 are larger than the band gap of the second semiconductor layer 520. The first semiconductor layer 510, the second semiconductor layer 520, the third semiconductor layer 530, the first intermediate layer 550, and the second intermediate layer 560 are undoped semiconductor layers. The fourth semiconductor layer 540 is a p-type semiconductor layer.

The cathode electrode C1 is formed on the second semiconductor layer 520. A recess Y1 extends from the fourth semiconductor layer 540 and reaches a midway point of the second semiconductor layer 520. The cathode electrode C1 is formed in the recess Y1.

The anode electrode A1 is formed on the fourth semiconductor layer 540. A recess Y2 extends from the fourth semiconductor layer 540 and reaches a midway point of the first semiconductor layer 510. The anode electrode A1 is formed such that it extends from the bottom surface of the recess Y2 to the fourth semiconductor layer 540. Therefore, the anode electrode A1 is in contact with the first semiconductor layer 510, the second semiconductor layer 520, the third semiconductor layer 530, and the fourth semiconductor layer 540. The anode electrode A1 is in contact with the bottom and side surfaces of the first semiconductor layer 510, the side surfaces of the second semiconductor layer 520 and the third semiconductor layer 530, and the side and top surfaces of the fourth semiconductor layer 540.

Figure 29:
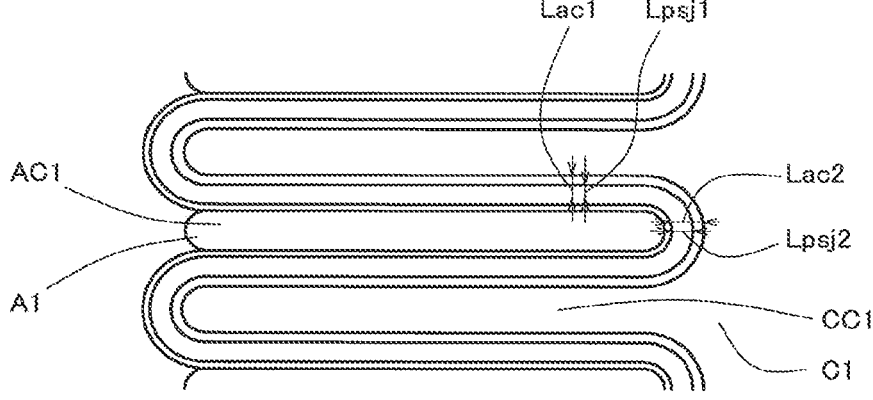
FIG. 29 is a view showing an electrode forming region of the semiconductor element of the eighth embodiment.

FIG. 29 is a view showing an electrode forming region of the semiconductor element 500 of the eighth embodiment. As shown in FIG. 29, the semiconductor element 500 has a cathode electrode contact region CC1 where the cathode electrode C1 is in contact with the second semiconductor layer 520, and an anode electrode contact region AC1 where the anode electrode A1 is in contact with the fourth semiconductor layer 540.

The cathode electrode contact region CC1 where the cathode electrode C1 is in contact with the second semiconductor layer 520 has a comb-like shape. The anode electrode contact region AC1 where the anode electrode A1 is in contact with the first semiconductor layer 510 and the fourth semiconductor layer 540 has a rod-like shape. The rod-like shape of a region obtained by projecting the anode electrode contact region AC1 on the first semiconductor layer 510 is located between tooth-shaped portions of the comb-like shape of a region obtained by projecting the cathode electrode contact region CC1 on the first semiconductor layer 510.

A polarization super junction region is a region where the third semiconductor layer 530 is formed and the fourth semiconductor layer 540 is not formed. The polarization super junction region is located between the anode electrode contact region AC1 and the cathode electrode contact region CC1.

2. Breakdown Voltage

In the present specification, the breakdown voltage of the Schottky barrier diode refers to the value of anode voltage Va at the time when anode current Ia reaches $1\times10^{-4}$ A as a result of application of the voltage Va between the anode electrode A1 and the cathode electrode C1 in the reverse direction.

3. Modifications 3-1. Shapes of Electrode Contact Regions

The cathode electrode contact region CC1 may have a rod-like shape, and the anode electrode contact region AC1 may have a comb-like shape. Namely, one of the cathode electrode contact region CC1 and the anode electrode contact region AC1 may have a comb-like shape, and the other of the cathode electrode contact region CC1 and the anode electrode contact region AC1 may have a rod-like shape.

Figure 30:
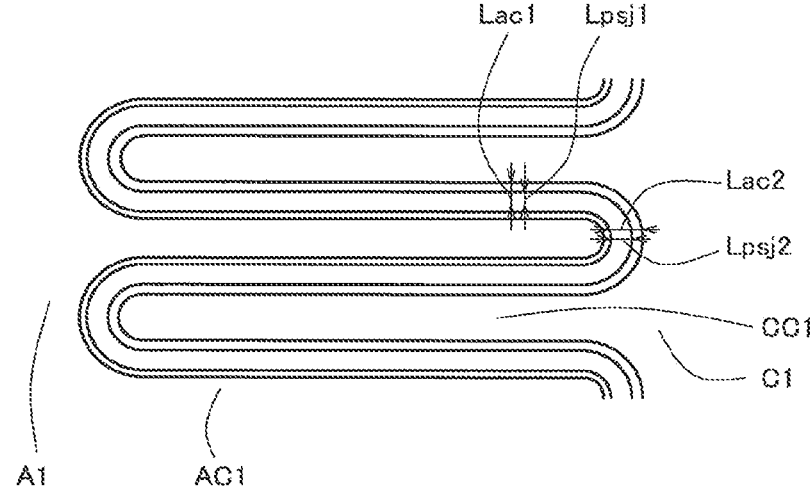
FIG. 30 is a view showing an electrode forming region of the semiconductor element in a modification of the eighth embodiment.

FIG. 30 is a view showing electrode contact regions of the semiconductor element in a modification of the eighth embodiment. The cathode electrode contact region CC1 where the cathode electrode C1 is in contact with the second semiconductor layer 520 has a comb-like shape. The anode electrode contact region AC1 where the anode electrode A1 is in contact with the first semiconductor layer 510 and the fourth semiconductor layer 540 has a comb-like shape. Tooth-shaped portions of the comb-like shape of a region obtained by projecting the cathode electrode contact region CC1 on the first semiconductor layer 510 and tooth-shaped portions of the comb-like shape of a region obtained by projecting the anode electrode contact region AC1 on the first semiconductor layer 510 are disposed alternatingly.

It is sufficient that the rod-like shape (including a rod-shaped portion at a distal end of the comb-like shape) of one of the cathode electrode contact region CC1 and the anode electrode contact region AC1 is disposed between the tooth-shaped portions of the comb-like shape of the other of the cathode electrode contact region CC1 and the anode electrode contact region AC1.

3-2. Contact Region of Anode Electrode

Figure 31:
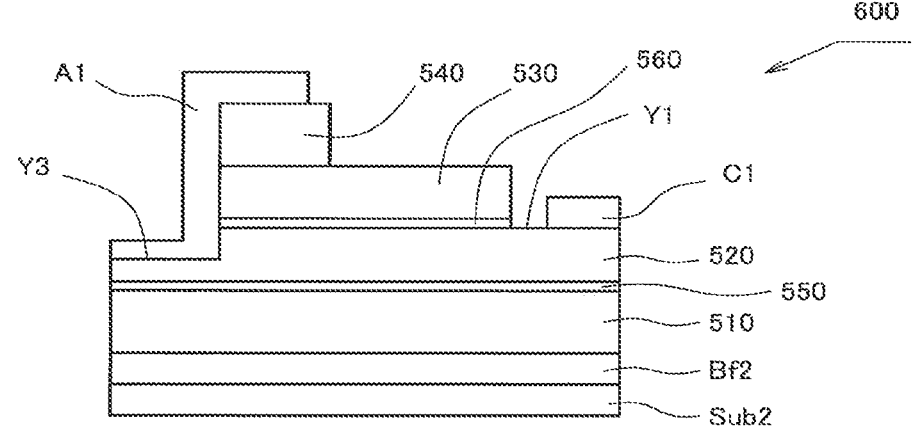
FIG. 31 is a view (first view) showing the layered structure of the semiconductor element in a modification of the eighth embodiment.

FIG. 31 is a view (first view) showing the layered structure of a semiconductor element 600 in a modification of the eighth embodiment. The semiconductor element 600 has the sapphire substrate Sub2, the buffer layer Bf2, the first semiconductor layer 510, the second semiconductor layer 520, the third semiconductor layer 530, the fourth semiconductor layer 540, the first intermediate layer 550, the second intermediate layer 560, the cathode electrode C1, and the anode electrode A1. The anode electrode A1 is formed in a recess Y3. The recess Y3 extends from the fourth semiconductor layer 540 to a midway point of the second semiconductor layer 520. In the semiconductor element 600, the anode electrode A1 is not in contact with the first semiconductor layer 510.

Figure 32:
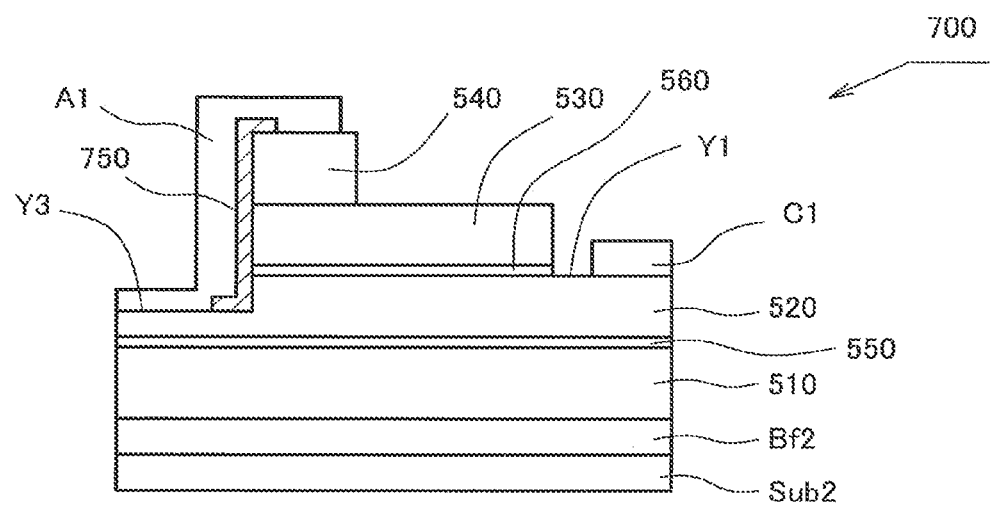
FIG. 32 is a view (second view) showing the layered structure of the semiconductor element in a modification of the eighth embodiment.

FIG. 32 is a view (second view) showing the layered structure of a semiconductor element 700 in a modification of the eighth embodiment. The semiconductor element 700 has the sapphire substrate Sub2, the buffer layer Bf2, the first semiconductor layer 510, the second semiconductor layer 520, the third semiconductor layer 530, the fourth semiconductor layer 540, the first intermediate layer 550, the second intermediate layer 560, the cathode electrode C1, the anode electrode A1, and an insulating layer 750.

The insulating layer 750 covers a portion of the second semiconductor layer 520, the side surface of the third semiconductor layer 530, and a portion of the fourth semiconductor layer 540. The insulating layer 750 is located between the anode electrode A1 and the side surfaces of the third semiconductor layer 530 and the fourth semiconductor layer 540. The anode electrode A1 is in contact with the second semiconductor layer 520 and the fourth semiconductor layer 540 and is not in contact with the third semiconductor layer 530.

As described above, it is sufficient that the anode electrode A1 is in contact with the first semiconductor layer 510 or the second semiconductor layer 520.

3-3. Contact Region of Cathode Electrode

Figure 33:
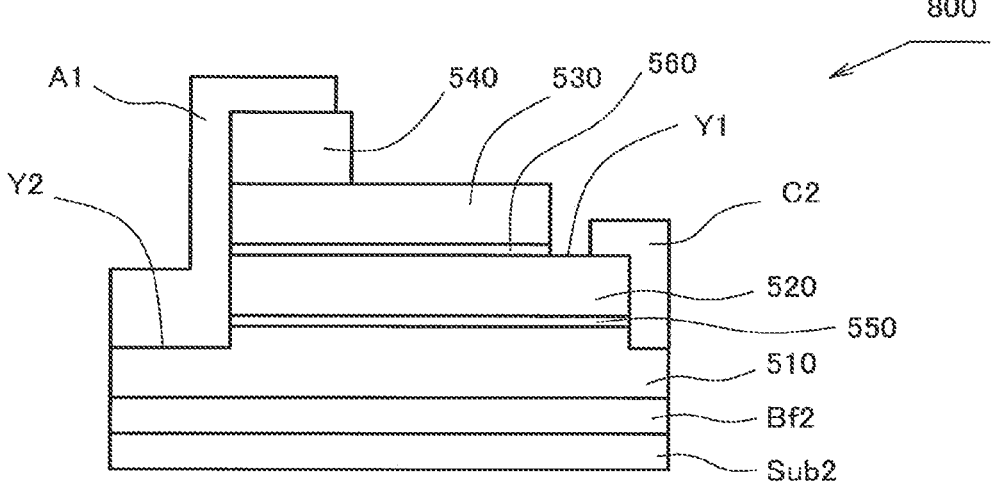
FIG. 33 is a view (third view) showing the layered structure of the semiconductor element in a modification of the eighth embodiment.

FIG. 33 is a view (third view) showing the layered structure of a semiconductor element 800 in a modification of the eighth embodiment. As shown in FIG. 33, the cathode electrode C2 is in contact with the bottom and side surfaces of the first semiconductor layer 510 and the side and top surfaces of the second semiconductor layer 520.

3-4. Polarization Super Junction Region

The length of the polarization super junction region at the end portion of the rod-like shape, the length being measured in the direction of shortest distance from the cathode electrode contact region CC1 to the anode electrode contact region AC1, is equal to or greater than the length of the polarization super junction region at a portion of the rod-like shape other than the end portions, the length being measured in the direction of shortest distance from the cathode electrode contact region CC1 to the anode electrode contact region AC1.

3-5. Distance Between Cathode Electrode and Third Semiconductor Layer

The distance between the cathode electrode contact region CC1 and the third semiconductor layer 530 is 1 μm to 10 μm.

3-6. Combinations

The above-described modifications may be combined freely.

Combination of Embodiments

The first embodiment to the eighth embodiment, including their modifications, may be combined freely in some cases.

(Simulation)

1. Layered Structure

FIG. 34 is an illustration showing the layered structure of semiconductors used in simulation. As shown in FIG. 34, a first undoped GaN layer (thickness: 800 nm), a first AlN layer, an AlGaN layer (thickness: 40 nm), a second AlN layer, and a second undoped GaN layer (65 nm) are stacked from the lower side in the drawing. The first AlN layer corresponds to the first intermediate layer 150, and the second AlN layer corresponds to the second intermediate layer 160. The Al composition ratio of the AlGaN layer is 0.27.

The band diagrams and carrier densities of the semiconductors in which the thickness of the first AlN layer and the second AlN layer was changed from 0 nm to 10 nm were calculated. Notably, the first AlN layer and the second AlN layer have the same thickness.

ATLAS, which is a product of Silvaco, was used as simulation software.

2. Results of Simulation

Figure 35:
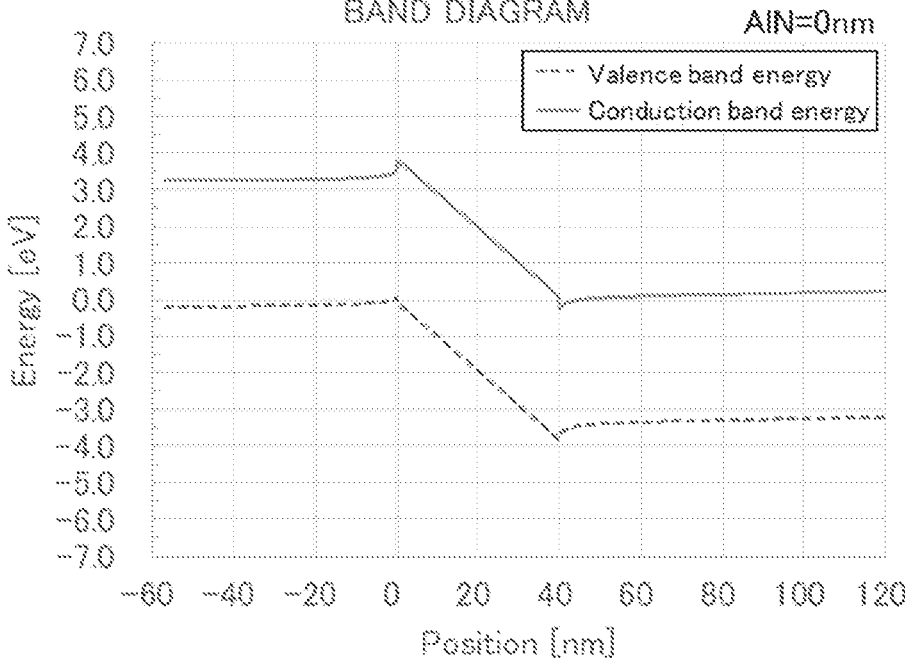
FIG. 35 is a graph showing the result of calculation performed on the band diagram for the case where the thicknesses of AlN layers are 0 nm.
Figure 36:
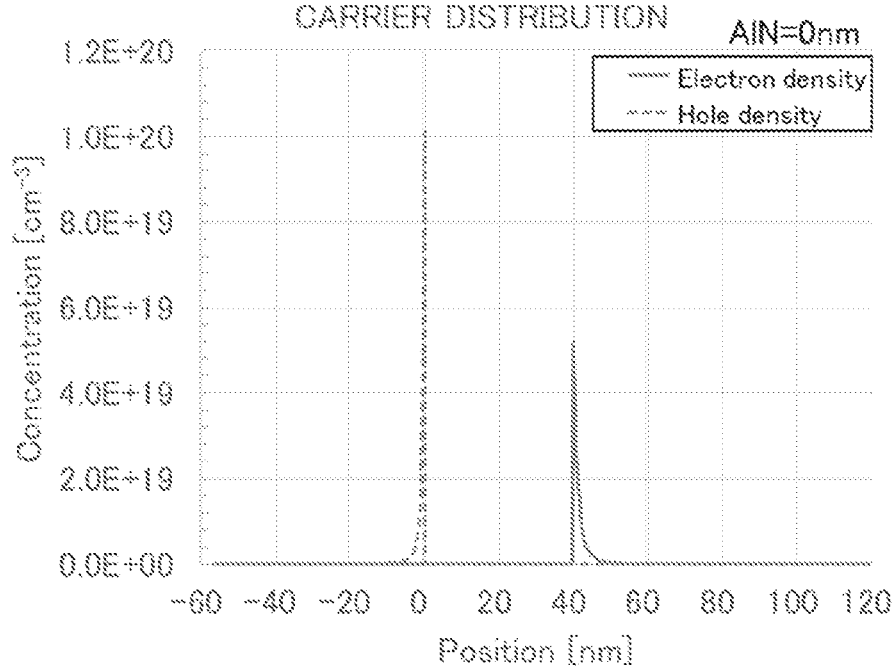
FIG. 36 is a graph showing the result of calculation of carrier concentration for the case where the thicknesses of the AlN layers are 0 nm.

FIG. 35 is a graph showing the result of calculation performed on the band diagram for the case where the thicknesses of the AlN layers are 0 nm. The horizontal axis of FIG. 35 shows position. The vertical axis of FIG. 35 shows energy (eV). FIG. 36 is a graph showing the result of calculation of carrier concentration for the case where the thicknesses of the AlN layers are 0 nm. The horizontal axis of FIG. 36 shows position. The vertical axis of FIG. 36 shows carrier concentration ($cm^{-3}$).

Figure 37:
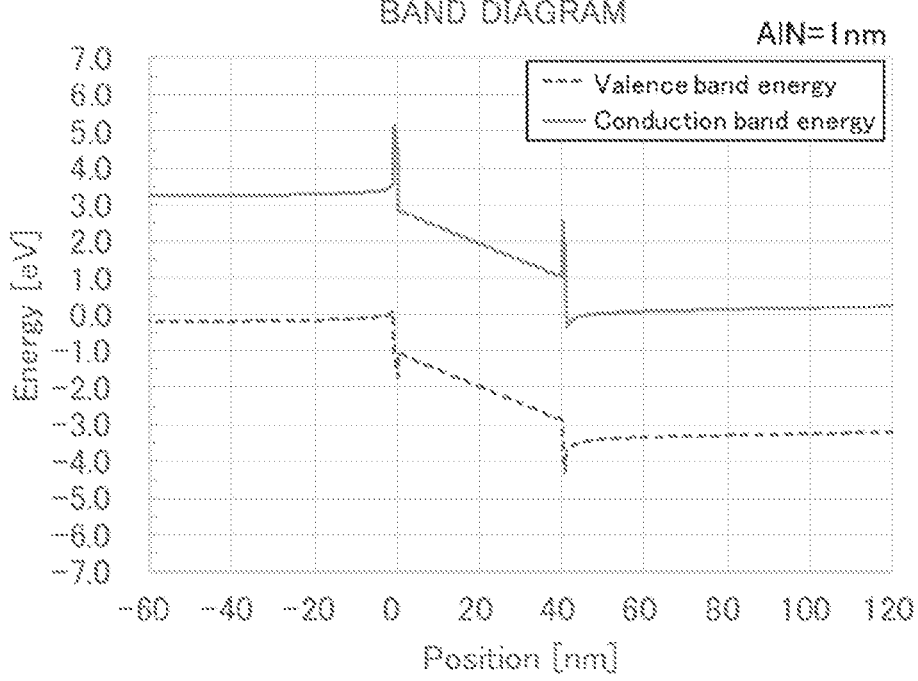
FIG. 37 is a graph showing the result of calculation performed on the band diagram for the case where the thicknesses of the AlN layers are 1 nm.
Figure 38:
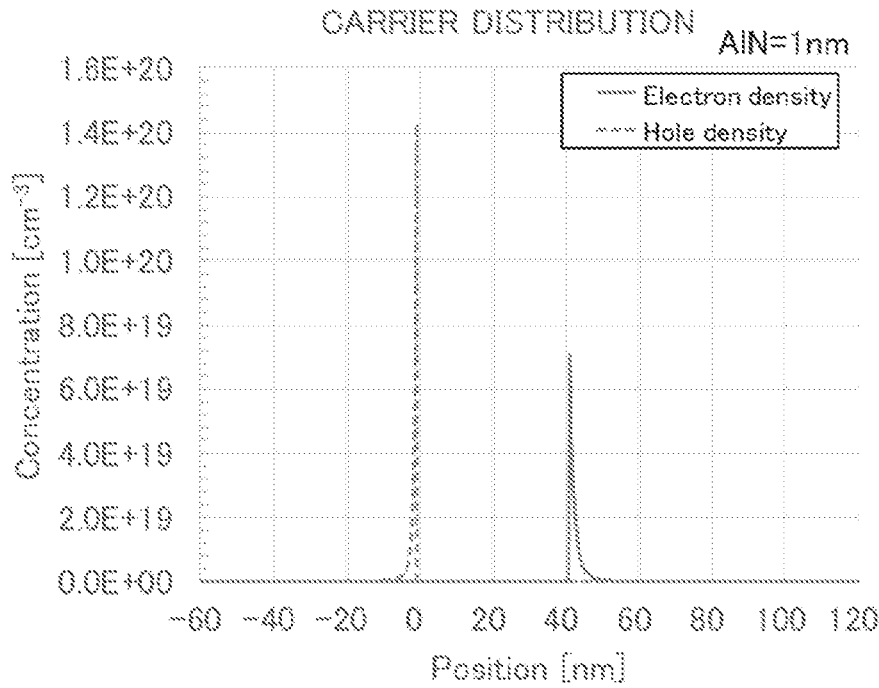
FIG. 38 is a graph showing the result of calculation of carrier concentration for the case where the thicknesses of the AlN layers are 1 nm.

FIG. 37 is a graph showing the result of calculation performed on the band diagram for the case where the thicknesses of the AlN layers are 1 nm. The horizontal axis of FIG. 37 shows position. The vertical axis of FIG. 37 shows energy (eV). FIG. 38 is a graph showing the result of calculation of carrier concentration for the case where the thicknesses of the AlN layers are 1 nm. The horizontal axis of FIG. 38 shows position. The vertical axis of FIG. 38 shows carrier concentration ($cm^{-3}$).

Figure 39:
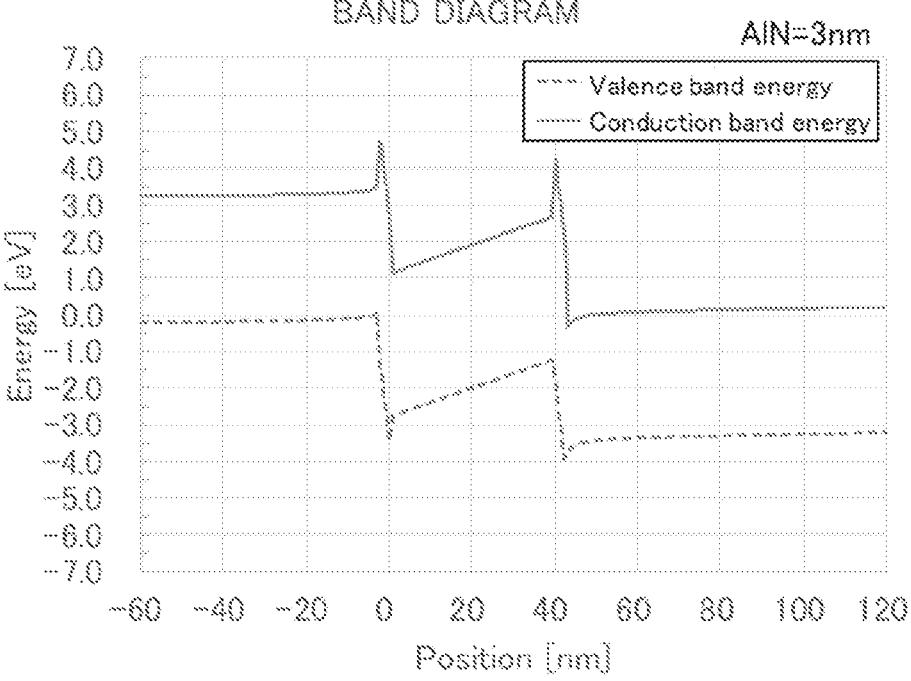
FIG. 39 is a graph showing the result of calculation performed on the band diagram for the case where the thicknesses of the AlN layers are 3 nm.
Figure 40:
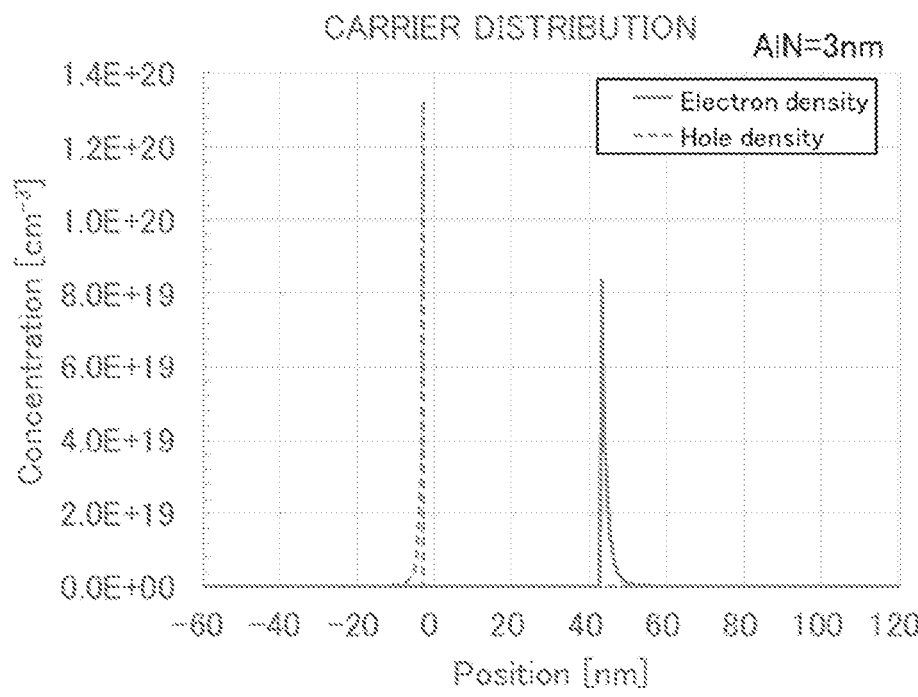
FIG. 40 is a graph showing the result of calculation of carrier concentration for the case where the thicknesses of the AlN layers are 3 nm.

FIG. 39 is a graph showing the result of calculation performed on the band diagram for the case where the thicknesses of the AlN layers are 3 nm. The horizontal axis of FIG. 39 shows position. The vertical axis of FIG. 39 shows energy (eV). FIG. 40 is a graph showing the result of calculation of carrier concentration for the case where the thicknesses of the AlN layers are 3 nm. The horizontal axis of FIG. 40 shows position. The vertical axis of FIG. 40 shows carrier concentration ($cm^{-3}$).

Figure 41:
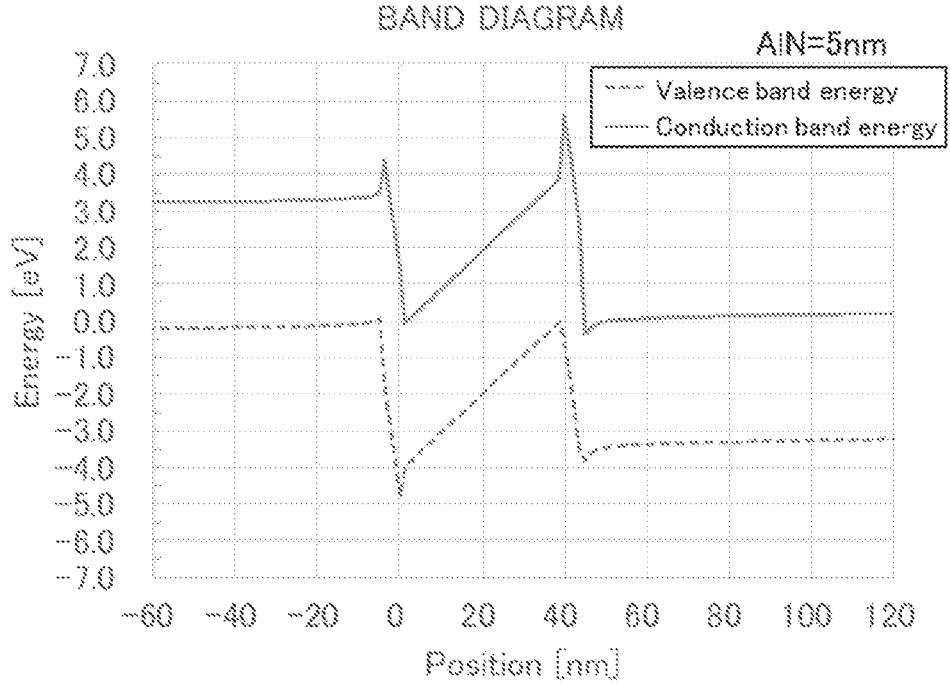
FIG. 41 is a graph showing the result of calculation performed on the band diagram for the case where the thicknesses of the AlN layers are 5 nm.
Figure 42:
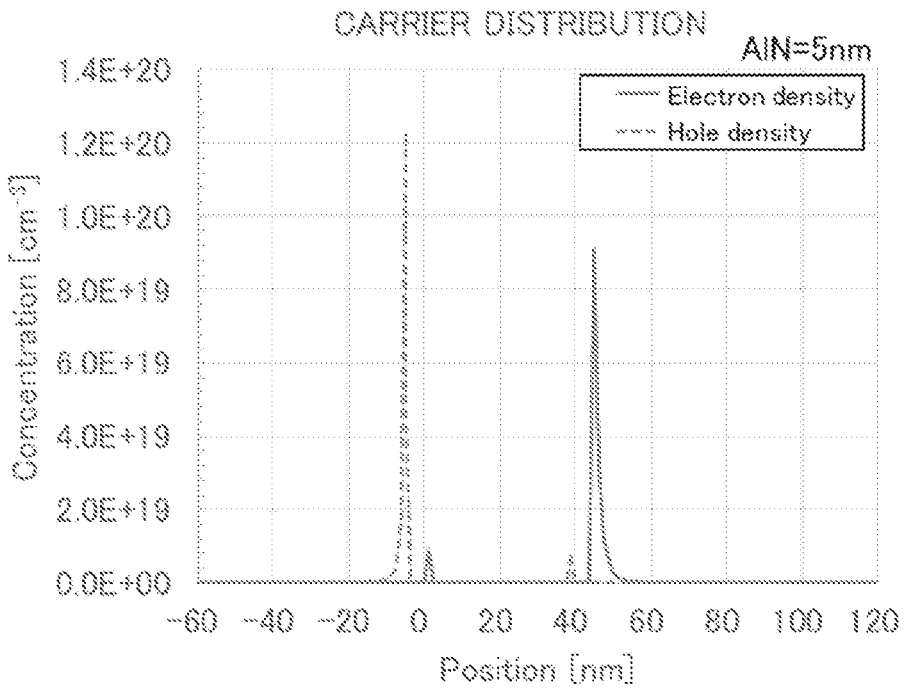
FIG. 42 is a graph showing the result of calculation of carrier concentration for the case where the thicknesses of the AlN layers are 5 nm.

FIG. 41 is a graph showing the result of calculation performed on the band diagram for the case where the thicknesses of the AlN layers are 5 nm. The horizontal axis of FIG. 41 shows position. The vertical axis of FIG. 41 shows energy (eV). FIG. 42 is a graph showing the result of calculation of carrier concentration for the case where the thicknesses of the AlN layers are 5 nm. The horizontal axis of FIG. 42 shows position. The vertical axis of FIG. 42 shows carrier concentration ($cm^{-3}$).

Figure 43:
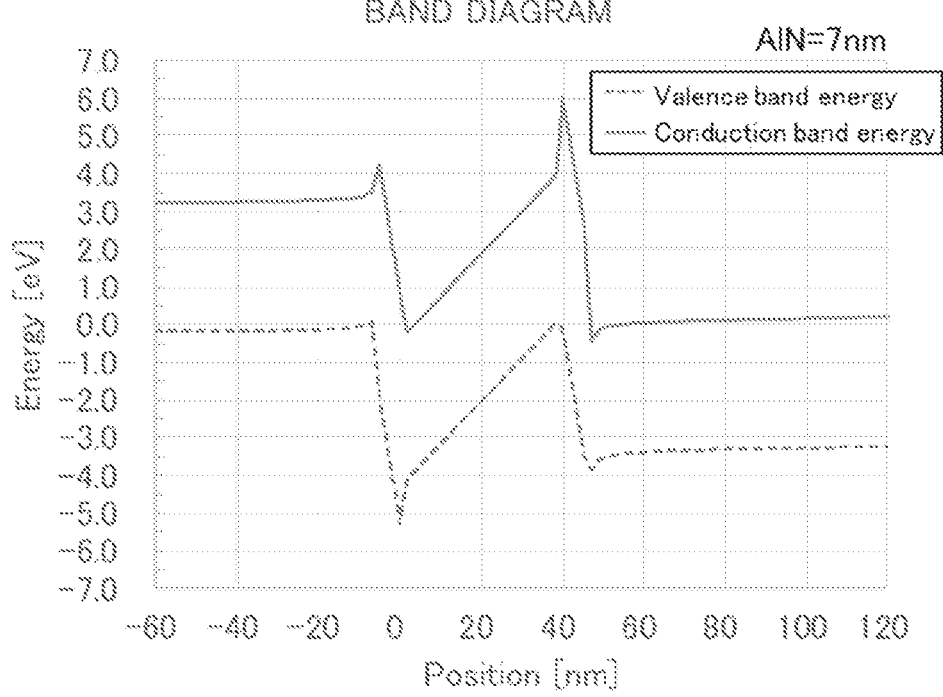
FIG. 43 is a graph showing the result of calculation performed on the band diagram for the case where the thicknesses of the AlN layers are 7 nm.
Figure 44:
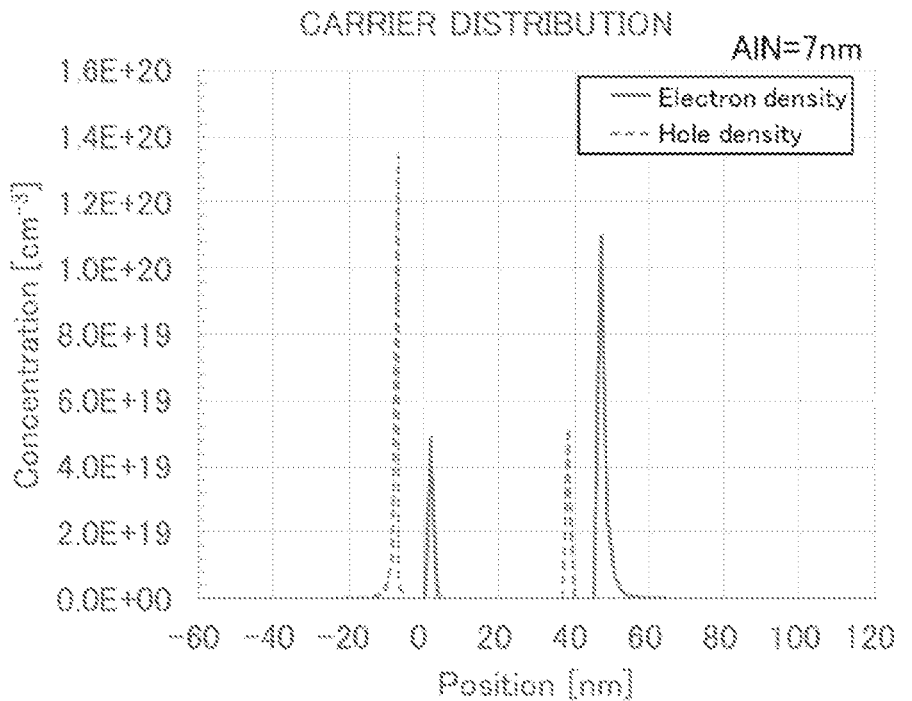
FIG. 44 is a graph showing the result of calculation of carrier concentration for the case where the thicknesses of the AlN layers are 7 nm.

FIG. 43 is a graph showing the result of calculation performed on the band diagram for the case where the thicknesses of the AlN layers are 7 nm. The horizontal axis of FIG. 43 shows position. The vertical axis of FIG. 43 shows energy (eV). FIG. 44 is a graph showing the result of calculation of carrier concentration for the case where the thicknesses of the AlN layers are 7 nm. The horizontal axis of FIG. 44 shows position. The vertical axis of FIG. 44 shows carrier concentration ($cm^{-3}$).

Figure 45:
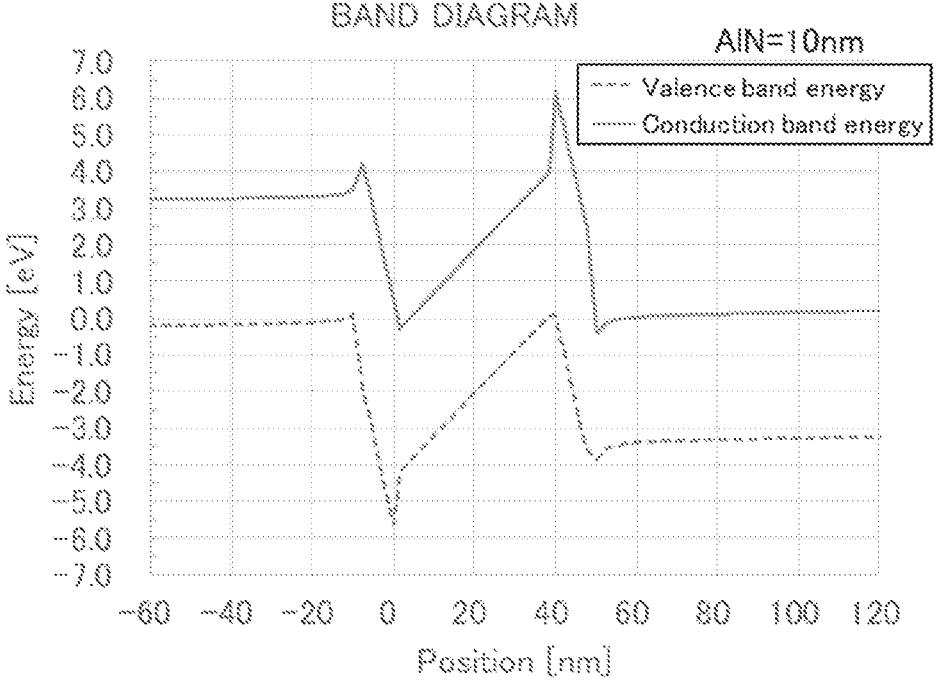
FIG. 45 is a graph showing the result of calculation performed on the band diagram for the case where the thicknesses of the AlN layers are 10 nm.
Figure 46:
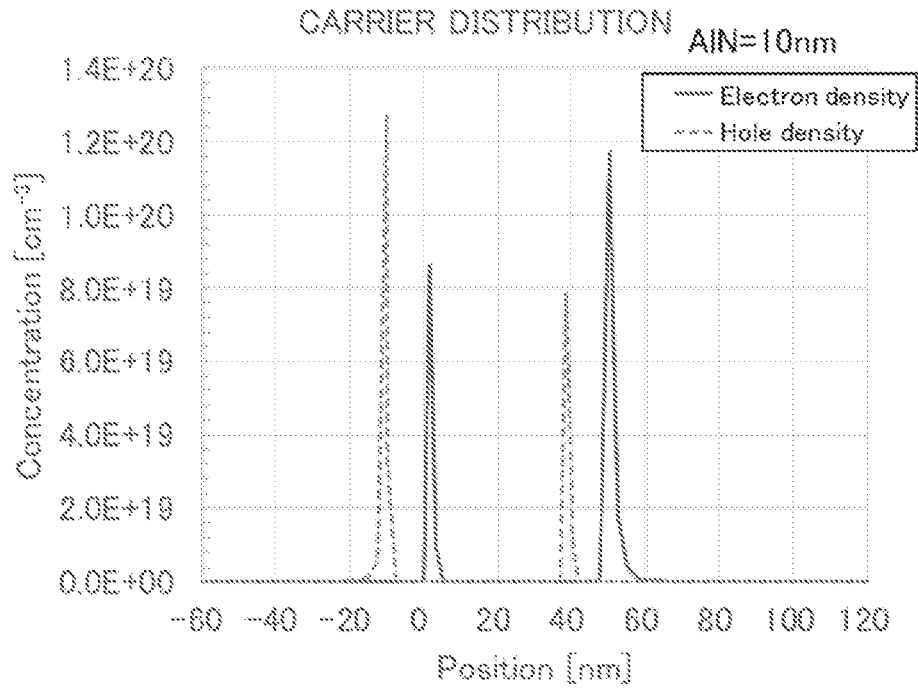
FIG. 46 is a graph showing the result of calculation of carrier concentration for the case where the thicknesses of the AlN layers are 10 nm.

FIG. 45 is a graph showing the result of calculation performed on the band diagram for the case where the thicknesses of the AlN layers are 10 nm. The horizontal axis of FIG. 45 shows position. The vertical axis of FIG. 45 shows energy (eV). FIG. 46 is a graph showing the result of calculation of carrier concentration for the case where the thicknesses of the AlN layers are 10 nm. The horizontal axis of FIG. 46 shows position. The vertical axis of FIG. 46 shows carrier concentration ($cm^3$).

The position of 0 nm of the horizontal axis corresponds to the contact surface between the AlGaN layer and the second AlN layer.

The case where the thicknesses of the AlN layers are 0 nm means the case where the AlN layers are not present. In this case, due to the piezo effect, energy decreases in the AlGaN layer from the second undoped GaN layer side toward the first undoped GaN layer side. Also, the barrier between the first undoped GaN layer side and the AlGaN layer and the barrier between the second undoped GaN layer side and the AlGaN layer are relatively low.

There is a tendency that the greater the thicknesses of the AlN layers, the higher the barriers between the AlN layers and the AlGaN layer. Also, the hole concentration is slightly higher than the electron concentration. When the thickness of the AlN layers is about 5 nm or greater, second two-dimensional hole gas and second two-dimensional electron gas appear remarkably in the AlGaN layer.

Figures 47, 48:
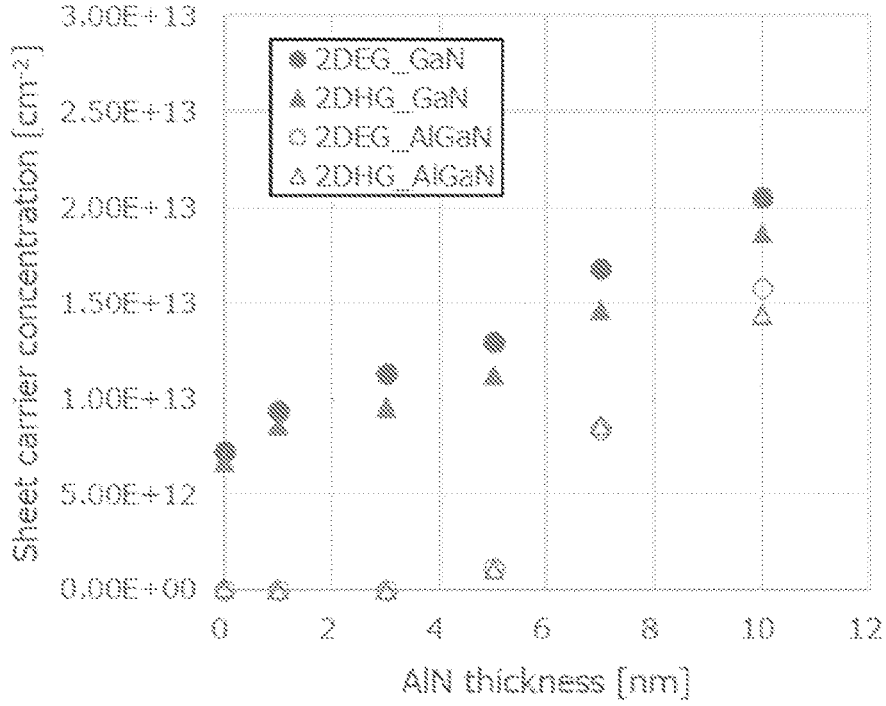
FIG. 47 is a table showing the relation between the thickness of the AlN layers and sheet carrier concentration.
FIG. 48 is a graph showing the relation between the thickness of the AlN layers and sheet carrier concentration.

FIG. 47 is a table showing the relation between the thickness of the AlN layers and sheet carrier concentration. The sheet carrier densities of the second two-dimensional hole gas and the second two-dimensional electron gas are about $2 \times 10^{13}$ $cm^{-2}$ or less.

FIG. 48 is a graph showing the relation between the thickness of the AlN layers and sheet carrier concentration. FIG. 48 is a graph obtained from the table of FIG. 47. As shown in FIG. 48, the greater the thickness of the AlN layers, the greater the sheet carrier concentration. Therefore, it is preferred that the AlN layers have a thickness as large as possible. However, when the thickness of the AlN layers is larger than 10 nm, a crack may be generated in the layered film of GaN, AlN, and AlGaN. Therefore, it is preferred that the thickness of the AlN layers be 10 nm or less.

(Evaluation Tests)

1. Experiment 1

1-1. Production of FET

An FET having the structure of the semiconductor element 100 of the first embodiment was produced. A low-temperature GaN buffer layer (30 nm), an undoped GaN layer (800 nm), a first AlN layer, an AlGaN layer (40 nm), a second AlN layer, an undoped GaN layer (65 nm), an Mg doped GaN layer (60 nm), and an Mg doped GaN layer (8 nm) were stacked one after another on a c-face sapphire substrate. The film formation temperature of the low-temperature GaN buffer layer was 530° C., and the film formation temperatures of other layers were 1100° C. The Al composition ratio of the AlGaN layer was 0.27. The Mg concentration of the 60-nm-thick Mg doped GaN layer was $5 \times 10^{19}$ $cm^{-3}$, and the Mg concentration of the 8-nm-thick Mg doped GaN layer was $2 \times 10^{20}$ $cm^{-3}$.

The 800-nm-thick undoped GaN layer is a channel layer, the AlGaN layer is an electron supply layer, and the 65-nm-thick undoped GaN layer is a cap layer.

The chip was rectangular and had a size of 4 mm×6 mm. Its polarization junction length was 20 µm. Its gate length was 4 µm. The gate total width of the entire FET chip is 375 mm.

Two types of samples in which the thickness of the first AlN layer and the second AlN layer was set to 0 nm and 3 nm, respectively, were produced.

1-2. Results of Experiment

Current collapse did not occur irrespective of the thickness of the AlN layers.

The breakdown voltage was about 1600 V irrespective of the thickness of the AlN layers.

In the case where the thickness of the AlN layers was 3 nm, the current value of drain current at the time when the drain voltage Vd was 2 V was 49.5 A. In the case where the thickness of the AlN layers was 0 nm, the current value of drain current at the time when the drain voltage Vd was 2 V was 45 A.

In the case where the thickness of the AlN layers was 3 nm, the ON resistance was 4.2 m$\Omega\cdot$cm$^2$. In the case where the thickness of the AlN layers was 0 nm, the ON resistance was 4.9 m$\Omega\cdot$cm$^2$.

As described above, in the case where the AlN layers are present, drain current increases, and ON resistance becomes smaller. Namely, performance is enhanced.

2. Experiment 2

2-1. Production of Schottky Barrier Diode

A Schottky barrier diode having the structure of the semiconductor element 500 of the eighth embodiment was produced. A low-temperature GaN buffer layer (30 nm), an undoped GaN layer (800 nm), a first AlN layer, an AlGaN layer (40 nm), a second AlN layer, an undoped GaN layer (65 nm), an Mg doped GaN layer (60 nm), an Mg doped GaN layer (8 nm) were stacked one after another on a c-face sapphire substrate. The film formation temperature of the low-temperature GaN buffer layer was 530° C., and the film formation temperature of other layers was 1100° C. The Al composition ratio of the AlGaN layer was 0.27. The Mg concentration of the 60-nm-thick Mg doped GaN layer was 5×10$^{19}$ cm$^{-3}$, and the Mg concentration of the 8-nm-thick Mg doped GaN layer was 2×10$^{20}$ cm$^{-3}$.

The chip was rectangular and had a size of 4 mm×6 mm. Its polarization junction length was 20 μm. The electrode total width of the entire Schottky barrier diode chip is 219 mm.

2-2. Results of Experiment

The breakdown voltage was about 2600 V irrespective of the thickness of the AlN layers.

In the case where the thickness of the AlN layers was 3 nm, the current value at the time when the anode voltage was 1.5 V was 5.16 A. In the case where the thickness of the AlN layers was 0 nm, the current value at the time when the anode voltage was 1.5 V was 4.61 A.

In the case where the thickness of the AlN layers was 3 nm, the ON resistance was 5.5 m$\Omega\cdot$cm$^2$. In the case where the thickness of the AlN layers was 0 nm, the ON resistance was 6.2 m$\Omega\cdot$cm$^2$.

As described above, in the case where the AlN layers are present, large current flows, and ON resistance is small. Namely, performance is enhanced.

3. Experiment 3

3-1. Production of FET

Figure 49:
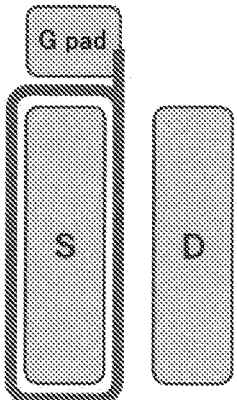
FIG. 49 is a view showing an FET in which a gate electrode contact region GC1 surrounds a source electrode contact region SC1.
Figure 50:
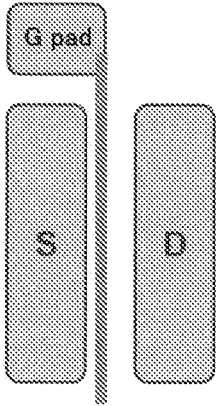
FIG. 50 is a view showing an FET in which a gate electrode contact region GC1 is located between a source electrode contact region SC1 and a drain electrode contact region DC1.

FETs having a simple structure as shown in FIGS. 49 and 50 were produced. FIG. 49 is a view showing an FET in which a gate electrode contact region GC1 surrounds a source electrode contact region SC1. FIG. 50 is a view showing an FET in which a gate electrode contact region GC1 is located between a source electrode contact region SC1 and a drain electrode contact region DC1. In FIG. 50, the gate electrode contact region GC1 does not surround the source electrode contact region SC1.

There were produced an FET in which the gate electrode contact region GC1 surrounded the source electrode contact region SC1 and an FET in which the gate electrode contact region GC1 was located between the source electrode contact region SC1 and the drain electrode contact region DC1 as described above. Then, leakage currents of these FETs were compared.

3-2. Results of Experiment (Leakage Current)

Figure 51:
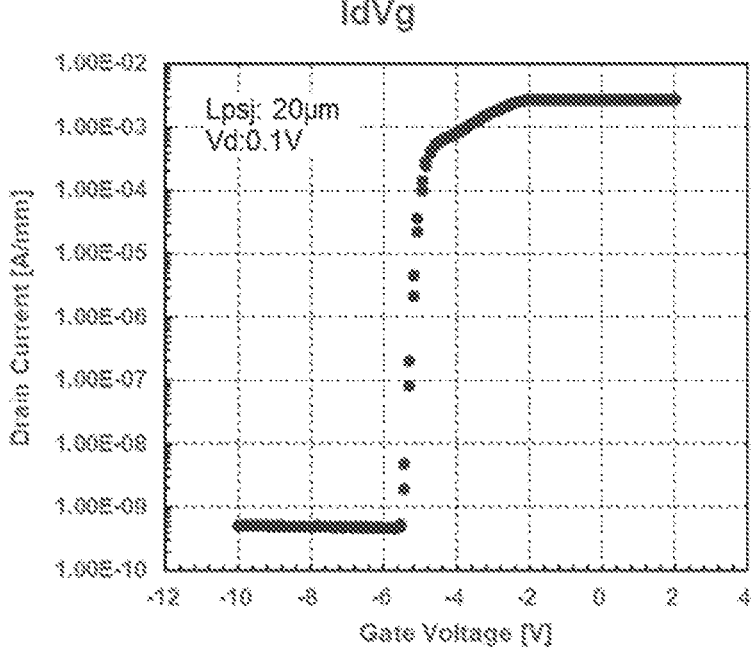
FIG. 51 is a graph showing the relation between gate voltage and drain current of an FET for the case where 0.1 V was applied to the drain electrode of the FET.

FIG. 51 is a graph showing the relation between gate voltage and drain current for the case where 0.1 V was applied to the drain electrode of an FET. The horizontal axis of FIG. 51 shows gate voltage. The vertical axis of FIG. 51 shows drain current.

Figure 52:
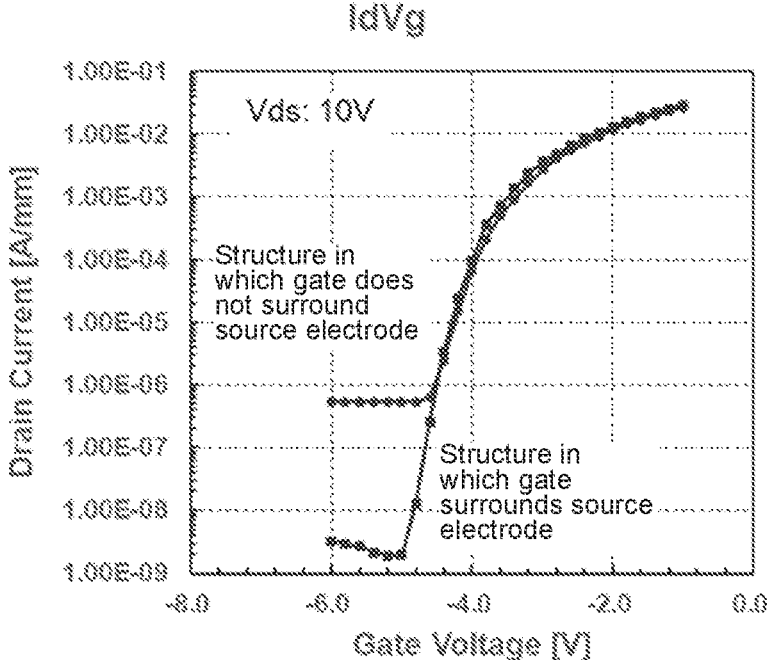
FIG. 52 is a graph showing the relation between gate voltage and drain current of each of FETs.

FIG. 52 is a graph showing the relation between gate voltage and drain current of each of the FETs. The horizontal axis of FIG. 52 shows gate voltage. The vertical axis of FIG. 52 shows drain current. As shown in FIG. 52, in the case where the gate electrode G1 surrounds the source electrode S1, the FET operates when the gate voltage is –5 V or higher. Even when the gate voltage is lower than –5 V, an OFF leakage current flows. The OFF leakage current is about 1×10$^{-9}$ A/mm.

As shown in FIG. 52, in the case where the gate electrode G1 does not surround the source electrode S1, the FET operates when the gate voltage is –4.5 V or higher. When the gate voltage is lower than –4.5 V, an OFF leakage current of about 1.0×10$^{-6}$ A/mm flows. As described above, when the gate electrode G1 surrounds the source electrode S1, the OFF leakage current becomes about double-digit smaller.

Figure 53:
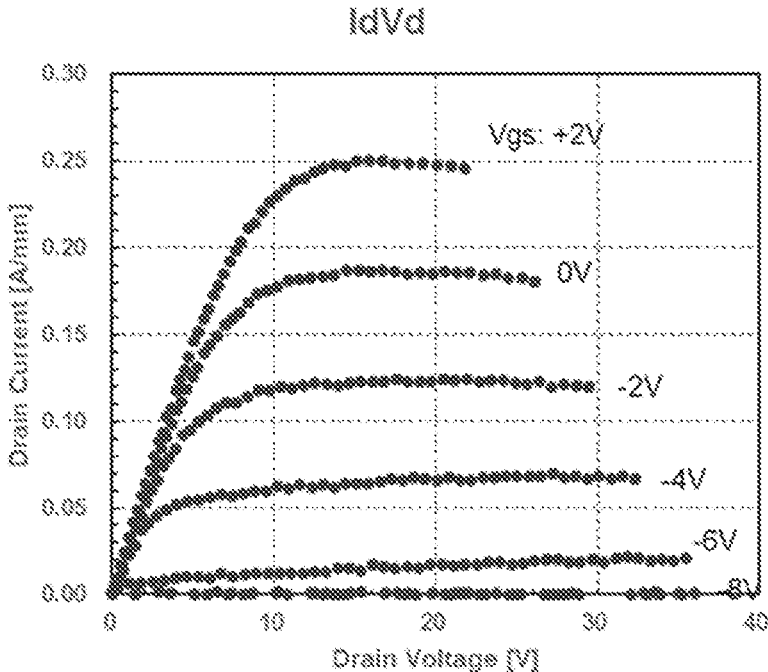
FIG. 53 is a graph showing the relation between drain voltage and drain current of an FET.

FIG. 53 is a graph showing the relation between drain voltage and drain current of an FET. The horizontal axis of FIG. 53 shows drain voltage. The vertical axis of FIG. 53 shows drain current. FIG. 53 shows drain current of the FET in which the gate electrode G1 surrounds the source electrode S1. FIG. 53 shows drain current for cases where different gate voltages were applied, respectively. As shown in FIG. 53, as the gate voltage increases, the drain current increases.

Figure 54:
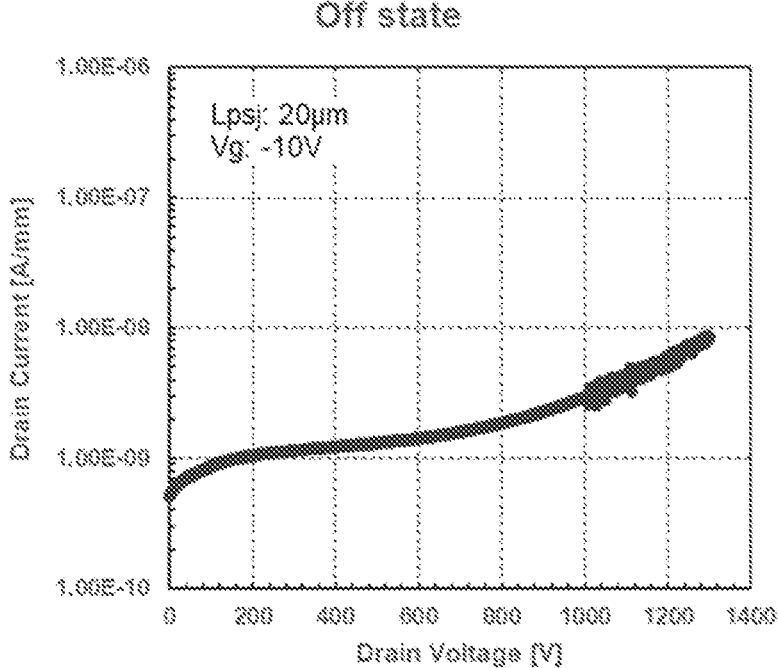
FIG. 54 is a graph showing the relation between drain voltage and drain current of an FET when the FET is off.

FIG. 54 is a graph showing the relation between drain voltage and drain current of an FET when the FET is off. The horizontal axis of FIG. 54 shows drain voltage. The vertical axis of FIG. 54 shows drain current. The gate voltage at that time is –10 V. FIG. 54 shows drain current of the FET in which the gate electrode G1 surrounds the source electrode S1. As shown in FIG. 54, when the FET is off, a leakage current of about 1×10$^{-9}$ A/mm flows. Also, as the drain voltage increases, the drain current increases slightly.

Figure 55:
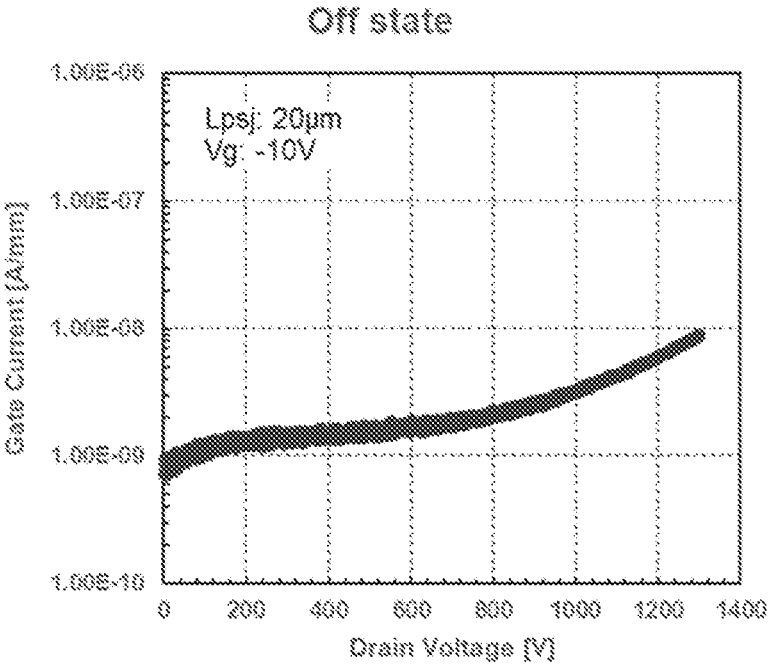
FIG. 55 is a graph showing the relation between drain voltage and gate current of the FET when the FET is off.

FIG. 55 is a graph showing the relation between drain voltage and gate current of the FET when the FET is off. The horizontal axis of FIG. 55 shows drain voltage. The vertical axis of FIG. 55 shows gate current. The gate voltage at that time is –10 V. FIG. 55 shows gate current of the FET in which the gate electrode G1 surrounds the source electrode S1. As shown in FIG. 55, when the FET is off, a leakage current of about 1×10$^{-9}$ A/mm flows. Also, as the drain voltage increases, the gate current increases slightly.

As described above, in the FETs produced actually, leakage current was suppressed. Notably, the current values in FIGS. 52 to 55 are normalized by the gate width.

4. Experiment 4

4-1. Production of FET

An FET similar to the semiconductor element 100 of the first embodiment was produced. A low-temperature GaN buffer layer, a first undoped GaN layer, an AlGaN layer, a second undoped GaN layer, an Mg doped p-GaN layer were formed on this order on a c-face sapphire substrate by an MOCVD method. The thicknesses of the low-temperature GaN buffer layer, the first undoped GaN layer, the AlGaN layer, the second undoped GaN layer, and the Mg doped p-GaN layer were 30 nm, 1.0 μm, 47 nm, 80 nm, and 53 nm, respectively. The film formation temperature of the low-temperature GaN buffer layer was 530° C. The film formation temperatures of the first undoped GaN layer, the AlGaN layer, and the second undoped GaN layer were 1100° C. The Mg concentration of the Mg doped p-GaN layer was increased from $5.0 \times 10^{19}$ cm$^{-3}$ to $2.0 \times 10^{20}$ cm$^{-3}$, thereby increasing the Mg concentration in the vicinity of the surface of the Mg doped GaN layer.

In order to form a gate electrode, an Ni layer and an Au layer were stacked in this order from the semiconductor layer side. In order to form each of a source electrode and a drain electrode, a Ti layer, an Al layer, an Ni layer, and an Au layer were stacked in this order from the semiconductor layer side.

Three types of elements whose semiconductor layers were different in dislocation density were used. The dislocation density of the first element was $5.0 \times 10^8$ cm$^{-2}$. The dislocation density of the second element was $2.3 \times 10^9$ cm$^2$. The dislocation density of the third element was $9.0 \times 10^9$ cm$^2$.

4-2. Evaluation Method

Figure 56:
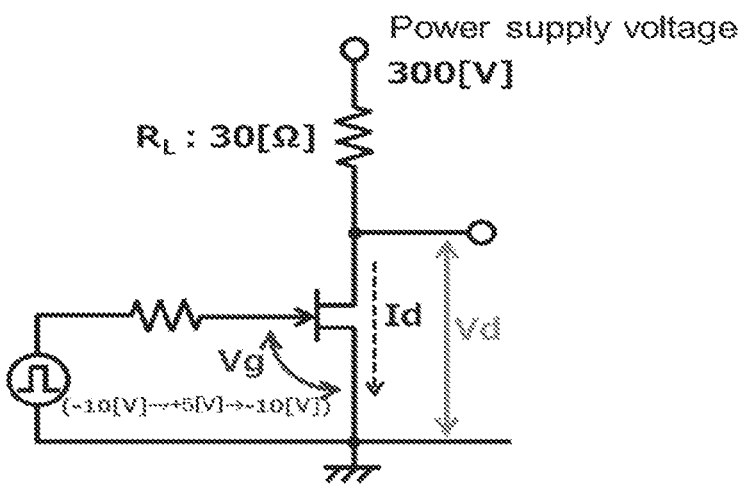
FIG. 56 is a diagram of a circuit used for evaluation of FETs.
Figure 57:
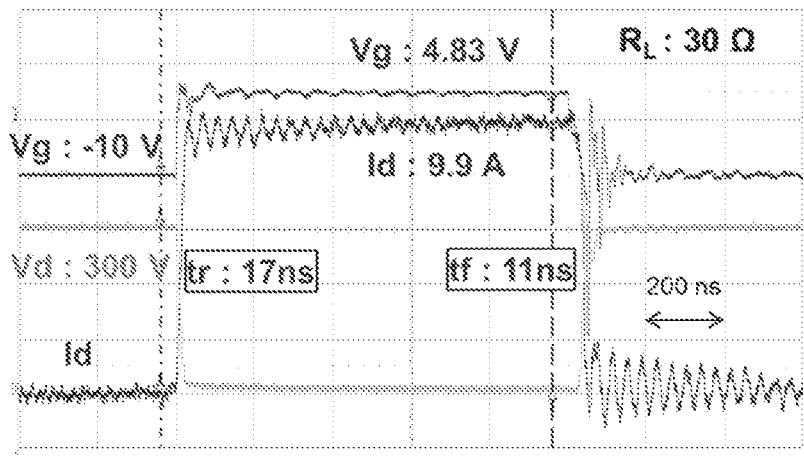
FIG. 57 is a graph showing output values in the evaluation of FETs.

FIG. 56 is a diagram of a circuit used for evaluation of FETs. FIG. 57 is a graph showing output values in the evaluation of the FETs. The drain voltage Vd was 300 V.

Figure 58:
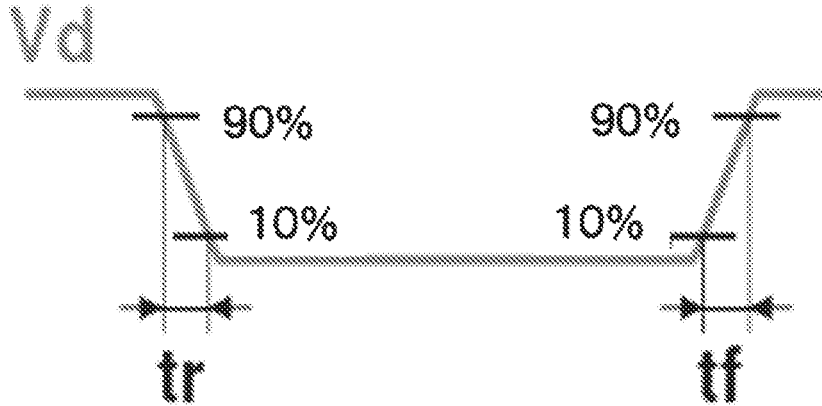
FIG. 58 is a chart showing the definition of rise time tr and fall time tf for FETs.

FIG. 58 is a chart showing the definition of rise time tr and fall time tf for FETs. The rise time tr is a time required for the drain voltage Vd to fall from 90% to 10% of the maximum value. The fall time tf is a time required for the drain voltage Vd to rise from 10% to 90% of the maximum value. As shown in FIG. 57, as the drain voltage Vd falls, the drain current Id increases. Since the drain current Id oscillates with small amplitude and at high frequency as shown in FIG. 57, instead of the drain current Id, the drain voltage Vd is used as a reference for determining the rise time tr and the fall time tf.

4-3. Results of Experiment (Response Time)

FIG. 59 is a table showing the characteristics of the FETs. In Examples 1 to 6, the rise time was 22 ns or shorter. In Comparative Example 1, the rise time was 42 ns. Whereas the gate length was 4 μm in Examples 1 to 6, the gate length was 8 μm in Comparative Example 1.

Figure 60:
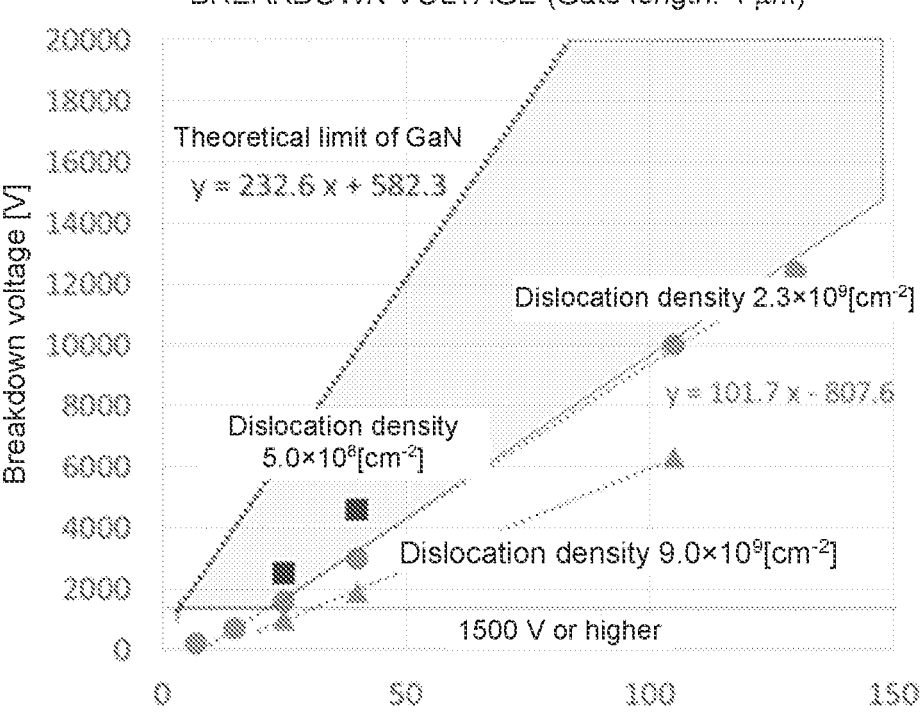
FIG. 60 is a graph showing the relation in FETs between the area of the junction between a second undoped GaN layer (a third semiconductor layer) and an Mg doped p-GaN layer (a fourth semiconductor layer) and the breakdown voltages of the semiconductor elements.

FIG. 60 is a graph showing the relation in FETs between the area of the junction between the second undoped GaN layer (the third semiconductor layer) and the Mg doped p-GaN layer (the fourth semiconductor layer) and the breakdown voltages of the semiconductor elements. The horizontal axis of FIG. 60 shows the area of the second undoped GaN layer (third semiconductor layer) per 1 μm in the gate width direction. The vertical axis of FIG. 60 shows breakdown voltage of the semiconductor elements.

As shown in FIG. 60, the breakdown voltage is 1500 V or higher in the region in which the above-described inequality (1) is satisfied.

$$101x - 810 \leq y \leq 235x + 585 \qquad (1)$$

where x is the contact area between the second semiconductor layer and the third semiconductor layer per 1 μm in the gate width direction, and y is the breakdown voltage.

Figure 61:
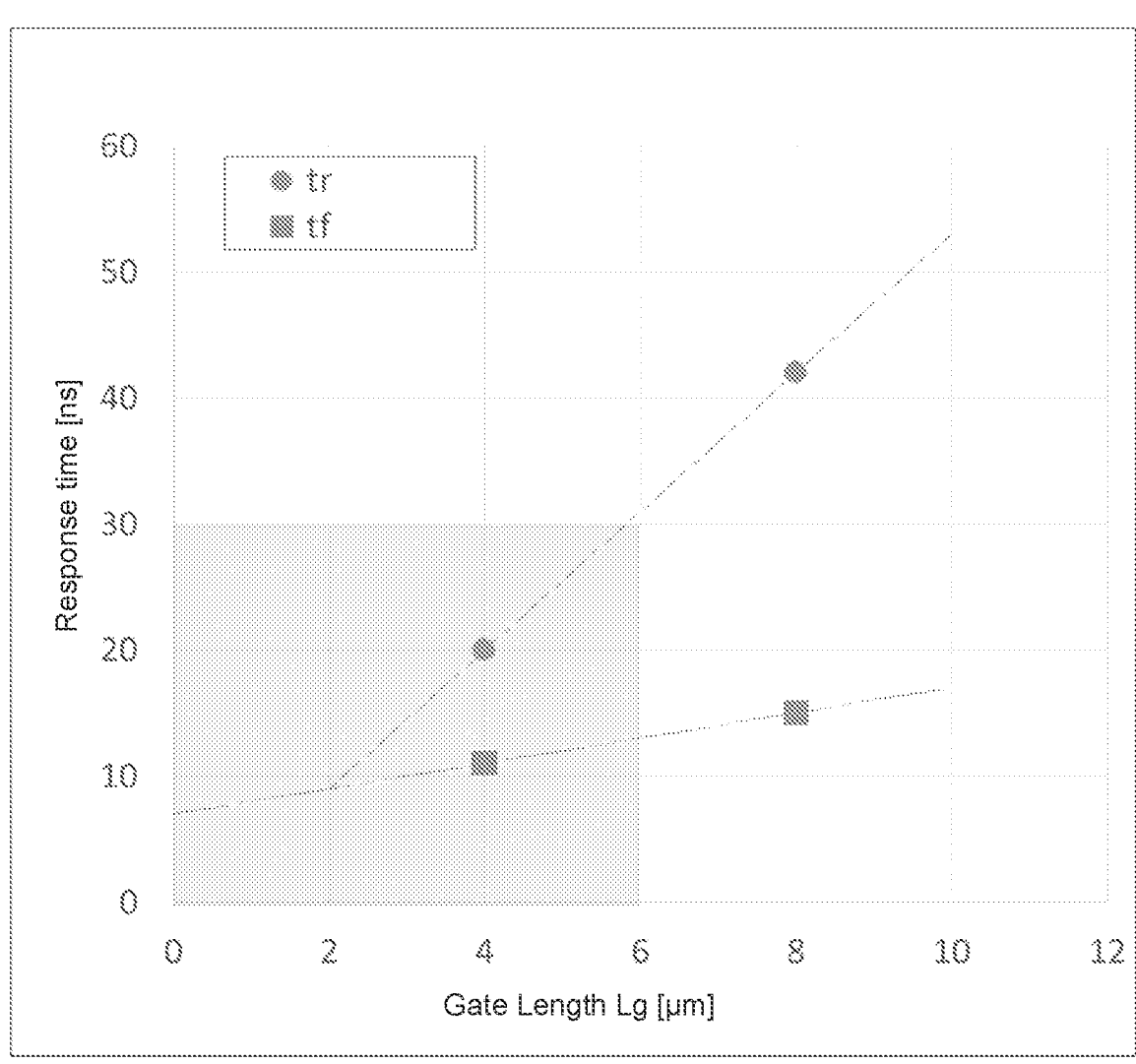
FIG. 61 is a graph showing the relation in FETs between gate length and response time.

FIG. 61 is a graph showing the relation in FETs between gate length and response time. The horizontal axis of FIG. 61 shows gate length. The vertical axis of FIG. 61 shows response time. As shown in FIG. 61, there is a tendency that the shorter the gate length, the shorter the response time. In the case where the gate length is 6 μm or shorter, the rise time tr and the fall time tf are 30 ns or shorter. In the case where the gate length is 4 μm or shorter, the rise time tr and the fall time tf are 20 ns or shorter.

Figure 62:
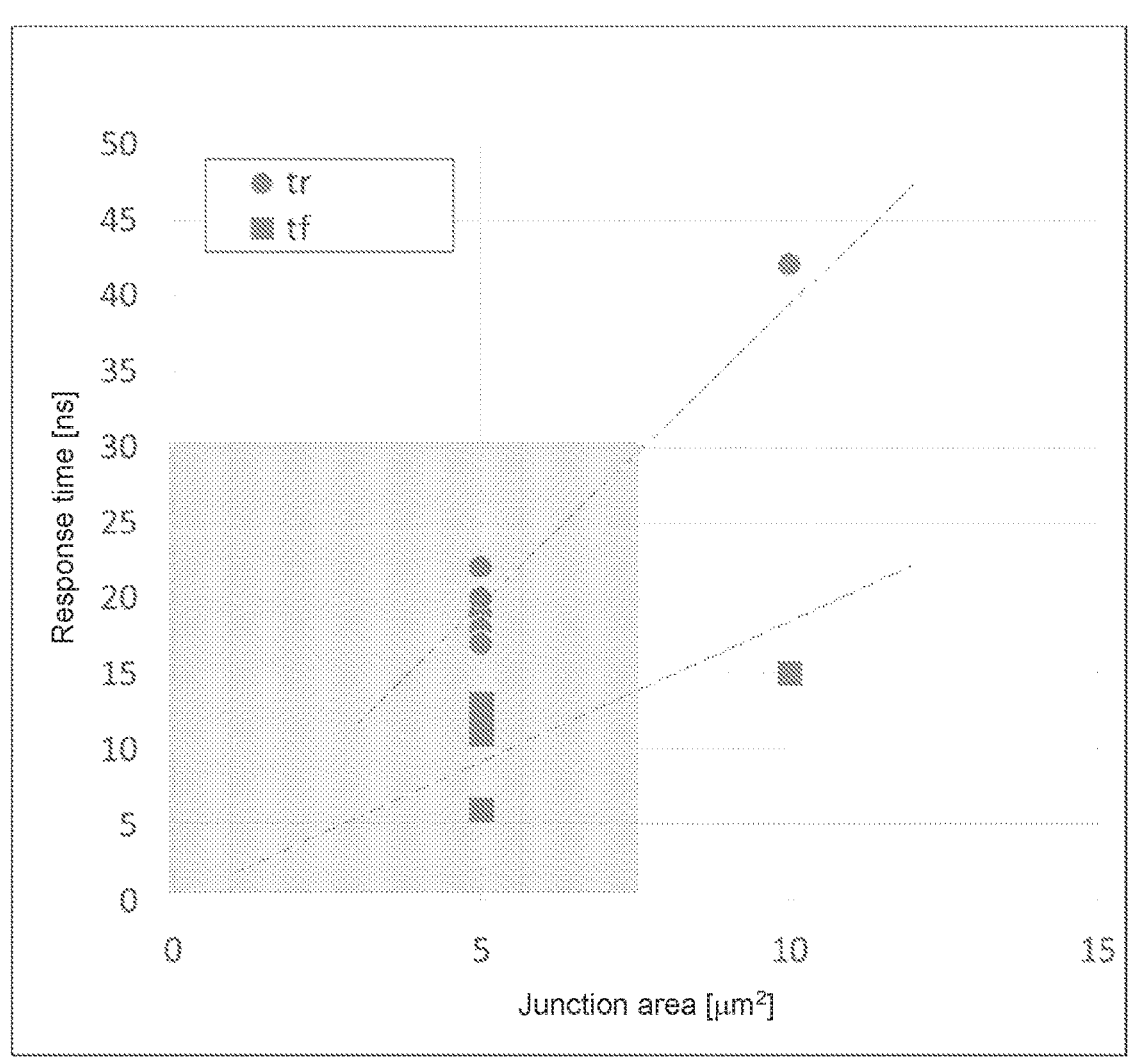
FIG. 62 is a graph showing the relation in FETs between response time and the junction area between the third semiconductor layer and the fourth semiconductor layer, excluding a polarization super junction region PSJ1.

FIG. 62 is a graph showing the relation in FETs between response time and the junction area between the third semiconductor layer 130 and the fourth semiconductor layer 140, excluding the polarization super junction region PSJ1. The horizontal axis of FIG. 62 shows the junction area between the third semiconductor layer 130 and the fourth semiconductor layer 140. The vertical axis of FIG. 62 shows response time. As shown in FIG. 62, there is a tendency that the smaller the junction area between the third semiconductor layer 130 and the fourth semiconductor layer 140, the shorter the response time.

Figures 63, 64:
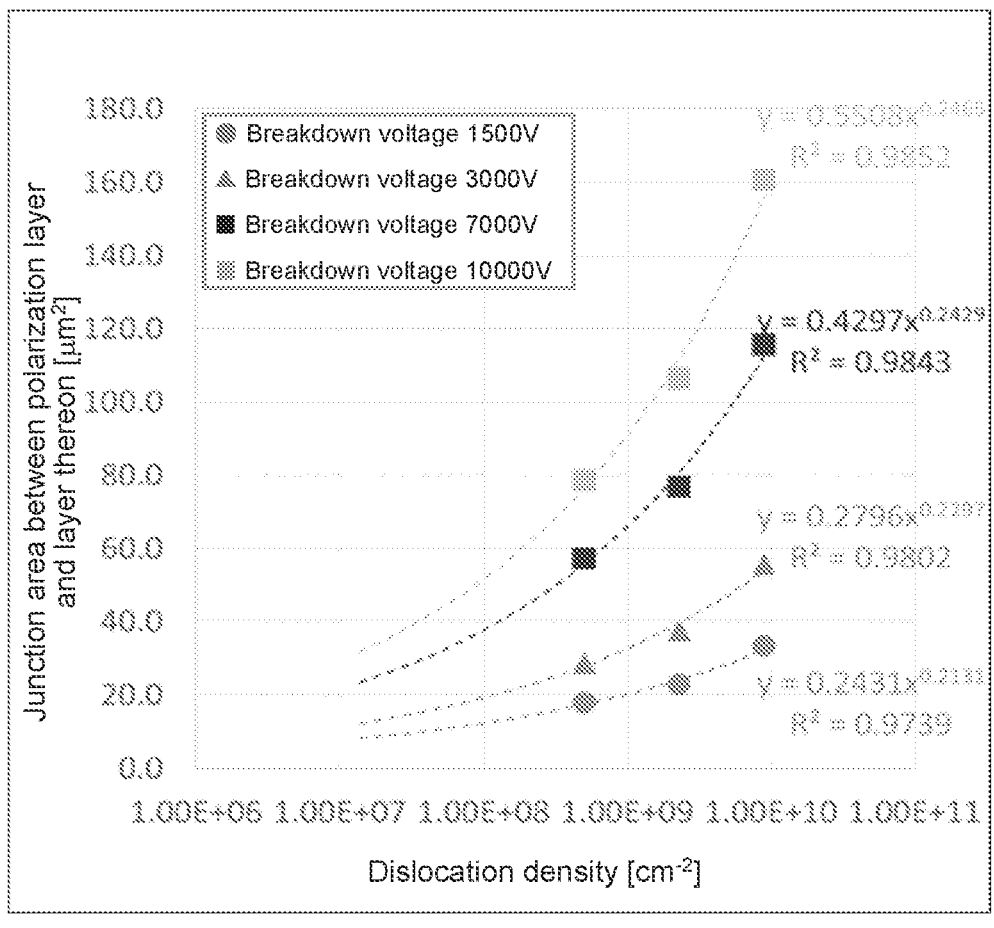
FIG. 63 is a graph showing the relation in FETs between dislocation density and junction area.
FIG. 64 is a table in which the data of FIG. 63 are shown collectively.

FIG. 63 is a graph showing the relation in FETs between dislocation density and junction area. The horizontal axis of FIG. 63 shows dislocation density. The vertical axis of FIG. 63 shows the junction area between the third semiconductor layer 130 and the fourth semiconductor layer 140. As shown in FIG. 63, in order to obtain high breakdown voltage, the junction area between the third semiconductor layer 130 and the fourth semiconductor layer 140 must be increased. Also, the higher the dislocation density, the greater the needed junction area.

FIG. 64 is a table in which the data of FIG. 63 are shown collectively.

Figures 65, 66:
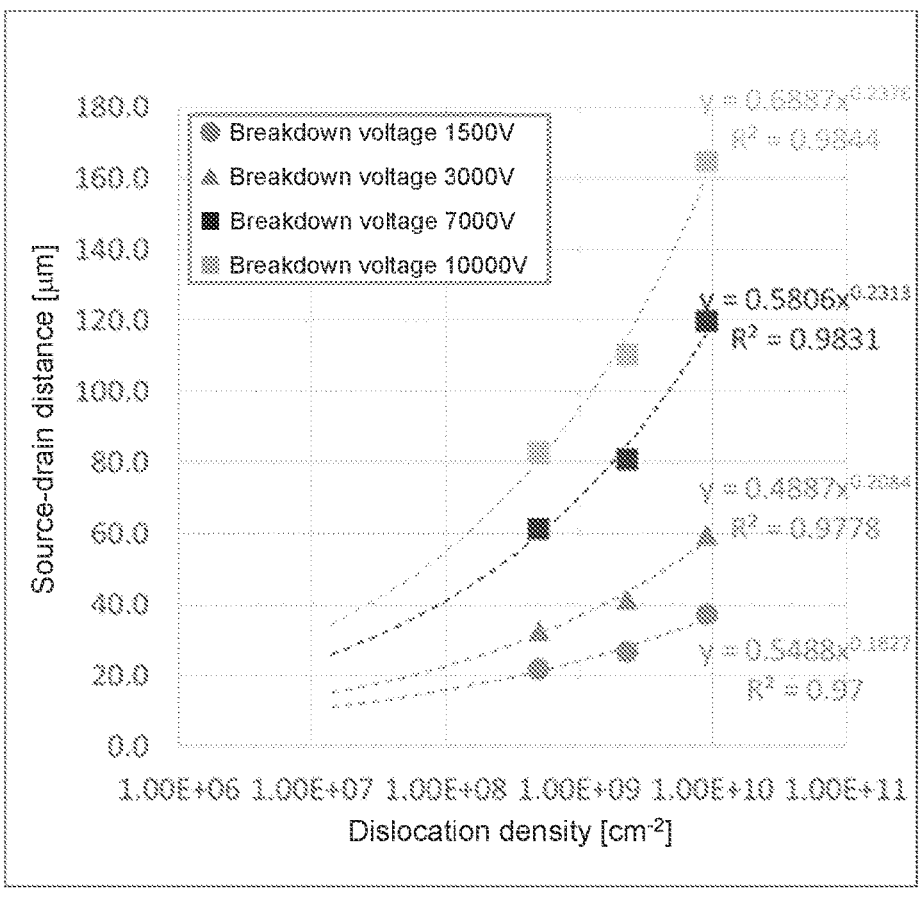
FIG. 65 is a graph showing the relation in FETs between dislocation density and source-drain distance.
FIG. 66 is a table in which the data of FIG. 65 are shown collectively.

FIG. 65 is a graph showing the relation in FETs between dislocation density and source-drain distance. The horizontal axis of FIG. 65 shows dislocation density. The vertical axis of FIG. 65 shows source-drain distance. As shown in FIG. 65, in order to obtain high breakdown voltage, the source-drain distance must be increased. Also, the higher the dislocation density, the longer the needed source-drain distance.

FIG. 66 is a table in which the data of FIG. 65 are shown collectively.

Figures 67, 68:
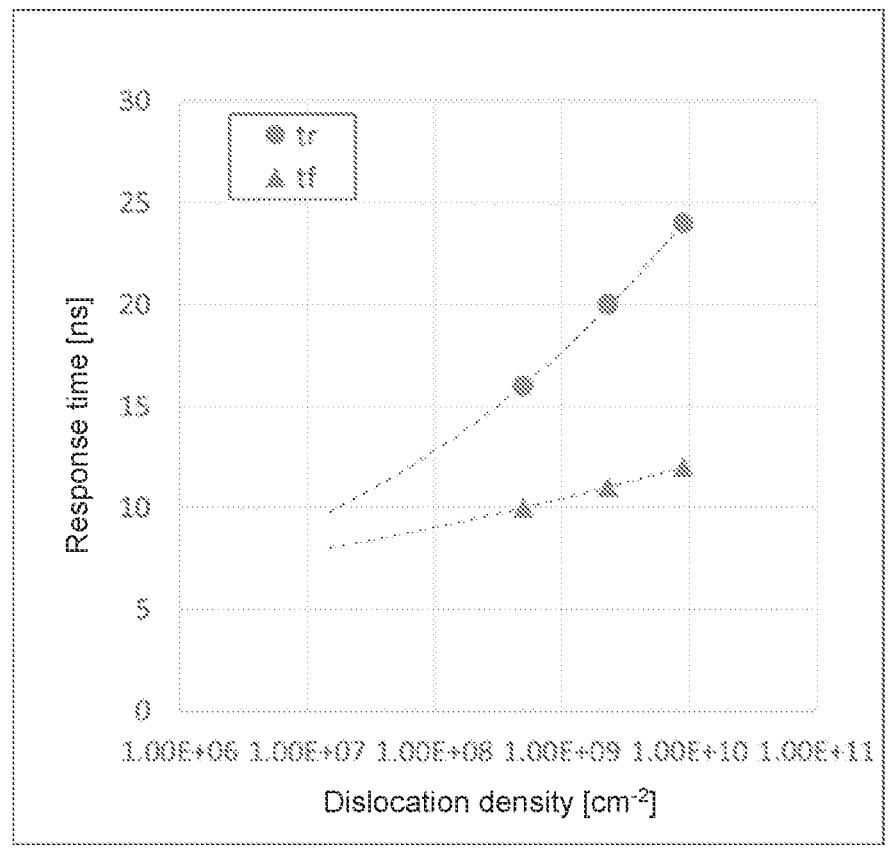
FIG. 67 is a graph showing the relation in FETs between dislocation density and response time.
FIG. 68 is a table in which the data of FIG. 67 are shown collectively.

FIG. 67 is a graph showing the relation in FETs between dislocation density and response time. The horizontal axis of FIG. 67 shows dislocation density. The vertical axis of FIG. 67 shows response time. As shown in FIG. 67, there is a tendency that the lower the dislocation density, the shorter the rise time tr and the fall time tf. In particular, lowering of dislocation density is highly effective to improve the rise time tr.

FIG. 68 is a table in which the data of FIG. 67 are shown collectively. As shown in FIGS. 67 and 68, in the case where the dislocation density is $5 \times 10^8$ cm$^{-2}$ or less, the rise time tr is 16 ns or shorter. In the case where the dislocation density is $5 \times 10^8$ cm$^{-2}$ or less, the fall time tf is 10 ns or shorter.

4-4. Results of Experiment (ON Resistance)

Figure 69:
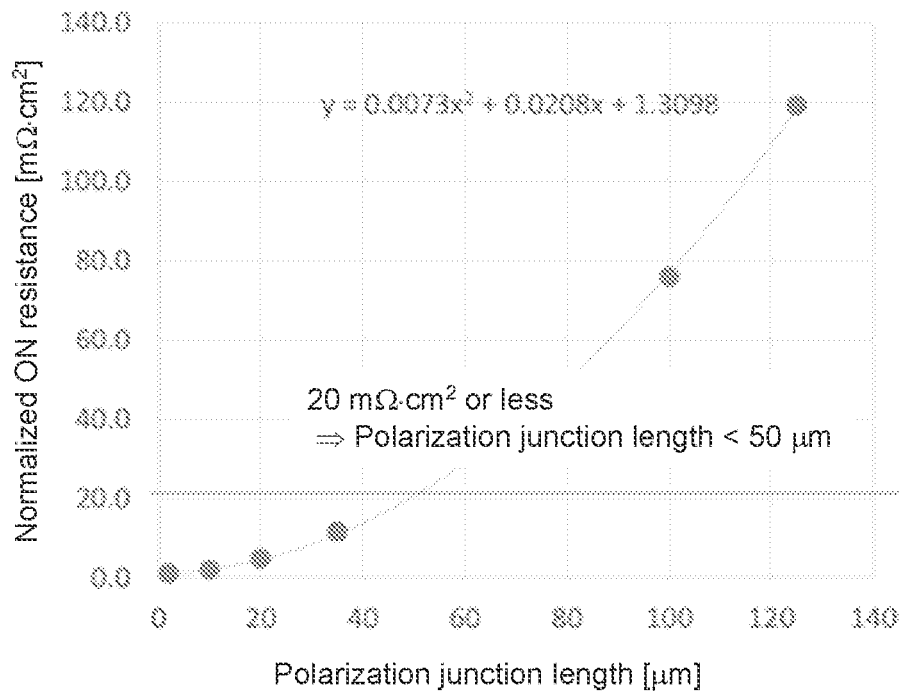
FIG. 69 is a graph showing the relation in FETs between polarization super junction length Lpsj and normalized ON resistance.

FIG. 69 is a graph showing the relation in FETs between polarization super junction length Lpsj and normalized ON resistance. The horizontal axis of FIG. 69 shows polarization super junction length. The vertical axis of FIG. 69 shows normalized ON resistance. As shown in FIG. 69, the greater the polarization super junction length Lpsj, the larger the normalized ON resistance. Also, in the case where the polarization super junction length Lpsj is 50 μm or less, the normalized ON resistance is 20 mΩ·cm$^2$ or smaller. In the case where the polarization super junction length Lpsj is 2 μm, the normalized ON resistance is about 1 mΩ·cm$^2$.

Figure 70:
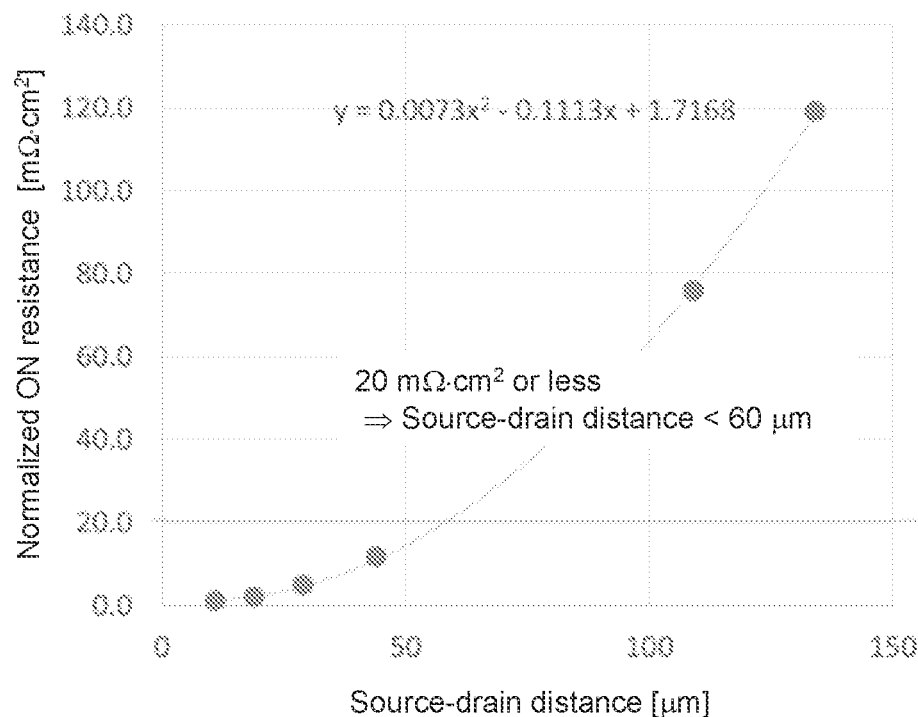
FIG. 70 is a graph showing the relation in FETs between source-drain distance and normalized ON resistance.

FIG. 70 is a graph showing the relation in FETs between source-drain distance and normalized ON resistance. The horizontal axis of FIG. 70 shows source-drain distance. The vertical axis of FIG. 70 shows normalized ON resistance. As shown in FIG. 70, the greater the source-drain distance, the larger the normalized ON resistance. Also, in the case where the source-drain distance is 60 μm or less, the normalized ON resistance is 20 mΩ·cm$^2$ or smaller. In the case where the source-drain distance is 11 μm, the normalized ON resistance is about 1 mΩ·cm².

4-5. Results of Experiment (Dislocation Density)

FIG. 71 is a table showing the relation in FETs between dislocation density and the characteristics of the semiconductor elements. As shown in FIG. 71, the lower the dislocation density, the smaller the value of the half width of an X-ray rocking curve. Also, the lower the dislocation density, the smaller the sheet resistance. Furthermore, the lower the dislocation density, the greater the mobility of two-dimensional hole gas. The sheet resistance is influenced by the mobility of two-dimensional electron gas. Accordingly, conceivably, when the dislocation density decreases and thus the degree of crystallinity increases, the mobility of two-dimensional electron gas becomes large. Meanwhile, the concentration of two-dimensional hole gas hardly depends on the dislocation density.

4-6. Results of Experiment (Active Region)

FIG. 72 is a table showing the relation in FETs between chip size and current value when the drain voltage Vd is 2 V. As shown in FIG. 72, the larger the chip size, the greater the chip peripheral length, the chip area, and the active region area. The active region area is a region of the semiconductor where current flows actually in an ON state. The active region area is an area obtained by subtracting, from the area of the element functional region FR1, the area of a region where the source electrode and the drain electrode are in conduct with a semiconductor layer and the area of a region sandwiched between the outermost source electrode contact region and an outer circumferential portion of the second semiconductor layer.

Also, the larger the chip size, the greater the gate width. The gate width is the sum of the lengths of lines along which the gate electrode G1 surrounds the source electrode S1.

FIG. 73 is a graph showing the relation in FETs between active region area and current value when the drain voltage Vd is 2 V. The horizontal axis of FIG. 73 shows active region area. The vertical axis of FIG. 73 shows the current value at the time when the drain voltage Vd is 2 V. As shown in FIG. 73, in the case where the active region area is 2.2 mm² or greater, the current value at the time when the drain voltage Vd is 2 V is 30 A or greater. In the case where the active region area 5.0 mm² or greater, the current value at the time when the drain voltage Vd is 2 V is 100 A or greater.

5. Experiment 5

5-1. Production of FETs

FETs similar to the semiconductor element 200 of the second embodiment were produced. The FETs are identical to those in Experiment 2 except for the polarization super junction length Lpsj.

5-2. Results of Experiment (Polarization Super Junction Length)

Figures 74, 75, 76:
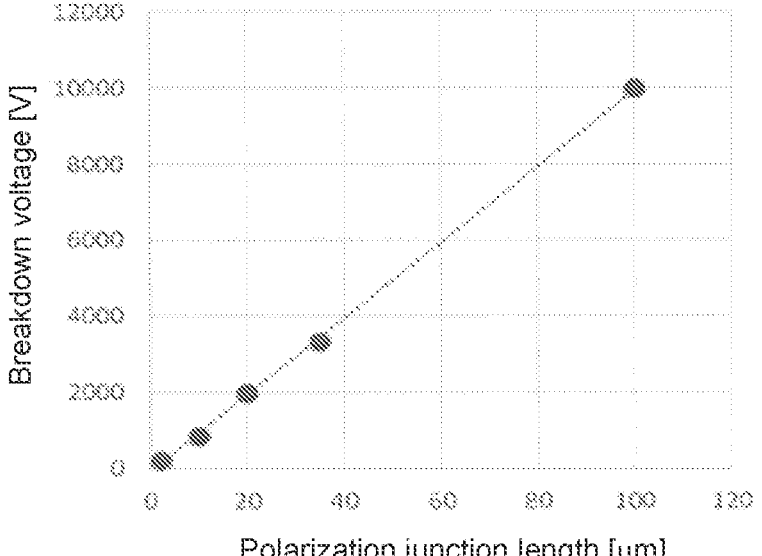
FIG. 74 is a table showing the breakdown voltages of FETs in which the polarization super junction length Lpsj and the distance Lsd between the source contact electrode S1*c* and the drain contract electrode D1*c* were changed between at the end portion and at the portion other than the end portion, respectively.
FIG. 75 is a table showing the breakdown voltages of FETs in which the polarization super junction length Lpsj and the distance Lsd between the source contact electrode S1*c* and the drain contract electrode D1*c* were not changed between at the end portion and at the portion other than the end portion, respectively.
FIG. 76 is a graph showing the relation in FETs between the polarization super junction length Lpsj and breakdown voltage.

FIG. 74 is a table showing the breakdown voltages of FETs in which the polarization super junction length Lpsj and the distance Lsd between the source contact electrode S1c and the drain contract electrode D1c were changed between at the end portion and at the portion other than the end portion, respectively. FIG. 74 shows cases where the smallest value of the polarization super junction length Lpsj2 at the end portion was made different from the smallest value of the polarization super junction length Lpsj1 at the portion other than the end portion.

FIG. 75 is a table showing the breakdown voltages of FETs in which the polarization super junction length Lpsj and the distance Lsd between the source contact electrode S1c and the drain contract electrode D1c were not changed between at the end portion and at the portion other than the end portion, respectively. In FIG. 75, the polarization super junction length Lpsj2 at the end portion is the same as the polarization super junction length Lpsj1 at the portion other than the end portion.

FIG. 76 is a graph showing the relation in FETs between the polarization super junction length Lpsj and the breakdown voltages of the FETs. The horizontal axis of FIG. 76 shows the polarization super junction length Lpsj. The vertical axis of FIG. 76 shows the breakdown voltages of the FETs. As shown in FIG. 76, the breakdown voltages of the FETs are approximately proportional to their polarization super junction lengths Lpsj.

As described above, the breakdown voltage of each FET depends on the smallest value of its polarization super junction length Lpsj.

6. Experiment 6

6-1. Production of FETs

FETs similar to the semiconductor element 300 of the third embodiment were produced. The FETs are identical to those in Experiment 2 except for the distance between an electrodes and a semiconductor layer.

6-2. Results of Experiment (Distance Between Electrode and Semiconductor Layer)

Figure 77:
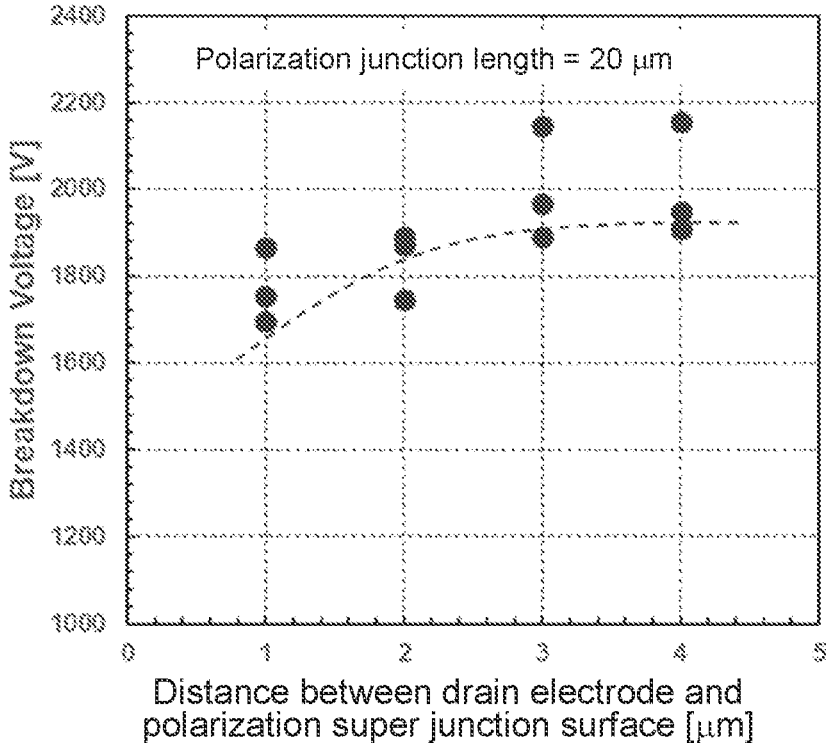
FIG. 77 is a graph showing the relation in FETs between the distance between the drain electrode contact region DC1 and the polarization super junction surface and breakdown voltage.

FIG. 77 is a graph showing the relation in FETs between the distance between the drain electrode contact region DC1 and the polarization super junction surface and breakdown voltage. The horizontal axis of FIG. 77 shows the distance between the drain electrode contact region DC1 and the polarization super junction surface. The vertical axis of FIG. 77 shows breakdown voltage. As shown in FIG. 77, even in the case where the distance between the drain electrode contact region DC1 and the third semiconductor layer 130 is short; i.e., 10 μm or less, the breakdown voltage of the semiconductor element is sufficiently high.

Figure 78:
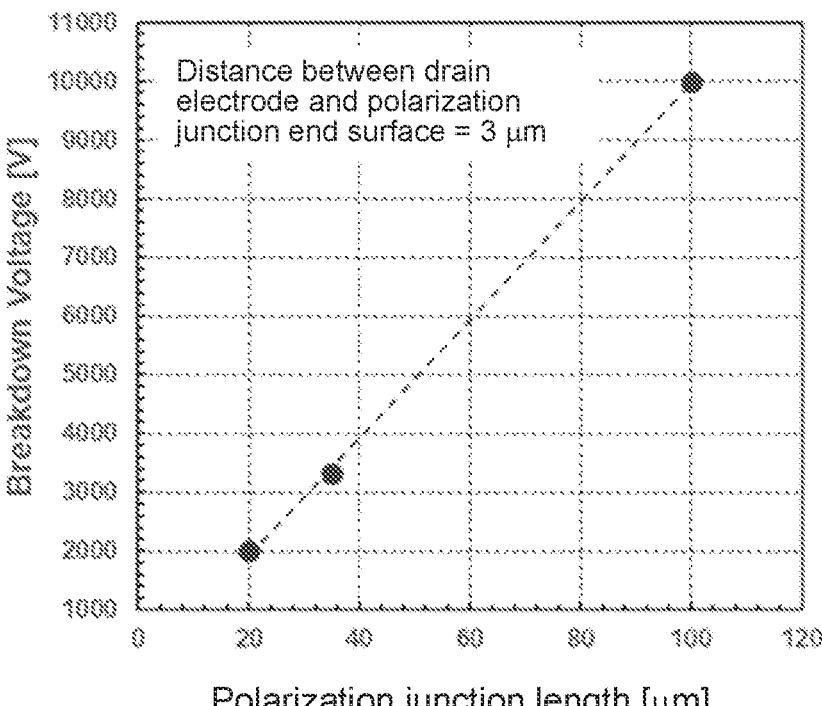
FIG. 78 is a graph showing the relation in FETs between the polarization super junction length Lpsj and the breakdown voltage of the semiconductor element.

FIG. 78 is a graph showing the relation in FETs between the polarization super junction length Lpsj and the breakdown voltage of the semiconductor element. The horizontal axis of FIG. 78 shows the polarization super junction length Lpsj. The vertical axis of FIG. 78 shows breakdown voltage of each FET. As shown in FIG. 78, the greater the polarization super junction length Lpsj, the higher the breakdown voltage of the semiconductor element. The breakdown voltage of the semiconductor element is proportional to the polarization super junction length Lpsj to some degree.

7. Experiment 7

7-1. Production of FET

An FET similar to the semiconductor element 400 of the fourth embodiment was produced. The FET is identical to that in Experiment 2 except for pad electrodes.

7-2. Results of Experiment (Pad Electrodes)

Figure 79:
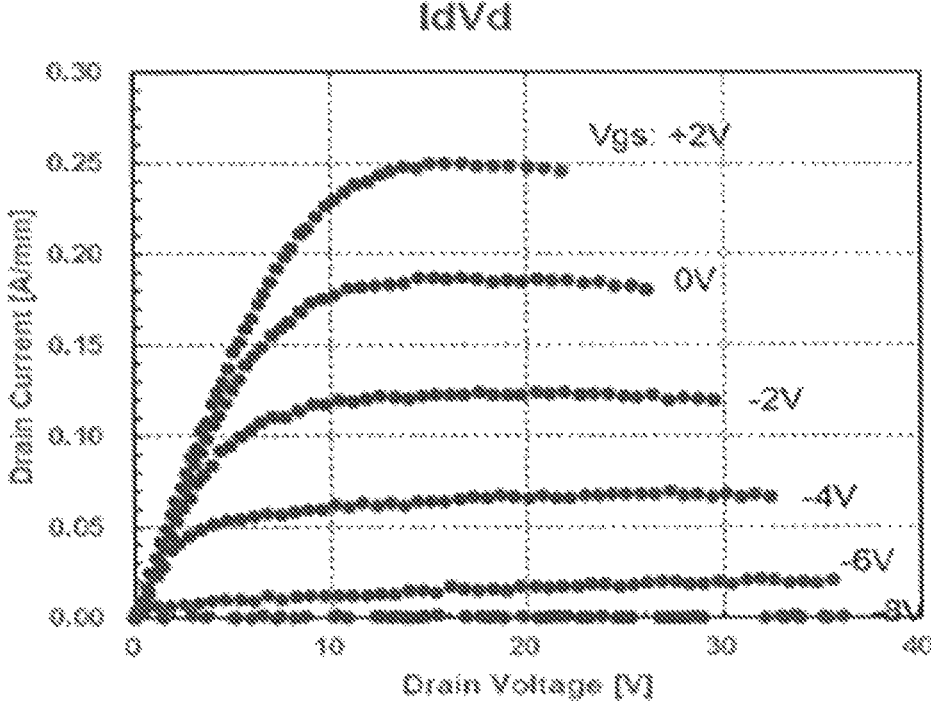
FIG. 79 is a graph showing the relation between drain voltage and drain current of an FET.

FIG. 79 is a graph showing the relation between drain voltage and drain current of the FET. The horizontal axis of FIG. 79 shows drain voltage. The vertical axis of FIG. 79 shows drain current. As shown in FIG. 79, there is a tendency that when the gate voltage is increased, the drain current increases. The drain current saturates at a drain voltage of about 15 V or higher.

Figure 80:
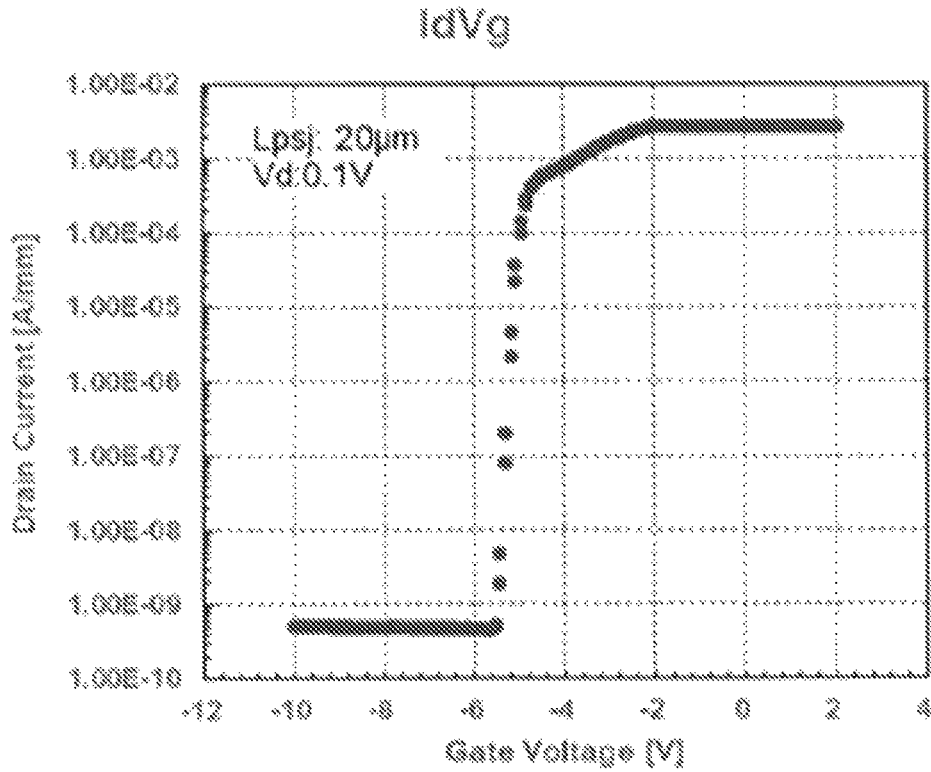
FIG. 80 is a graph showing the relation between gate voltage and drain current of an FET when its drain voltage is 0.1 V.

FIG. 80 is a graph showing the relation between gate voltage and drain current of the FET when its drain voltage is 0.1 V. The horizontal axis of FIG. 80 shows gate voltage. The vertical axis of FIG. 80 shows drain current.

Figure 81:
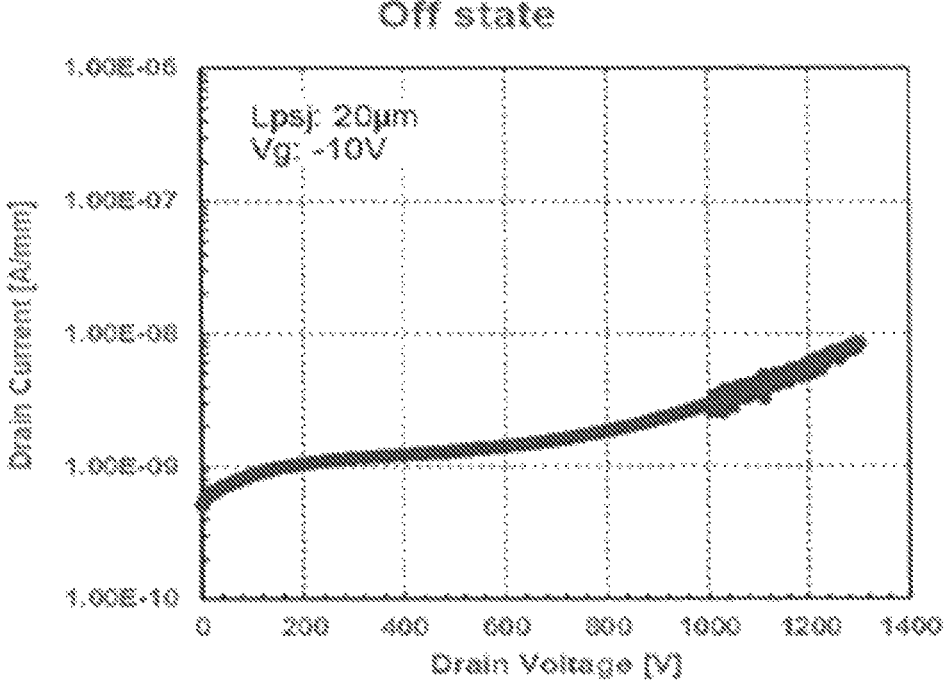
FIG. 81 is a graph showing the relation between drain voltage and drain current when the FET is off.

FIG. 81 is a graph showing the relation between drain voltage and drain current when the FET is off. The horizontal axis of FIG. 81 shows drain voltage. The vertical axis of FIG. 81 shows drain current. The gate voltage is −10 V.

Figure 82:
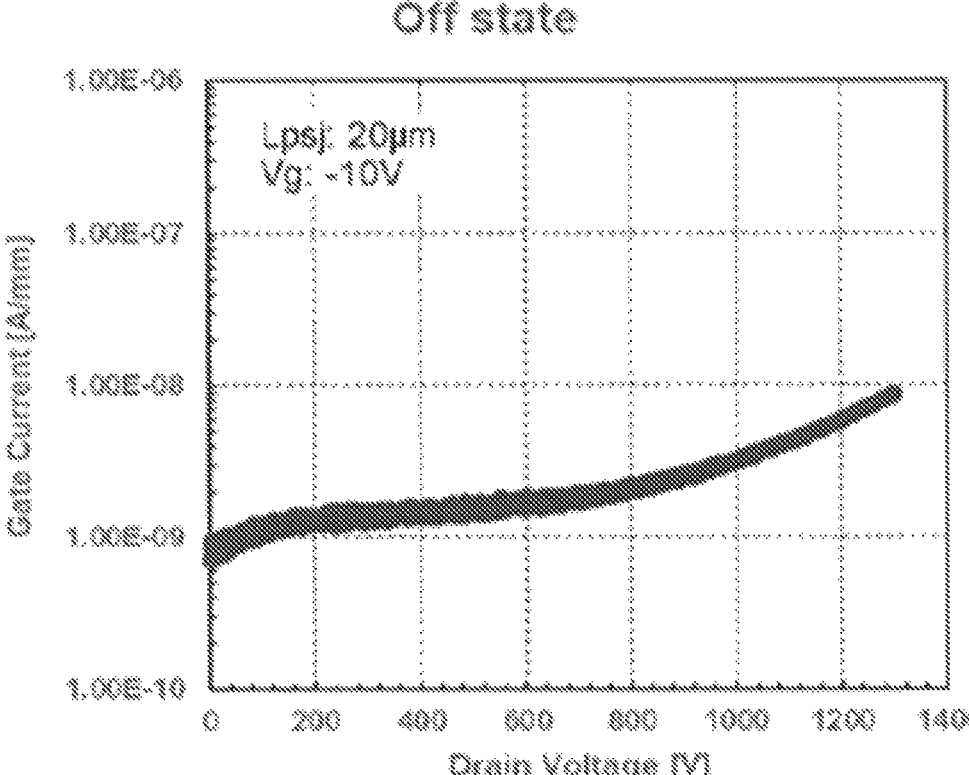
FIG. 82 is a graph showing the relation between drain voltage and gate current when the FET is off.

FIG. 82 is a graph showing the relation between drain voltage and gate current when the FET is off. The horizontal axis of FIG. 82 shows drain voltage. The vertical axis of FIG. 82 shows gate current. The gate voltage is −10 V.

The current values in FIGS. 79 to 82 are normalized by the gate width.

8. Experiment 8

8-1. Production of Schottky Barrier Diodes

Schottky barrier diodes similar to the eighth embodiment was produced. The layered structure and production conditions of semiconductor layers are the same as those in Experiment 1. Elements having different polarization super junction lengths Lpsj were produced.

8-2. Results of Experiment (Reverse Recovery Current)

Figure 83:
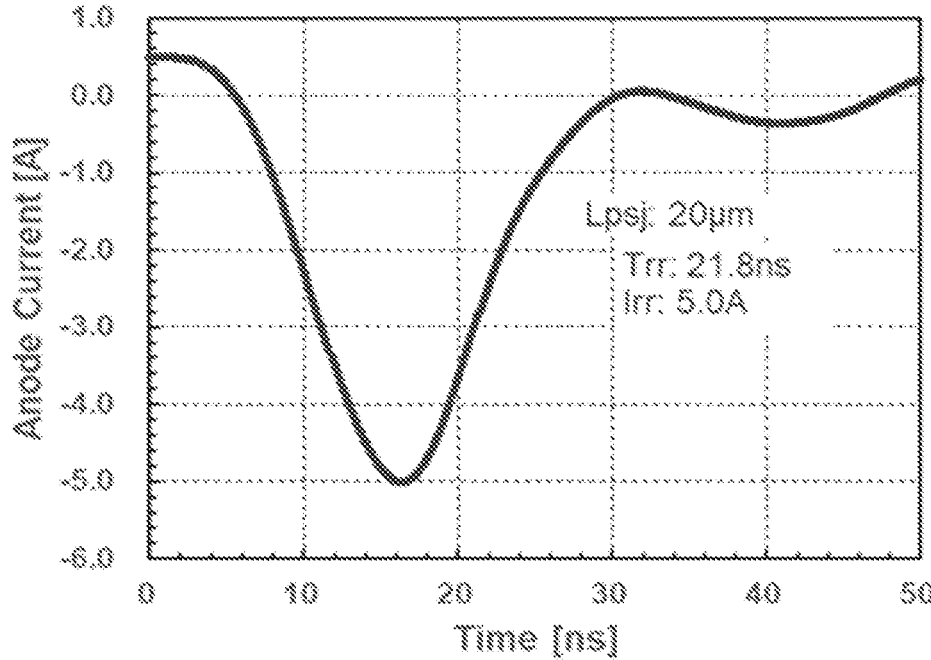
FIG. 83 is a graph showing the reverse recovery time characteristic of a Schottky barrier diode having a polarization super junction length Lpsj of 20 μm.

FIG. 83 is a graph showing the reverse recovery time characteristic of a Schottky barrier diode having a polarization super junction length Lpsj of 20 µm. The horizontal axis of FIG. 83 shows time. The vertical axis of FIG. 83 shows anode current. The reverse recovery time was 21.8 ns. The peak value of reverse recovery current was 5.0 A.

8-3. Results of Experiment (Forward Characteristics)

Figure 84:
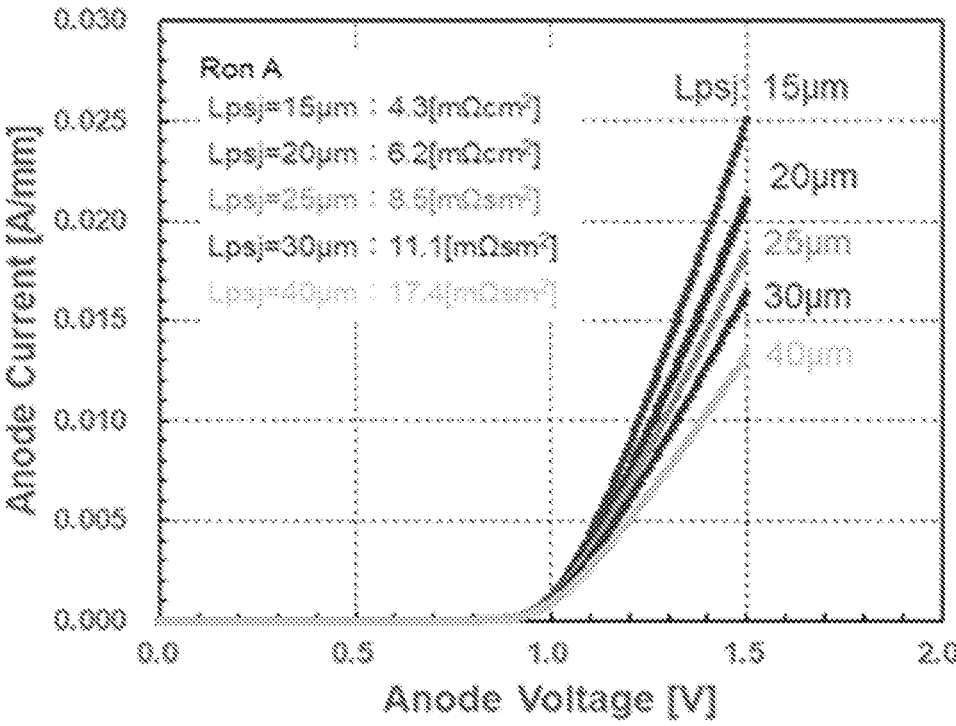
FIG. 84 is a graph showing the forward characteristics of Schottky barrier diodes.

FIG. 84 is a graph showing forward characteristics of Schottky barrier diodes. The horizontal axis of FIG. 84 shows anode voltage. The vertical axis of FIG. 84 shows anode current. As shown in FIG. 84, there is a tendency that the shorter the polarization super junction length Lpsj, the larger the anode current. Namely, there is a tendency that the shorter the polarization super junction length Lpsj, the smaller the normalized ON resistance.

8-4. Results of Experiment (Reverse Characteristics)

Figures 85, 86:
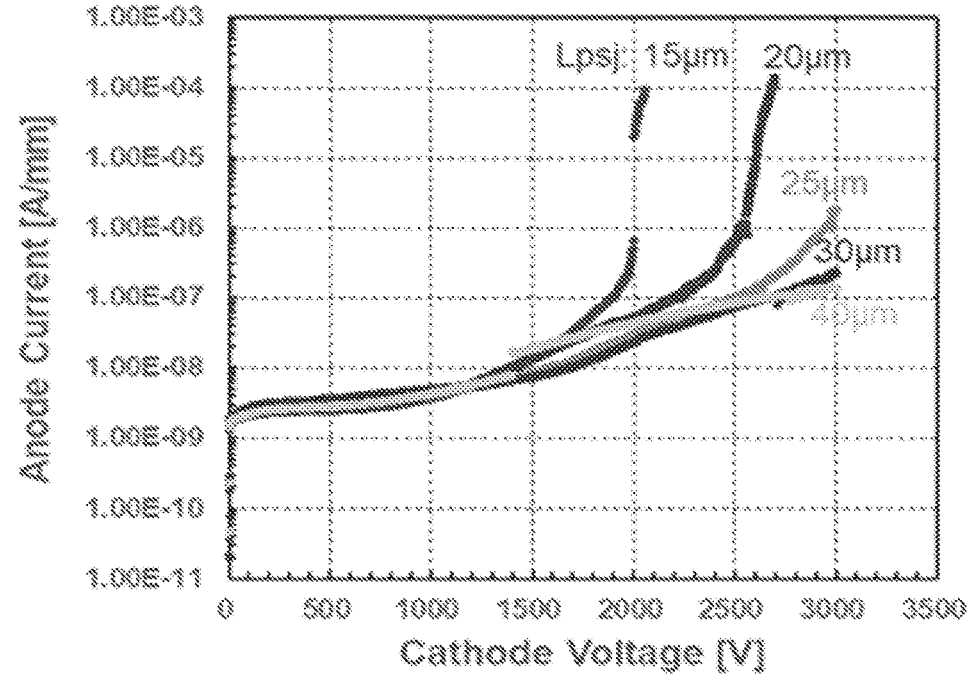
FIG. 85 is a graph showing the reverse characteristics of the Schottky barrier diodes.
FIG. 86 is a table showing the breakdown voltages of Schottky barrier diodes produced by changing the polarization super junction length Lpsj and the distance Lac between an anode electrode contact region AC1 and a cathode electrode contact region CC1 between at the end portion and at the portion other than the end portion, respectively.

FIG. 85 is a graph showing the reverse characteristics of Schottky barrier diodes. The horizontal axis of FIG. 85 shows cathode voltage. The vertical axis of FIG. 85 shows anode current. As shown in FIG. 85, the shorter the polarization super junction length Lpsj, the lower the breakdown voltage. The breakdown voltages of Schottky barrier diodes whose polarization super junction lengths Lpsj were 15 µm, 20 µm, 25 µm, 30 µm, and 40 µm, respectively, were about 2000 V, about 2600 V, about 3000 V, higher than 3000 V, and higher than 3000 V, respectively.

8-5. Results of Experiment (Polarization Super Junction Length)

FIG. 86 is a table showing the breakdown voltages of Schottky barrier diodes produced by changing the polarization super junction length Lpsj and the distance Lac between the anode electrode contact region AC1 and the cathode electrode contact region CC1. FIG. 86 shows cases where the smallest value of the polarization super junction length Lpsj at the end portion was made different from the smallest value of the polarization super junction length Lpsj at the portion other than the end portion.

The breakdown voltage of the Schottky barrier diode can be increased by making the polarization super junction length Lpsj and the distance Lac at the end portion equal to greater than the polarization super junction length Lpsj and the distance Lac at the portion other than the end portion.

(Supplementary Note)

A semiconductor element in a first mode comprises: a first semiconductor layer, a second semiconductor layer located above the first semiconductor layer, a third semiconductor layer located above the second semiconductor layer, a fourth semiconductor layer located above the third semiconductor layer, a first intermediate layer located between the first semiconductor layer and the second semiconductor layer, a second intermediate layer located between the second semiconductor layer and the third semiconductor layer, a source electrode and a drain electrode located on the second semiconductor layer or the third semiconductor layer, a gate electrode located on the fourth semiconductor layer, a gate electrode contact region where the gate electrode is in contact with the fourth semiconductor layer, a source electrode contact region where the source electrode is in contact with the second semiconductor layer or the third semiconductor layer, and a drain electrode contact region where the drain electrode is in contact with the second semiconductor layer or the third semiconductor layer. The first semiconductor layer, the second semiconductor layer, the third semiconductor layer, and the fourth semiconductor layer are group-III nitride semiconductor layers. The first intermediate layer and the second intermediate layer are group-III nitride layers. The second semiconductor layer has a band gap larger than those of the first semiconductor layer and the third semiconductor layer. The first intermediate layer and the second intermediate layer have respective band gaps larger than that of the second semiconductor layer. The first semiconductor layer, the second semiconductor layer, and the third semiconductor layer are undoped semiconductor layers. The fourth semiconductor layer is a p-type semiconductor layer. A region obtained by projecting the gate electrode contact region on the second semiconductor layer surrounds a circumference of a region obtained by projecting the source electrode contact region or the drain electrode contact region on the second semiconductor layer.

A semiconductor element in a second mode comprises: a first semiconductor layer, a second semiconductor layer located above the first semiconductor layer, a third semiconductor layer located above the second semiconductor layer, a fourth semiconductor layer located above the third semiconductor layer, a first intermediate layer located between the first semiconductor layer and the second semiconductor layer, a second intermediate layer located between the second semiconductor layer and the third semiconductor layer, a cathode electrode located on the second semiconductor layer, an anode electrode located on the fourth semiconductor layer, a cathode electrode contact region where the cathode electrode is in contact with the second semiconductor layer, and an anode electrode contact region where the anode electrode is in contact with the fourth semiconductor layer. The first semiconductor layer, the second semiconductor layer, the third semiconductor layer, and the fourth semiconductor layer are group-III nitride semiconductor layers. The first intermediate layer and the second intermediate layer are group-III nitride layers. The second semiconductor layer has a band gap larger than those of the first semiconductor layer and the third semiconductor layer. The first intermediate layer and the second intermediate layer have respective band gaps larger than that of the second semiconductor layer. The first semiconductor layer, the second semiconductor layer, and the third semiconductor layer are undoped semiconductor layers. The fourth semiconductor layer is a p-type semiconductor layer. The anode electrode is in contact with the second semiconductor layer or the first semiconductor layer. One of the cathode electrode contact region and the anode electrode contact region has a rod-like shape. The other of the cathode electrode contact region and the anode electrode contact region has a comb-like shape. The rod-like shape of the one of the cathode electrode contact region and the anode electrode contact region is disposed between tooth-shaped portions of the comb-like shape of the other of the cathode electrode contact region and the anode electrode contact region.

A semiconductor element in a third mode has a polarization super junction region where the third semiconductor layer is formed and the fourth semiconductor layer is not formed and which is located between the gate electrode contact region and the drain electrode contact region.

A semiconductor element in a fourth mode has a polarization super junction region where the third semiconductor layer is formed and the fourth semiconductor layer is not formed and which is located between the cathode electrode contact region and the anode electrode contact region.

In a semiconductor element in a fifth mode, the first intermediate layer has a thickness of 0.2 nm to 10 nm. The second intermediate layer has a thickness of 0.2 nm to 10 nm.

In a semiconductor element in a sixth mode, the first intermediate layer and the second intermediate layer contain Al.

In a semiconductor element in a seventh mode, each of the first intermediate layer and the second intermediate layer has an Al composition ratio of 0.5 or greater.

In a semiconductor element in an eighth mode, a sheet carrier concentration at an interface between the first intermediate layer and the second semiconductor layer is $2\times10^{13}$ $cm^{-2}$ or less. A sheet carrier concentration at an interface between the second intermediate layer and the second semiconductor layer is $2\times10^{13}$ $cm^{-2}$ or less.

In a semiconductor element in a ninth mode, the first semiconductor layer has a first two-dimensional electron gas on a side toward the first intermediate layer. The third semiconductor layer has a first two-dimensional hole gas on a side toward the second intermediate layer. The second semiconductor layer has a second two-dimensional hole gas on a side toward the first intermediate layer and a second two-dimensional electron gas on a side toward the second intermediate layer.

A device in a tenth mode includes any of the above-described semiconductor elements.

DESCRIPTION OF REFERENCE NUMERALS AND SYMBOLS

100: semiconductor element
Sub1: sapphire substrate
Bf1: buffer layer
110: first semiconductor layer
120: second semiconductor layer
130: third semiconductor layer
140: fourth semiconductor layer
150: first intermediate layer
160: second intermediate layer
S1: source electrode
SC1: source electrode contact region
D1: drain electrode
DC1: drain electrode contact region
G1: gate electrode
GC1: gate electrode contact region

What is claimed is:
1. A semiconductor element comprising:
a first semiconductor layer;
a second semiconductor layer located above the first semiconductor layer;
a third semiconductor layer located above the second semiconductor layer;
a fourth semiconductor layer located above the third semiconductor layer;
a first intermediate layer located between the first semiconductor layer and the second semiconductor layer;
a second intermediate layer located between the second semiconductor layer and the third semiconductor layer;

a source electrode and a drain electrode located on the second semiconductor layer or the third semiconductor layer;

a gate electrode located on the fourth semiconductor layer;

a gate electrode contact region where the gate electrode is in contact with the fourth semiconductor layer;

a source electrode contact region where the source electrode is in contact with the second semiconductor layer or the third semiconductor layer; and a drain electrode contact region where the drain electrode is in contact with the second semiconductor layer or the third semiconductor layer, wherein the first semiconductor layer, the second semiconductor layer, the third semiconductor layer, and the fourth semiconductor layer are group-III nitride semiconductor layers, the first intermediate layer and the second intermediate layer are group-III nitride layers, the second semiconductor layer has a band gap larger than those of the first semiconductor layer and the third semiconductor layer, the first intermediate layer and the second intermediate layer have respective band gaps larger than that of the second semiconductor layer, the first semiconductor layer, the second semiconductor layer, and the third semiconductor layer are undoped semiconductor layers, the fourth semiconductor layer is a p-type semiconductor layer, and a region obtained by projecting the gate electrode contact region on the second semiconductor layer surrounds a circumference of a region obtained by projecting the source electrode contact region or the drain electrode contact region on the second semiconductor layer.

2. The semiconductor element according to claim 1, further comprising a polarization super junction region where the third semiconductor layer is formed and the fourth semiconductor layer is not formed and which is located between the gate electrode contact region and the drain electrode contact region.

3. The semiconductor element according to claim 2, wherein the first semiconductor layer has a first two-dimensional electron gas on a side toward the first intermediate layer, the third semiconductor layer has a first two-dimensional hole gas on a side toward the second intermediate layer, and the second semiconductor layer has a second two-dimensional hole gas on a side toward the first intermediate layer and a second two-dimensional electron gas on a side toward the second intermediate layer.

4. The semiconductor element according to claim 3, wherein a sheet electron concentration of first two-dimensional electron gas is larger than a sheet hole concentration of second two-dimensional hole gas.

5. The semiconductor element according to claim 3, wherein an energy level of a conduction band lower edge of the second semiconductor layer increases toward the first intermediate layer.

6. The semiconductor element according to claim 1, wherein the first intermediate layer has a thickness of 0.2 nm to 10 nm, and the second intermediate layer has a thickness of 0.2 nm to 10 nm.

7. The semiconductor element according to claim 1, wherein the first intermediate layer and the second intermediate layer contain Al.

8. The semiconductor element according to claim 7, wherein each of the first intermediate layer and the second intermediate layer has an Al composition ratio of 0.5 or greater.

9. The semiconductor element according to claim 1, wherein a sheet carrier concentration at an interface between the first intermediate layer and the second semiconductor layer is $2 \times 10^{13}$ cm$^{-2}$ or less, and a sheet carrier concentration at an interface between the second intermediate layer and the second semiconductor layer is $2 \times 10^{13}$ cm$^{-2}$ or less.

10. The semiconductor element according to claim 1, wherein the first semiconductor layer has a first two-dimensional electron gas on a side toward the first intermediate layer, the third semiconductor layer has a first two-dimensional hole gas on a side toward the second intermediate layer, and the second semiconductor layer has a second two-dimensional hole gas on a side toward the first intermediate layer and a second two-dimensional electron gas on a side toward the second intermediate layer.

11. The semiconductor element according to claim 10, wherein a sheet electron concentration of first two-dimensional electron gas is larger than a sheet hole concentration of second two-dimensional hole gas.

12. The semiconductor element according to claim 10, wherein an energy level of a conduction band lower edge of the second semiconductor layer increases toward the first intermediate layer.

* * * * *